United States Patent
Arikado et al.

(10) Patent No.: US 7,057,259 B2
(45) Date of Patent: Jun. 6, 2006

(54) SEMICONDUCTOR WAFER WITH ID MARK, EQUIPMENT FOR AND METHOD OF MANUFACTURING SEMICONDUCTOR DEVICE FROM THEM

(75) Inventors: Tsunetoshi Arikado, Tokyo (JP); Masao Iwase, Yokohama (JP); Soichi Nadahara, Yokohama (JP); Yuso Udo, Tokyo (JP); Yukihiro Ushiku, Yokohama (JP); Shinichi Nitta, Yokohama (JP); Moriya Miyashita, Yokohama (JP); Junji Sugamoto, Yokohama (JP); Hiroaki Yamada, Yokohama (JP); Hajime Nagano, Yokohama (JP); Katsujiro Tanzawa, Yokohama (JP); Hiroshi Matsushita, Yokohama (JP); Norihiko Tsuchiya, Tokyo (JP); Katsuya Okumura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 362 days.

(21) Appl. No.: 10/101,337

(22) Filed: Mar. 20, 2002

(65) Prior Publication Data
US 2003/0003608 A1    Jan. 2, 2003

(30) Foreign Application Priority Data
Mar. 21, 2001 (JP) .......................... P2001-080452
Nov. 12, 2001 (JP) .......................... P2001-345984

(51) Int. Cl.
*H01L 29/06* (2006.01)
(52) U.S. Cl. .................. 257/618; 257/622; 438/974
(58) Field of Classification Search .............. 438/14, 438/401, 460, 462, 959, 974; 257/618, 620, 257/627, 622; 219/121.68
See application file for complete search history.

(56) References Cited

U.S. PATENT DOCUMENTS

| | | | | | |
|---|---|---|---|---|---|
| 3,624,421 A | * | 11/1971 | Pantell et al. | .................... | 372/3 |
| 4,510,673 A | * | 4/1985 | Shils et al. | .................... | 438/15 |
| 4,634,490 A | * | 1/1987 | Tatsumi et al. | ................ | 117/14 |
| 4,747,684 A | * | 5/1988 | Weiser | .......................... | 356/31 |
| 5,073,918 A | * | 12/1991 | Kamon | ........................ | 378/205 |
| 5,732,120 A | * | 3/1998 | Shoji et al. | .................... | 378/45 |
| 6,004,405 A | * | 12/1999 | Oishi et al. | ................ | 148/33.2 |
| 6,093,577 A | * | 7/2000 | van der Groen et al. | ...... | 438/30 |
| 6,224,668 B1 | * | 5/2001 | Tamatsuka | .................. | 117/84 |
| 6,268,641 B1 | * | 7/2001 | Yano et al. | .................. | 257/620 |
| 6,420,792 B1 | * | 7/2002 | Guldi et al. | .................. | 257/797 |
| 6,482,661 B1 | * | 11/2002 | Madoyski | ...................... | 438/14 |
| 6,496,255 B1 | * | 12/2002 | Sugai et al. | .............. | 356/237.2 |
| 6,666,337 B1 | * | 12/2003 | Conboy et al. | ............. | 209/546 |

(Continued)

FOREIGN PATENT DOCUMENTS

JP            05-042379         2/1993

(Continued)

OTHER PUBLICATIONS

ASTM Standard Test Methods for Determining the Orientation of a Semiconductive Single Crystal F26-87a.*

(Continued)

*Primary Examiner*—Zandra V. Smith
*Assistant Examiner*—Pamela E Perkins
(74) *Attorney, Agent, or Firm*—Finnegan, Henderson, Farabow, Garrett & Dunner, L.L.P.

(57) ABSTRACT

A semiconductor wafer has a bevel contour formed along the periphery thereof, products formed on the wafer, and an ID mark formed on the bevel contour. The ID mark shows at least the properties, manufacturing conditions, and test results of the products.

38 Claims, 53 Drawing Sheets

U.S. PATENT DOCUMENTS

2001/0038153 A1* 11/2001 Sakaguchi .................. 257/797

FOREIGN PATENT DOCUMENTS

| JP | 05-309482 |   | 11/1993 |
|----|-----------|---|---------|
| JP | 06-124996 | * | 6/1994  |
| JP | 07-164170 |   | 6/1995  |
| JP | 08-243765 |   | 9/1996  |
| JP | 08-276284 |   | 10/1996 |
| JP | 10-256105 |   | 9/1998  |
| JP | 2000-223380 |   | 11/2000 |

OTHER PUBLICATIONS

Notification of the First Office Action issued by the Chinese Patent Office in Chinese Patent Application No. 02124538.X.

* cited by examiner

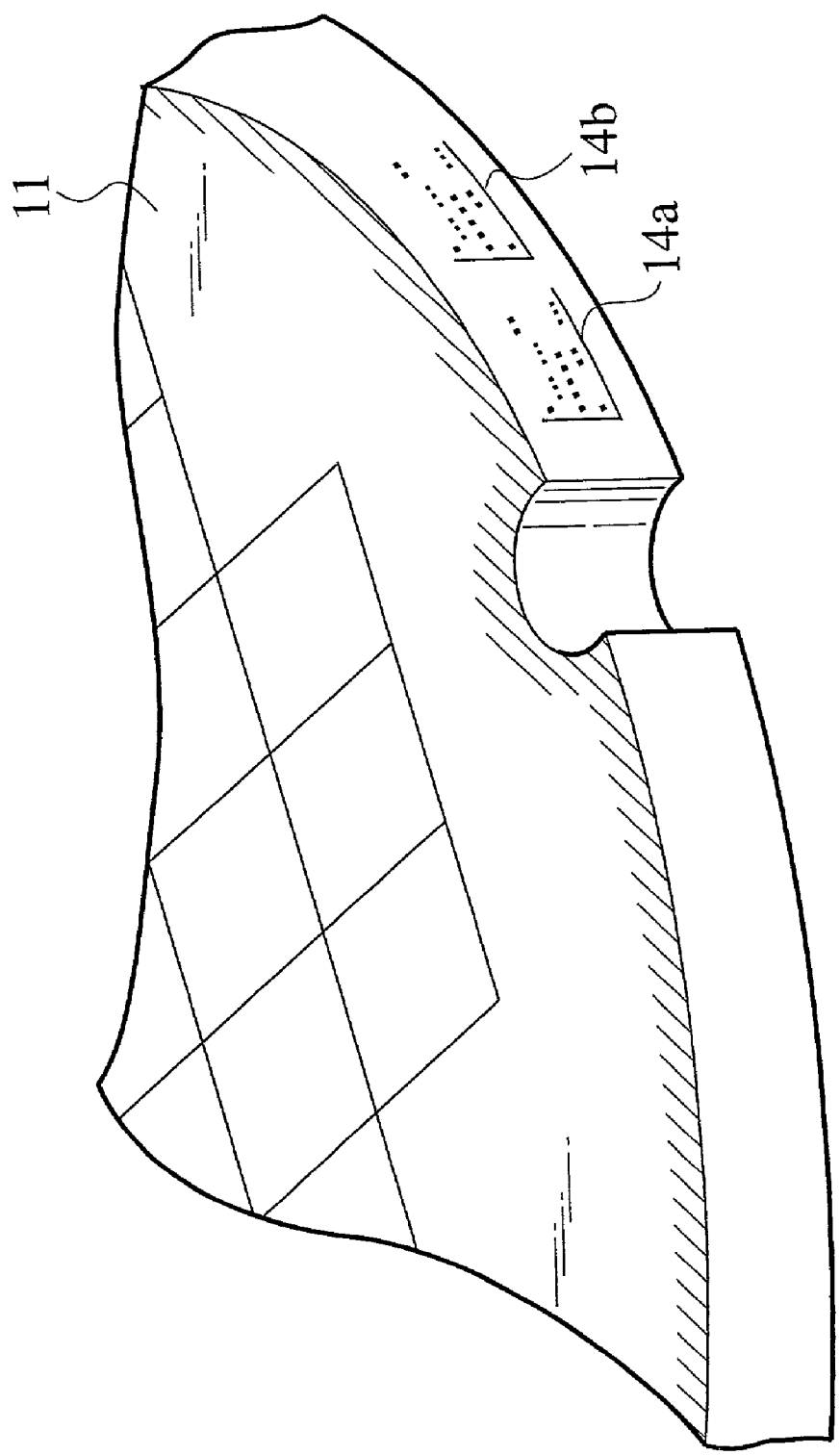

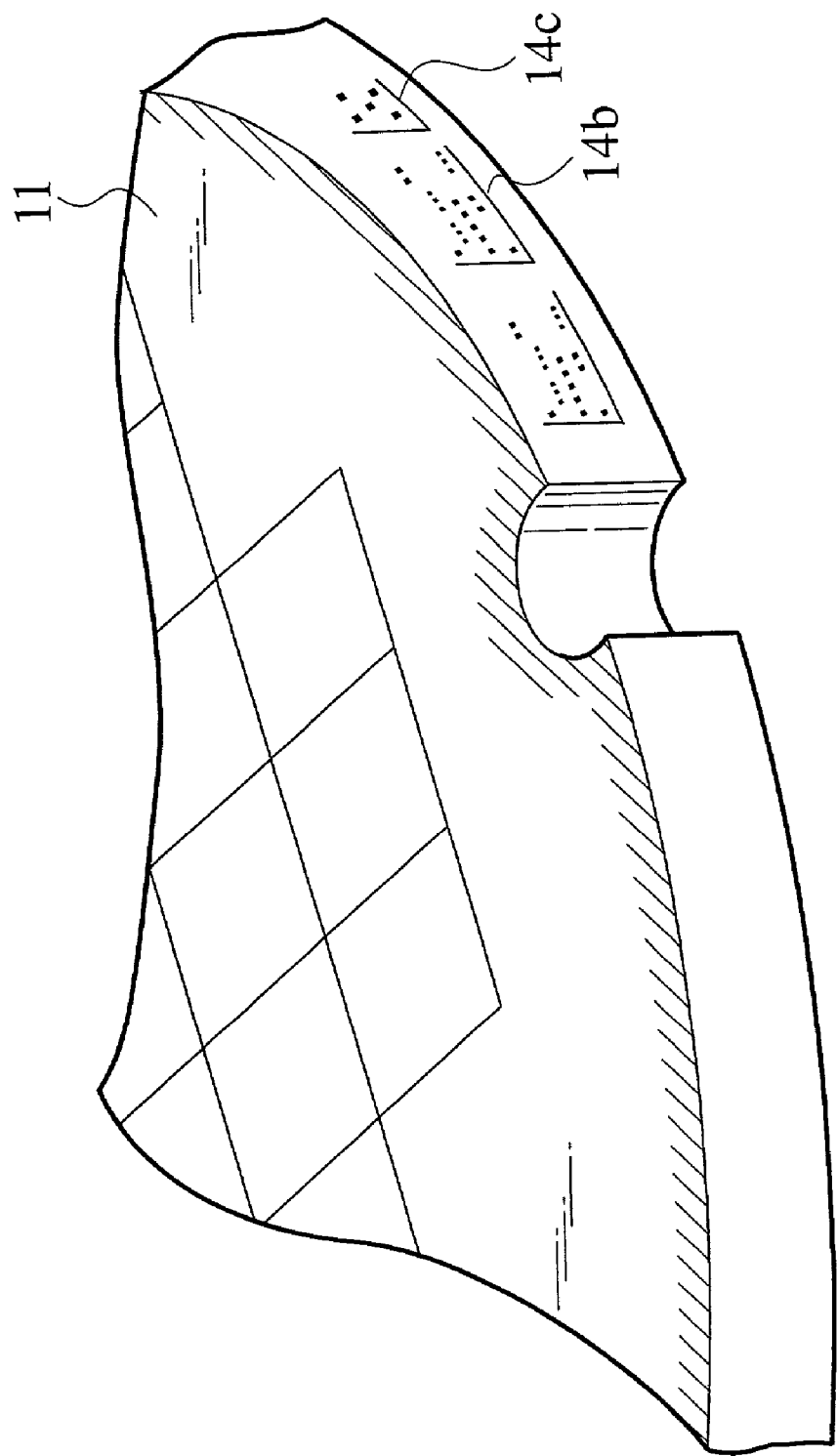

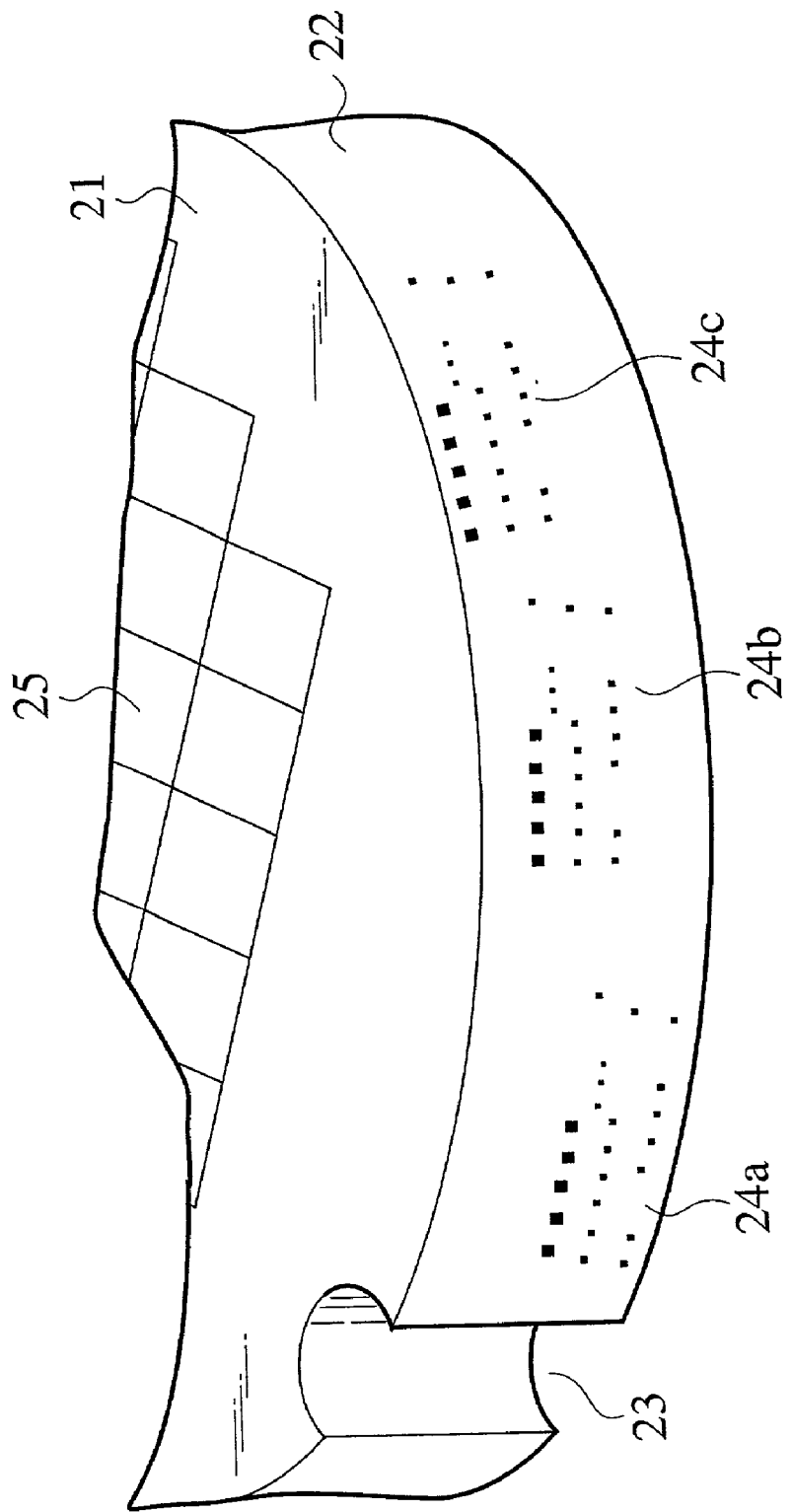

| PROCESS | (COMPARISON EXAMPLE) DURATION (SECONDS) | (SECOND EMBODIMENT) DURATION (SECONDS) |
|---|---|---|
| WAFER TRANSFER | 4 | 4 |
| NOTCH ALIGNMENT | 4 | 4 |
| BEVEL SHAPE MEASUREMENT | 60 | 2 |
| MARKING | 6 | 20 |
| TEST | 2 | 2 |
| WAFER TRANSFER | 4 | 4 |
| TOTAL | 80 | 36 |

FIG.8

| WAFER NUMBER | NUMBER OF MARKS | READ RESULT | READ LOCATION |
|---|---|---|---|
| 1 | 3 | ○ | 1 |
| 2 | 3 | ○ | 1 |
| 3 | 3 | ○ | 1 |
| 4 | 3 | ○ | 2 |
| 5 | 3 | ○ | 1 |
| 6 | 3 | ○ | 1 |
| 7 | 3 | ○ | 1 |
| 8 | 3 | ○ | 2 |
| 9 | 3 | ○ | 1 |
| 10 | 3 | ○ | 1 |
| 11 | 3 | ○ | 1 |
| 12 | 3 | ○ | 1 |
| 13 | 2 | ○ | 1 |
| 14 | 2 | ○ | 1 |
| 15 | 2 | ○ | 1 |
| 16 | 2 | ○ | 2 |
| 17 | 2 | ○ | 2 |
| 18 | 2 | ○ | 2 |
| 19 | 2 | ○ | 1 |
| 20 | 2 | ○ | 1 |
| 21 | 2 | ○ | 2 |
| 22 | 2 | ○ | 1 |
| 23 | 2 | ○ | 1 |
| 24 | 2 | ○ | 1 |

|  | 1ST MARK | 2ND MARK |
|---|---|---|
| REFERENCE POSITION DETECTION TIME | 1msec | 1msec |
| CAMERA MOVING TIME |  | 100msec |
| READ TIME | 1msec | 1msec |
| TOTAL | 2msec | 102msec |

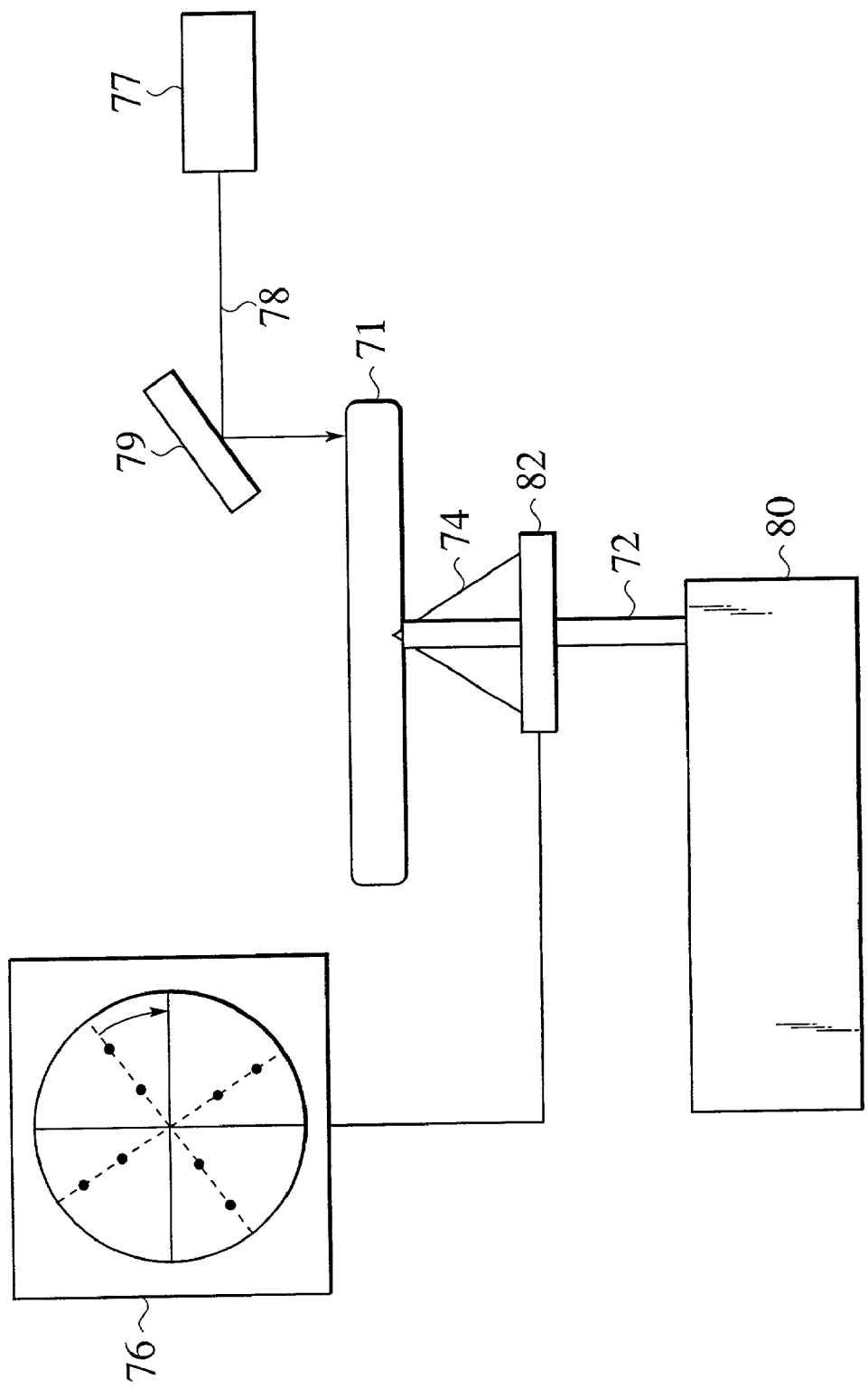

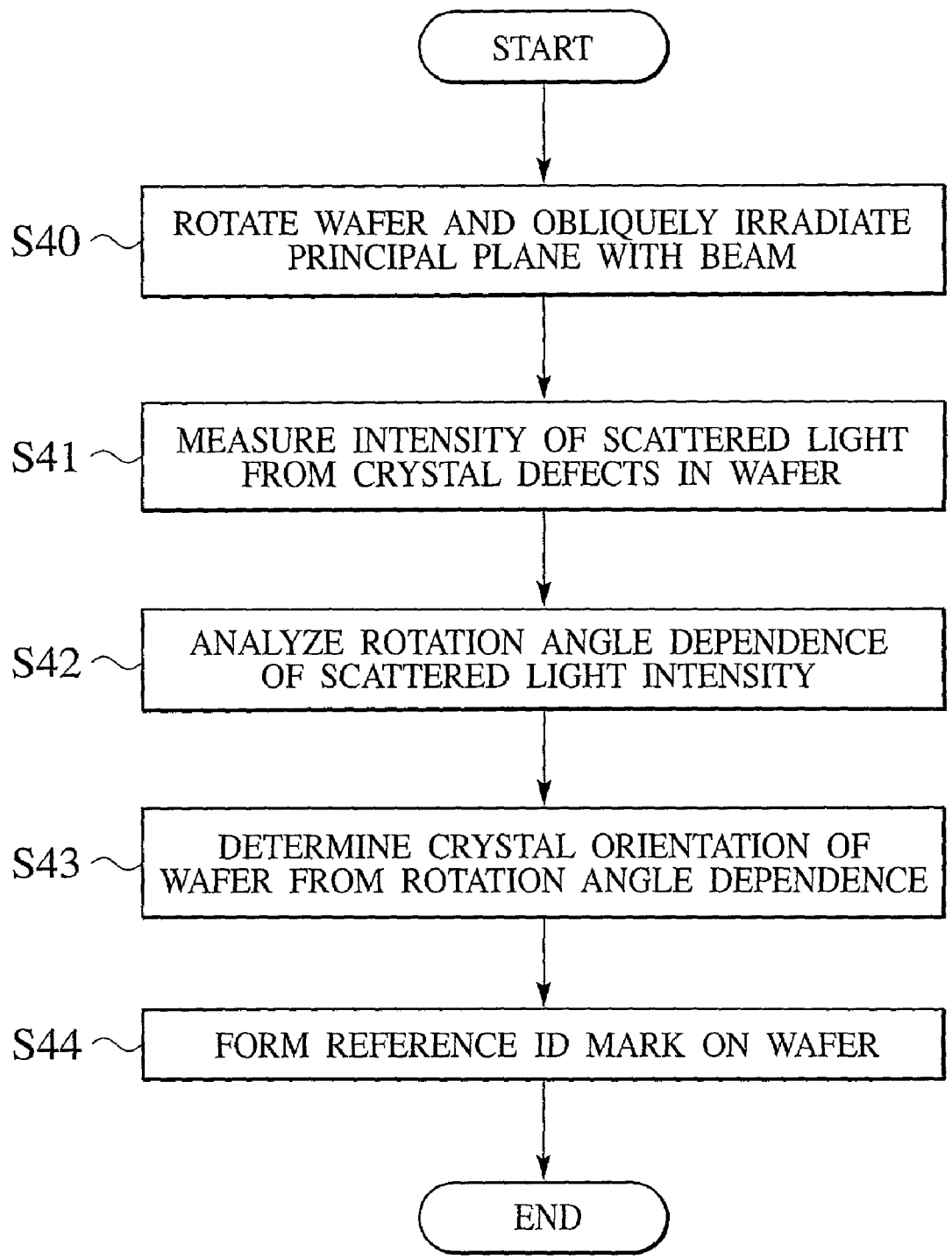

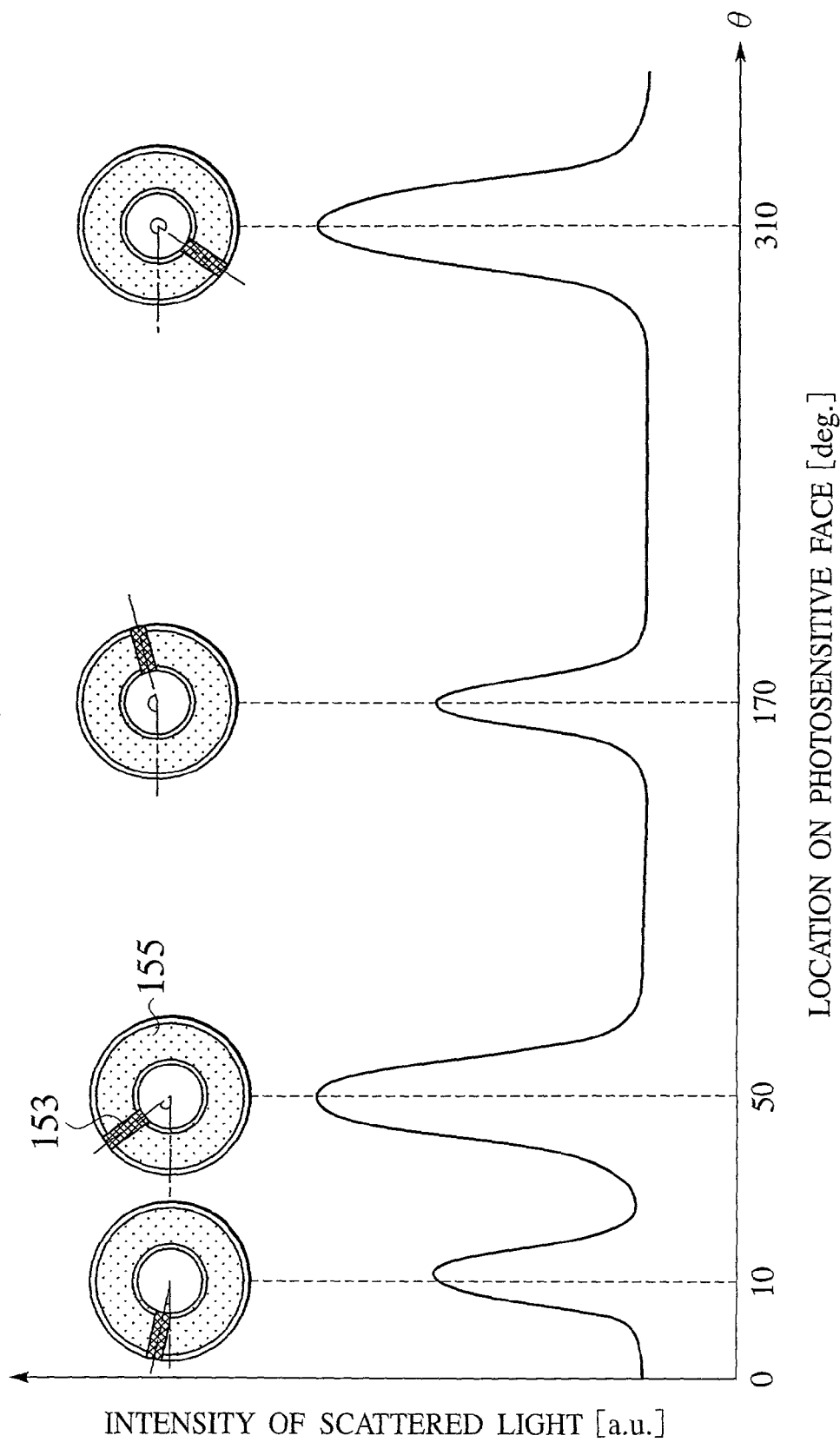

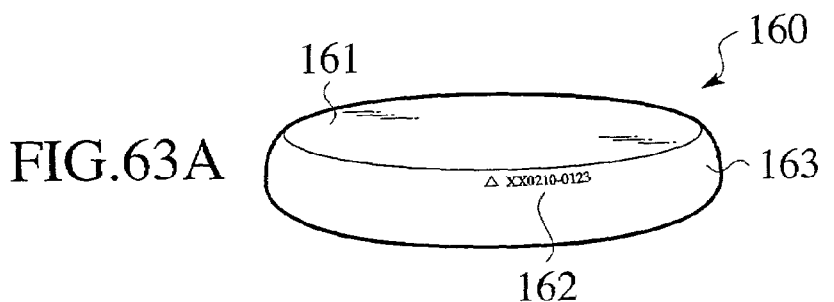
FIG.63A
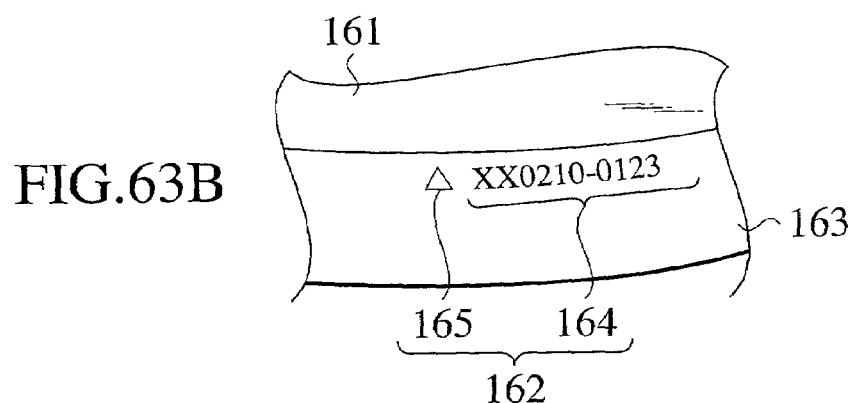
FIG.63B
FIG.64
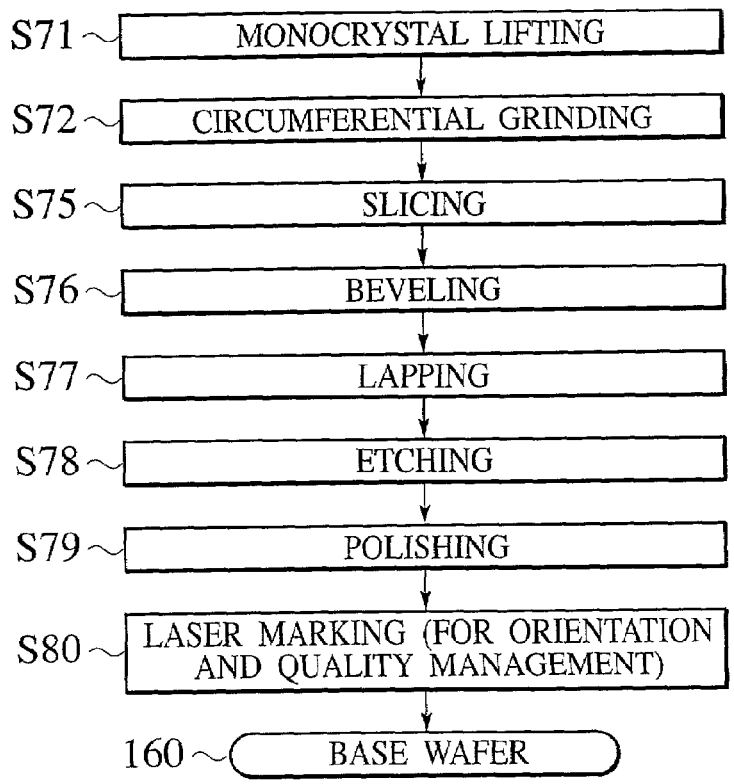

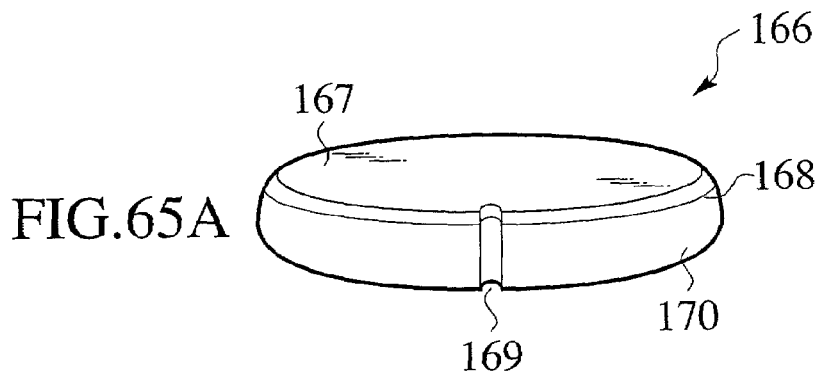
FIG.65A
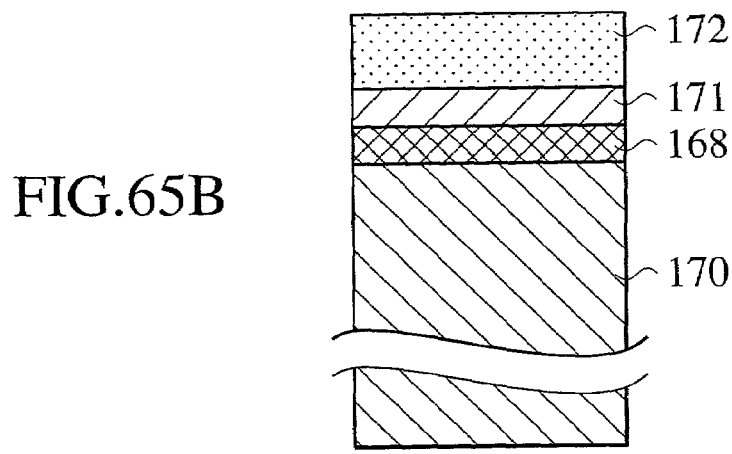
FIG.65B
FIG.66
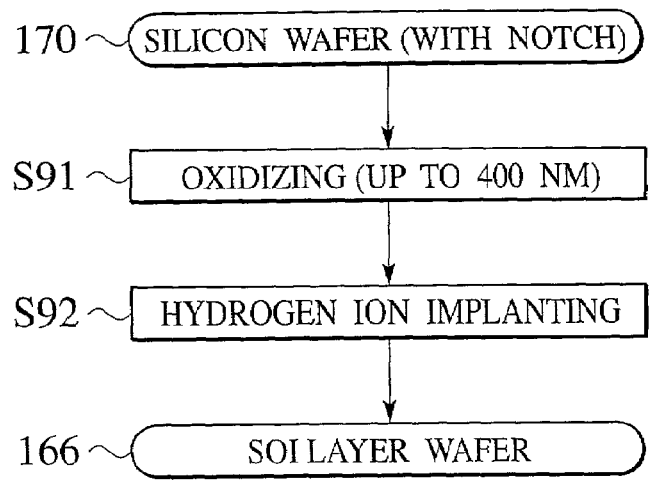

SEMICONDUCTOR WAFER WITH ID MARK, EQUIPMENT FOR AND METHOD OF MANUFACTURING SEMICONDUCTOR DEVICE FROM THEM

CROSS REFERENCE TO RELATED APPLICATIONS

This application is based upon and claims the benefit of priority from the prior Japanese Patent Applications No. P2001-80452 filed on Mar. 21, 2001 and No. P2001-345984 filed on Nov. 12, 2001, the entire contents of which are incorporated herein by reference.

BACKGROUND OF THE INVENTION

1. Field of the Invention

The present invention relates to a semiconductor wafer having an ID mark on the periphery thereof and a method of manufacturing such a semiconductor wafer. The present invention also relates to an equipment for and a method of manufacturing semiconductor device from such a semiconductor wafer.

2. Description of the Related Art

Semiconductor device manufacturing involves several hundreds of processes each of which needs different conditions that must be strictly managed. Management of the process conditions of wafers employs markings made on the wafers. These markings consist of, for example, numerals, characters, and bar codes.

A marking on a semiconductor wafer is used to identify the wafer and indicates, for example, the manufacturing history of the wafer. The marking may be a soft marking made on the surface of the wafer, or a hard marking made on the back of the wafer. The marking is composed of dots made by locally ablating the wafer with laser beam pulses.

The marking is formed in a limited area on a wafer so that it does not interfere with products formed on the wafer. The marking must be visible to workers, and therefore, usually extends from several millimeters to several centimeters causing relatively large space loss on the wafer.

The marking is formed by partly melting a wafer with a laser beam of large energy. A large energy laser beam scatters molten silicon particles around the marking, and the scattered particles spoil semiconductor device formed on the wafer.

When the marking are formed on the surface of a wafer, the marking may disappear or become unrecognizable due to repetitive deposition and chemical mechanical polishing (CMP) processes carried out on the wafer. When the marking are formed on the back of a wafer, irregularities in the marking may cause focal errors in a lithography process and will impose the additional work of reversing the wafer in order to see the marking.

To solve these problems, Japanese Patent Laid Open Publications 08-276284 disclose a technique of making a fine marking on a bevel contour formed along the periphery of a wafer. One of the related arts prepares a liquid crystal marking and passes a laser beam through the liquid crystal marking and an optical system, to form an image of the marking on a bevel contour of a wafer. The laser beam used here has moderate energy, causing no ablation or silicon particle scattering.

The related arts, however, also have problems. Even if wafers are individually provided with markings, the wafers are usually grouped into batches and are processed collectively batch by batch. Each batch includes, for example, 25 wafers. Wafer processing conditions are set for a batch not for individual wafers. The wafers in a batch are collectively handled and managed to have the same manufacturing history. Processing conditions set for a batch of wafers are determined to cover individual variations among the wafers.

As a result, the processing conditions set for a batch of wafers involve redundancies such as a too long process time, deteriorating productivity and increasing costs.

Markings on semiconductor wafers are managed batch by batch by a host computer. Through communication with the host computer, data such as products to be formed on wafers, manufacturing processes and conditions applied to the wafers, and measurements related to the wafers are handled. Communication with the host computer takes a long time, and to save time, only the processing conditions applied to each batch are usually communicated. It is difficult for the related arts to utilize, for example, film thicknesses measured on individual wafers to determine processing conditions applied to the wafers in the next manufacturing process.

SUMMARY OF THE INVENTION

According to a first aspect of the present invention, a semiconductor wafer has a bevel contour formed along the periphery thereof, products formed on the wafer, and an ID mark formed on the bevel contour. The ID mark indicates, for example, the properties, manufacturing conditions, and test results of the products.

According to a second aspect of the present invention, a semiconductor wafer has a base wafer, an insulating layer arranged on the base wafer, a monocrystalline silicon layer arranged on the insulating layer, products formed on the monocrystalline silicon layer, and an ID mark formed on the base wafer.

According to a third aspect of the present invention, a semiconductor wafer has a circular first principal plane where semiconductor device is formed, a bevel contour formed along the periphery of the wafer, and a reference ID mark formed on the bevel contour to indicate a crystal orientation of the wafer.

According to a fourth aspect of the present invention, a semiconductor wafer has a circular first principal plane where semiconductor device is formed, a reference ID mark formed on the wafer to indicate a crystal orientation of the wafer, a recess formed on the periphery of the wafer and having a bottom inclined with respect to the first principal plane, and an etch pit formed on the bottom of the recess and defined by second-orientation crystal faces that are different from first-orientation crystal faces exposed at the first principal plane. The etch pit on the bottom of the recess remains even after polishing processes are carried out on the wafer.

According to a fifth aspect of the present invention, a semiconductor wafer has a circular base wafer, a bevel contour formed along the periphery of the base wafer, an insulating layer arranged on the base wafer, a monocrystalline silicon layer arranged on the insulating layer, and a reference position set on the periphery of the monocrystalline silicon layer to indicate a crystal orientation of the monocrystalline silicon layer.

According to a sixth aspect of the present invention, an equipment for manufacturing semiconductor device has an orientation measuring unit to measure the crystal orientation of a wafer, and a marking unit to form a reference ID mark on the wafer according to the measured crystal orientation. The reference ID mark is used to identify the crystal orientation of the wafer.

According to a seventh aspect of the present invention, an equipment for manufacturing semiconductor device has a wafer stage with a rotary mechanism, a light source to emit a light beam toward the rotation center of a principal plane of a wafer set on the wafer stage, a photodetector to measure the intensity of scattered light from crystal defects in the wafer, a computer to analyze the rotation angle dependence of the measured intensity, a marking unit to form a reference ID mark on the wafer to indicate a crystal orientation of the wafer, and a chamber covering at least the wafer stage, wafer, light source, and photodetector, to block external light.

According to an eighth aspect of the present invention, an equipment for manufacturing semiconductor device has a wafer stage, a light source to emit light onto a principal plane of a wafer set on the wafer stage, a photodetector to measure the intensity of scattered light from etch pits formed on the principal plane, a computer to analyze the rotation angle dependence of the measured intensity, a marking unit to form a reference ID mark on the wafer to indicate a crystal orientation of the wafer, and a chamber covering at least the wafer stage, wafer, light source, and photodetector, to block external light. The photodetector has an annular photosensitive face surrounding a light emitting mouth of the light source and inclined with respect to the emitted light.

According to a ninth aspect of the present invention, a method of manufacturing semiconductor device includes forming a bevel contour along the periphery of a wafer, forming products on the wafer, forming an ID mark on the bevel contour, reading the ID mark, and forming other products on the wafer according to the data read from the ID mark.

According to a tenth aspect of the present invention, a method of manufacturing semiconductor device includes forming a recess on the periphery of a wafer, the recess having a bottom inclined with respect to a first principal plane of the wafer where the semiconductor device is formed, etching the wafer at different etching speeds depending on crystal orientations to form an etch pit on the bottom of the recess, finding a crystal orientation of the recess according to the shape of the etch pit, and providing the wafer with a reference ID mark indicating a crystal orientation of the wafer. The etch pit is defined by second-orientation crystal faces that are different from first-orientation crystal faces exposed at the first principal plane.

According to an eleventh aspect of the present invention, a method of manufacturing semiconductor device includes emitting a light beam onto a principal plane of a wafer, measuring the intensity of scattered light from crystal defects in the wafer, analyzing the rotation angle dependence of the measured intensity, and determining a crystal orientation of the wafer according to the rotation angle dependence.

According to a twelfth aspect of the present invention, a method of manufacturing a semiconductor wafer includes slicing a monocrystalline ingot into a wafer, etching a principal plane of the wafer with an alkali solution at different etching speeds depending on crystal orientations, to remove undulation on the principal plane, measuring a crystal orientation of the wafer from etch pits formed when etching the principal plane, forming a reference ID mark on the wafer to indicate the crystal orientation of the wafer, and removing the etch pits.

According to a thirteenth aspect of the present invention, a method of manufacturing a semiconductor wafer includes forming a bevel contour along the periphery of a circular base wafer, putting a reference ID mark on the bevel contour to indicate a crystal orientation of an SOI layer wafer, forming the SOI layer wafer having a reference position indicating the crystal orientation of the SOI layer wafer, forming an insulating layer on a first principal plane of the SOI layer wafer, and bonding the base wafer to the insulating layer side of the SOI layer wafer with the reference ID mark being aligned with the reference position.

BRIEF DESCRIPTION OF THE DRAWINGS

FIGS. 3A to 3C are a perspective views showing a method of manufacturing a semiconductor wafer according to a first embodiment of the present invention;

FIG. 5 is a perspective view partly showing a semiconductor wafer according to a second embodiment of the present invention;

FIG. 8 is a table showing the results of ID mark read tests according to modification 1 of the second embodiment;

FIG. 29 is a block diagram showing a semiconductor wafer manufacturing equipment according to modification 4 of the fifth embodiment;

FIG. 48 is a flowchart showing a semiconductor wafer manufacturing method achieved with the equipment of FIG. 45;

FIGS. 53 and 54 are graphs showing the rotation angle dependence of scattered light evaluated by computer;

FIG. 63A is a perspective view showing the base wafer according to an ninth embodiment;

FIG. 63B is an enlarged view showing a reference ID mark formed on a bevel contour of the base wafer of FIG. 63A;

FIG. 64 is a flowchart showing a method of manufacturing a base wafer according to the ninth embodiment;

FIG. 65A is a perspective view showing the SOI layer wafer according to the ninth embodiment;

FIG. 65B is a sectional view showing the SOI layer wafer of FIG. 65A;

FIG. 66 is a flowchart showing a method of manufacturing an SOI layer wafer having a buried oxide film and an SOI layer according to the ninth embodiment;

DETAILED DESCRIPTION OF EMBODIMENTS

Figure 1:
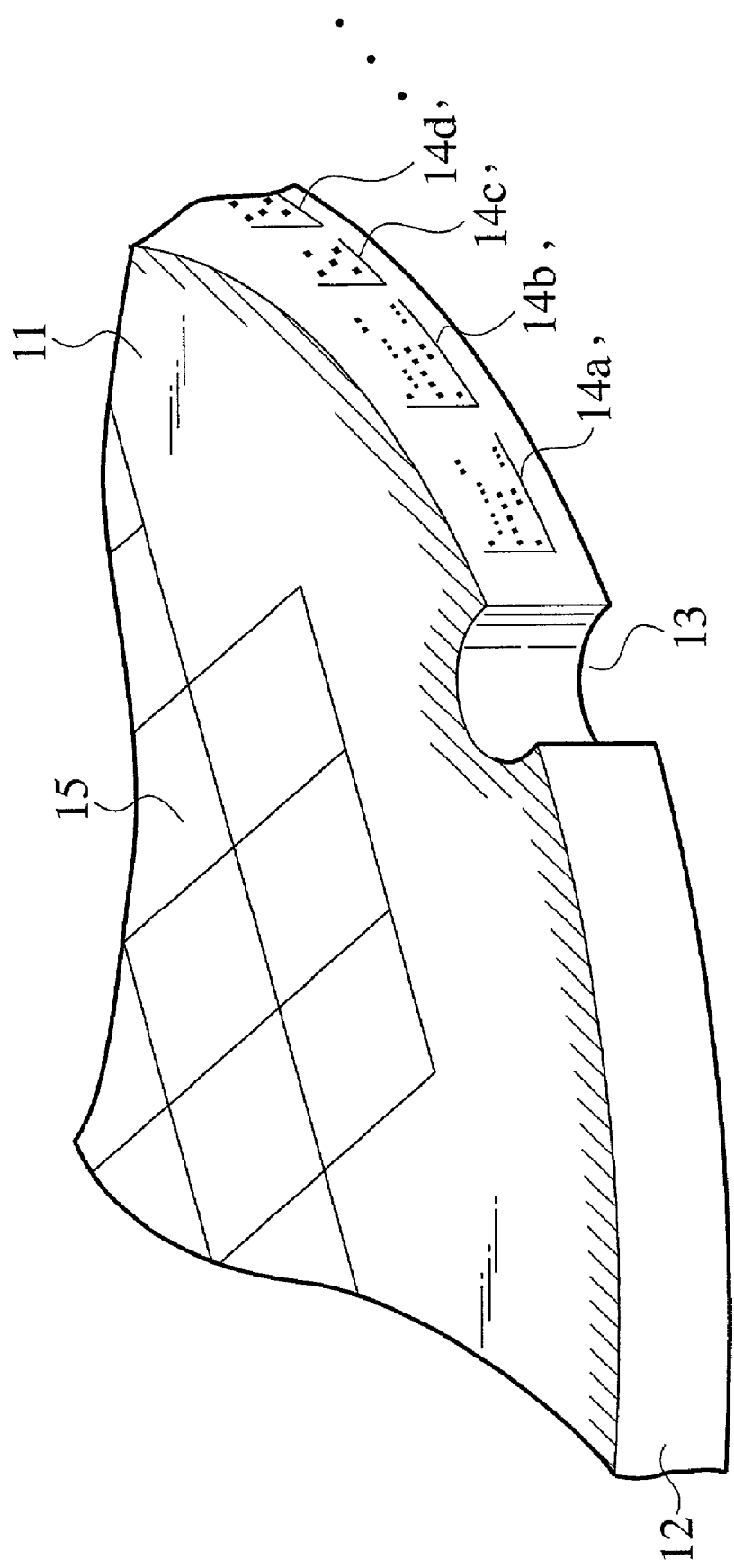
FIG. 1 is a perspective view partly showing a semiconductor wafer according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

In FIG. 1, the wafer 11 has a bevel contour 12 along the periphery of the wafer 11, products 15 formed on the wafer 11, and ID marks 14a to 14d formed on the bevel contour 12. The ID marks 14a to 14d indicate product data such as the properties, manufacturing conditions, and test results of the products 15. Whenever required, any manufacturing process may form an ID mark on the bevel contour 12 of the wafer 11, and therefore, the number of ID marks on the bevel contour 12 is optional. The ID marks may contain, for example, the lot number, manufacturing number, functions, and test results of the products 15.

The "periphery" of the wafer 11 includes an area where the bevel contour 12 is formed, a surface circumferential area of the wafer 11 where no products 15 are formed, the side face of the wafer 11, and a back circumferential area of the wafer 11. The products 15 are any products formed on the wafer 11 through a series of semiconductor device manufacturing processes. For example, the products 15 are n- and p-type semiconductor regions formed on the wafer 11, insulators deposited on the wafer 11, semiconductor and conductor films formed on the wafer 11, and patterns formed on the wafer 11 by selectively removing the films.

The products 15 may be thermal oxide films formed by thermally oxidizing the wafer 11 in a clean atmosphere at high temperatures, insulating films such as oxide and nitride films deposited on the wafer 11 by, for example, CVD, resist films coated to and cured on the wafer 11, resist patterns delineated by photolithography process, insulator patterns formed by selectively etching the insulating films with the resist patterns serving as masks, and semiconductor regions and films of given conduction types and values formed on the wafer 11 by ion implantation and thermal diffusion. The products 15 may be semiconductor devices such as transistors, capacitors, and metallic wiring, or intermediate products formed by, for example, deposition, impurity implantation, patterning, and etching.

The ID mark 14 may contain data related to the wafer 11. For example, the ID mark 14 may contain the manufacturing history of the wafer 11 including data about monocrystalline ingot lifting, slicing, and lapping, the manufacturing conditions of the wafer 11, and the properties and characteristics of the wafer 11. The ID mark 14 may be a reference ID mark that is formed at a specific location on the wafer 11 to indicate the crystal orientation of a principal plane of the wafer 11. The reference ID mark will be explained in detail in the fifth to ninth embodiments.

The ID mark 14 may consist of alphabets, numerals, a linear code, or a two-dimensional code. In the first embodiment of the present invention, the ID marks are two-dimensional codes if not specifically mentioned. The two-dimensional code consists of dots each being, for example, 5 μm wide and 0.5 μm high. The two-dimensional code may be a matrix of 8×32 dots, or 16×16 dots to indicate data related to the wafer 11 and products 15. The two-dimensional code is very small, for example, 100 to 200 μm wide and 50 to 100 μm long, and therefore, is unreadable to human eyes. The ID marks 14, therefore, are read by a reading device.

To make and read the ID marks 14, the wafer 11 is provided with a reference position. In FIG. 1, the reference position is a notch 13 formed on the periphery of the wafer 11. The notch 13 indicates a crystal orientation of the wafer 11. The ID marks 14 are on the bevel contour 12, and when the wafer 11 is stored with other wafers in a wafer cassette, the ID marks on the wafers are sequentially readable.

Figure 2:
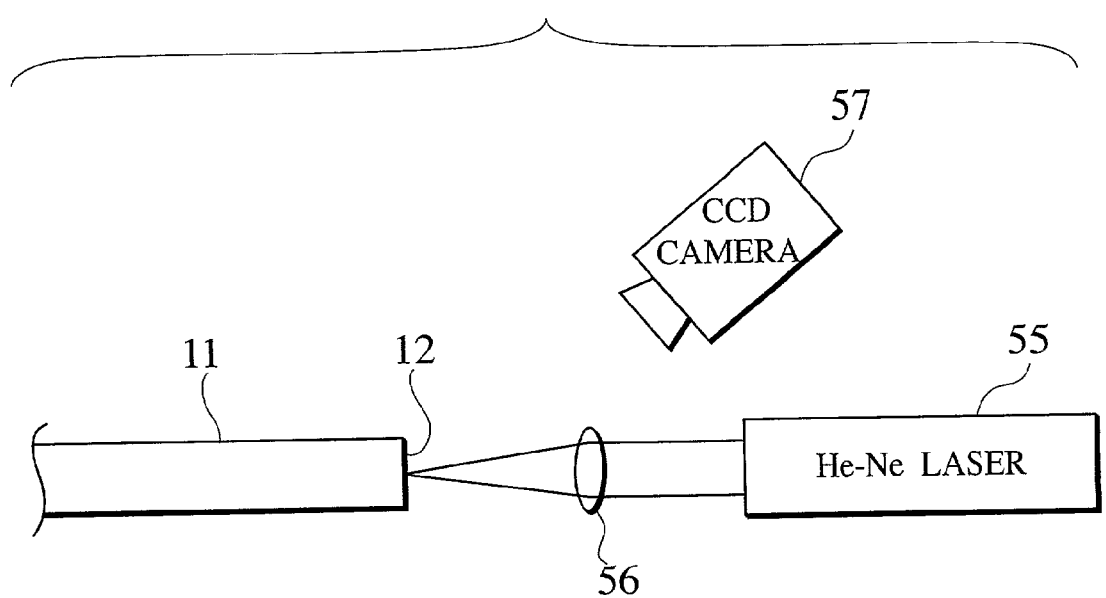
FIG. 2 is a block diagram showing a equipment for forming an ID marks on a semiconductor wafer.

In FIG. 2, a equipment for forming an ID marks 14 on a semiconductor wafer 11 has a He—Ne laser 55, an optical lens 56, and a CCD camera 57. The He—Ne laser 55 emits He—Ne laser beam onto the bevel contour 12 of the wafer 11. The He—Ne laser beam has a Gaussian energy distribution. The optical lens 56 focuses He—Ne laser beam above/on the surface of the bevel contour 12. The CCD camera 57 monitors reflected light from the bevel contour 12.

A method of manufacturing semiconductor device on the wafer 11 will be explained.

Figure 3A:
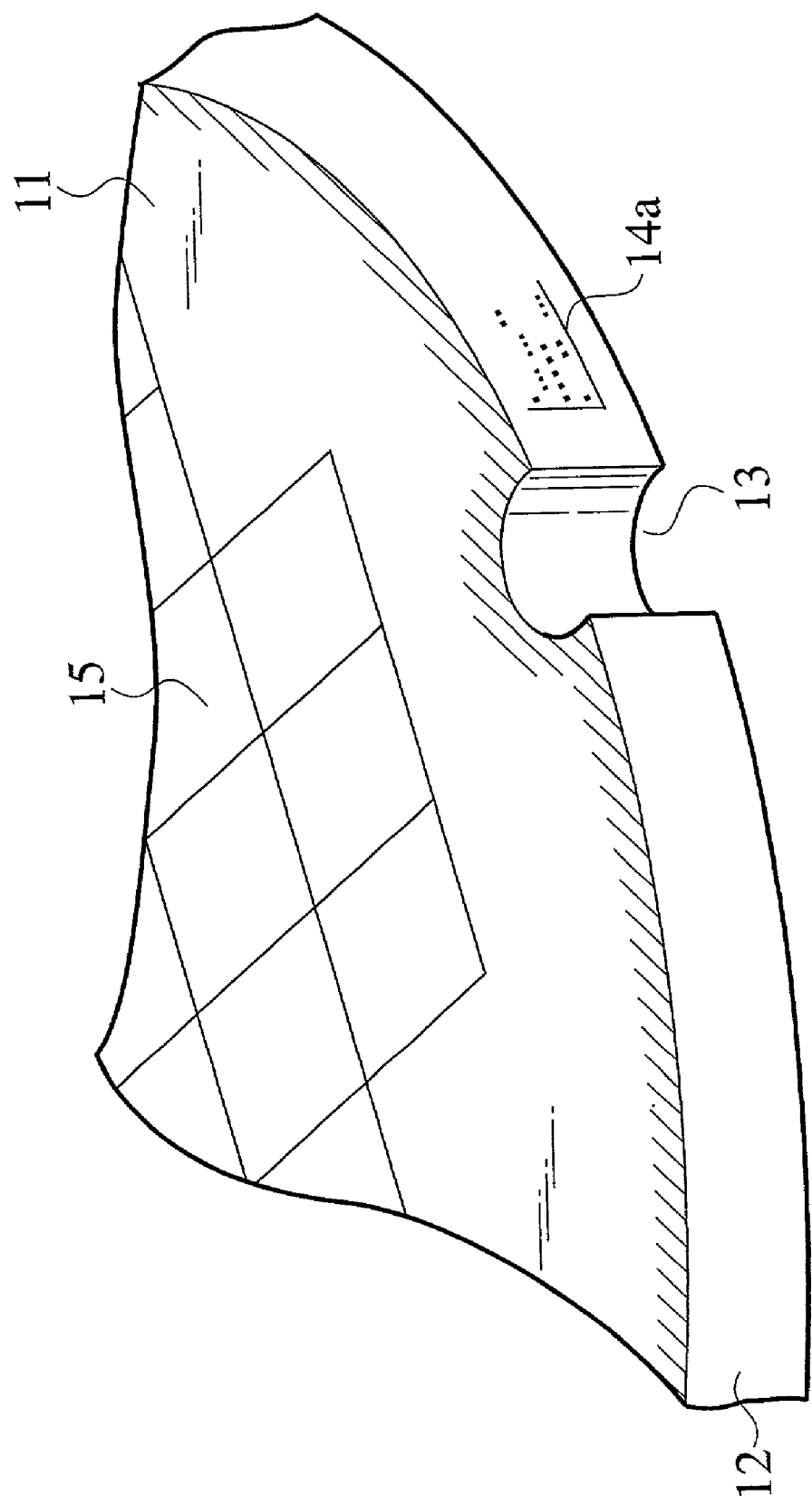

(1) In a first manufacturing process, as shown in FIG. 3A, an ID mark 14a is formed on the bevel contour 12 of the wafer 11. The ID mark 14a indicates, for example, a wafer identification number and the properties, manufacturing place, manufacturing start date, manufacturing processes, and person in charge of the products 15 formed on the wafer 11. The ID mark 14a is positioned at, for example, 100 μm from the right edge of the notch 13. The ID mark 14a is actually a matrix of dots formed by locally melting the surface of the bevel contour 12 with laser beam pulses passed through an optical system.

(2) Based on data stored in the ID mark 14a, a series of manufacturing processes are started. For example, an oxidation process is carried out first, followed by a chemical vapor deposition (CVD) process to form a mask film. The thickness of the mask film on each wafer is measured (wafers being processed in a batch). The measured thickness of each wafer is stored in a host computer. In FIG. 3B, at the same time, the measured thickness is imprinted as an ID mark 14b adjacent to the ID mark 14a.

According to the related arts, a wafer is sampled from among a batch of wafers, the film thickness of the sampled wafer is measured, and the measured thickness is stored as a typical film thickness of the batch in a host computer. Namely, the related arts use the film thickness of the sampled wafer as the representative film thickness of the batch of wafers. The wafers in the batch involve variations in their film thicknesses. To absorb the variations, the related arts add empirical values to the representative film thickness when setting manufacturing conditions for the next process to be carried out on the batch of wafers.

(3) The mask film on the wafer 11 is patterned with the use of resist and is processed by dry etching. Dry etching equipment reader reads the ID marks 14a and 14b. According to the patterns to be formed and the type and thickness of the mask film read from the ID marks 14a and 14b, the dry etching equipment determines the optimum etching conditions for the wafer 11.

(4) The wafer 11 is cleaned several times, a first principal plane of the wafer 11 is selectively etched to form grooves, and the grooves are filled with a CVD film to form element isolation regions on the wafer 11.

An ion implantation process is carried out to form wells on the wafer 11, and a transistor process is carried out on the wafer 11. A gate insulating film and gate electrodes are formed on the wafer 11. In FIG. 3C, as in the mask forming process, the gate electrode forming process forms an ID mark 14c adjacent to the ID mark 14b. The ID mark 14c indicates, for example, the thickness of the electrodes made by CVD. The thickness of electrodes is fed back to the dry etching process, to control the etching time of the wafer 11.

(5) A source/drain forming process is carried out on the wafer 11, and an ID mark 14d is formed adjacent to the ID mark 14c. The ID mark 14d indicates, for example, the thickness of a protective oxide film and is used to find the optimum ion implanting conditions for the wafer 11. This information is useful to equalize transistor characteristics of the wafer 11.

(6) If a wet etching process is required on the wafer 11, an ID mark containing film thickness data is formed on the bevel contour 12, As in the dry etching process. This ID mark is used to set the specific etching time for the wafer 11, to provide a uniform finished shape.

In this way, a plurality of ID marks (14a to 14d) containing data related to products formed in various processes are successively formed on the bevel contour 12 of the wafer 11 at intervals of, for example, 100 µm. From among the ID marks, a reader may read the rightmost ID mark from the notch 13 to access the latest data.

A manufacturing process directly forms an ID mark on the wafer 11. Then, the next manufacturing process reads the ID mark and sets the optimum manufacturing conditions for the wafer 11 without accessing a host computer, to minimize manufacturing variations among wafers in a batch. ID marks (14a to 14d) may be formed at a 45-, 90-, or 180-degree location with respect to the notch 13. At any location, the ID marks must keep regular intervals.

According to the related arts, a single marking is used to manage a large amount of data. Such a single marking requires a long time to be read. On the other hand, the first embodiment forms an ID mark to represent a single manufacturing process, thus shortening the read time of the ID mark.

A method of forming an ID mark on a semiconductor wafer according to first embodiment will be explained with reference to FIGS. 4A to 4C.

(1) The method is executed at the start of a series of semiconductor device manufacturing processes. In FIG. 4A, the bevel contour has irregularities 17 that are larger than those on a product forming area of the wafer 16. The irregularities on the bevel contour are each, for example, 0.2 µm in size and 0.2 µm in height.

Figure 4A:
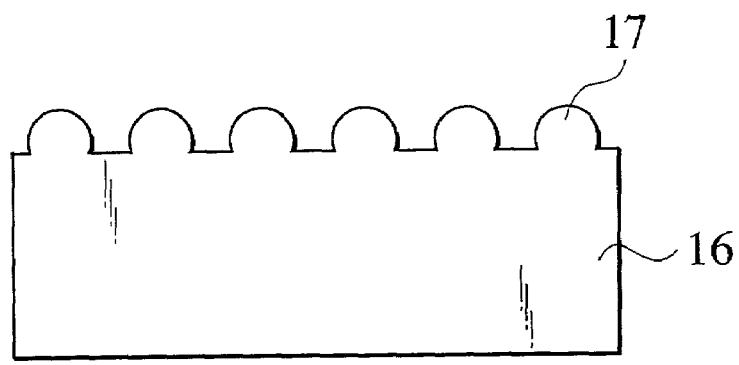
FIGS. 4A to 4C partly show a bevel contour of a semiconductor wafer where an ID mark is formed according to a first embodiment of the present invention.
Figure 4B:
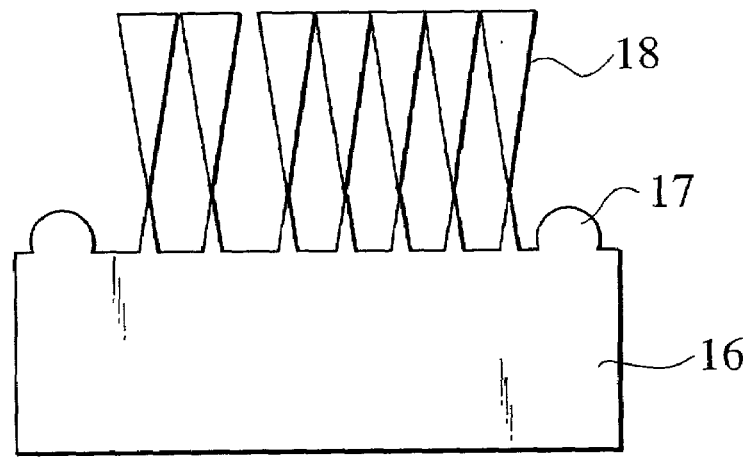

(2) In FIG. 4B, an He—Ne laser beam 18 is emitted onto the bevel contour of the wafer 16. The He—Ne laser beam 18 has a Gaussian energy distribution and focuses above the surface of the bevel contour. The laser beam 18 melts the irregularities 17. The molten irregularities recrystallize to flatten the bevel contour surface.

Figure 4C:
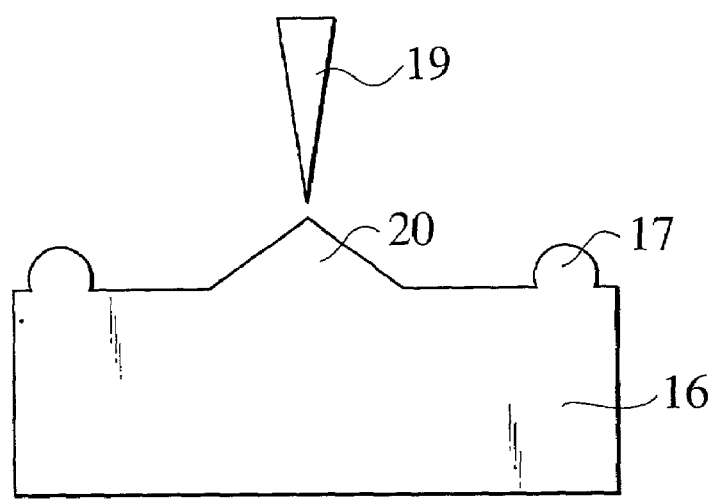

(3) In FIG. 4C, an He—Ne laser beam 19 is emitted toward the bevel contour surface. The He—Ne laser beam 19 has a Gaussian energy distribution and focuses on the bevel contour surface to melt the same. The molten bevel contour surface recrystallizes to form a dot 20 having a size of, for example, 5 µm and a height of, for example, 0.5 µm. A given number of such dots 20 are formed to constitute a two-dimensional ID mark. The ID mark may consist of 8×32 dots, or 16×16 dots.

To read the ID mark, light is emitted toward the bevel contour of the wafer 16. Reflected light from the bevel contour is monitored with a CCD camera 57, and a location where a maximum reflected light quantity is observed is determined as an ID mark location. At this location, the dots 20 in the ID mark are read.

If the ID mark is to be formed with respect to a reference notch on the wafer, the notch must first be located with the use of, for example, a laser beam and the CCD camera 57 when reading the ID mark. After locating the notch, the CCD camera 57 must be moved from the notch to the ID mark to read the ID mark. In this case, the notch is necessary in forming and reading the ID mark.

To avoid this troublesome work, the method of forming an ID mark according to first embodiment flattens an ID mark forming area on a bevel contour of a wafer and forms dots serving as an ID mark in the flattened area. The flattened area enables the ID mark to be quickly found. The method of forming an ID mark is capable of forming an easily recognizable ID mark on the surface of a wafer where irregularities are formed during a given manufacturing process, or on a wafer having no reference notch. The method of forming an ID is effective in shortening an ID mark read time in semiconductor device manufacturing processes.

According to the first embodiment, each piece of manufacturing equipment reads an ID mark, and process data is quickly fed forward to flexibly set processing conditions for the next process. This results in the equalization of the characteristics of semiconductor device manufactured from each wafer. The ID marks according to the first embodiment are useful to set proper conditions for experimental processes that are in a development stage, so that the processes may quickly be applied to an actual manufacturing line.

Modification 1 of First Embodiment

The first embodiment successively forms ID marks on each wafer and selectively reads the ID marks. Modification 1 of the first embodiment adds data contained in a first ID mark 14a to other ID marks (14b to 14d, etc.,) to be formed later. Namely, the modification 1 forms a first ID mark on a wafer in a first manufacturing process and a second ID mark on the wafer in a second manufacturing process, the first ID mark containing data related to products formed in the first manufacturing process, the second ID mark being formed adjacent to the first ID mark and containing the data contained in the first ID mark as well as data related to products formed after the first manufacturing process.

The modification 1 will be explained with reference to FIG. 1. An ID mark 14a is made on the right side of the notch 13. A manufacturing process is carried out on the wafer 11 and a film thickness is measured. An ID mark 14b, indicating the film thickness as well as data contained in the ID mark 14a, is made on the right side of the ID mark 14a.

Any piece of manufacturing equipment can access the rightmost ID mark on the bevel contour 12 as an ID mark containing latest data.

According to the first embodiment, the ID marks 14a to 14d contain individual data, and therefore, each ID mark may be a small matrix of dots. According to the modification 1, each ID mark consists of a large matrix of dots because each ID mark must contain all data. The modification 1 is advantageous in retrieving all data from a single ID mark.

Modification 2 of First Embodiment

Modification 2 of the first embodiment employs ID marks formed on semiconductor wafers to manage the storage and supply of wafers in a manufacturing line. An LSI manufacturing line includes an element isolation process that forms a shallow trench isolation (STI) structure, a gate forming process, a contact forming process, a capacitor forming process, and a wiring process.

Managing wafers in the LSI manufacturing line will be explained with reference to FIG. 1. An ID mark 14a having a wafer identification number is formed on the wafer 11. The wafer 11 is subjected to an oxidation process, a CVD process, and an STI mask forming process. The STI mask forming process forms an ID mark 14b indicating, for example, a mask film thickness. The ID mark 14b is read by a reactive ion etching (RIE) equipment, to set optimum etching conditions for the wafer 11.

The wafer 11 is successively subjected to a silicon (Si) etching process, an oxidation process, and a burying process, to form STI grooves and fill the grooves with an insulating film. Before a chemical mechanical polishing (CMP) process, the thickness of an oxide film to be polished is measured, and an ID mark 14c indicating the measured thickness is formed on the wafer 11. According to the ID mark 14c, an optimum polishing time for carrying out the CMP process is determined.

Thereafter, the wafer 11 is cleaned to complete the STI structure on the wafer 11. At this time, an ID mark 14d indicating the history of the wafer 11 including data related to the masks and processes formed and carried out on the wafer 11, is made on the bevel contour 12. Then, the wafer 11 is stored. The stored wafer is supplied to the next process whenever demanded. The stored wafer 11 is managed according to the ID mark 14d made thereon.

Another ID mark may be formed on the wafer 11 after forming gates on the wafer 11. This ID mark indicates, for example, masks, processing conditions, and test results concerning the wafer 11 before the formation of the gates. The wafer is managed according to the ID mark, to flexibly cope with demand for semiconductor device.

Modification 3 of First Embodiment

Modification 3 of the first embodiment forms ID marks on semiconductor chips produced from a wafer and manages the chips according to the ID marks. After a series of wafer processes, a chip inspection process is carried out to discriminate acceptable chips from unacceptable chips. Before cutting a wafer into chips, the modification 3 forms an ID mark on every chip on the wafer. This ID mark contains information included in the ID marks (14a to 14d) formed according to the first embodiment and modifications 1 and 2, the location of the chip on the wafer, and a test result of the chip.

Once a wafer is cut into chips, it is difficult to store wafer processing data, chip locations on the wafer, and chip test results in the individual chips. Without these pieces of data, it is difficult to analyze any failure that may occur in the chip.

The modification 3 forms an ID mark that contains all such data on each chip of a wafer before the wafer is cut into chips. The ID mark on a chip is used to manage the chip and analyze any failure that may occur in the chip once the chip is on the market.

Modification 4 of First Embodiment

The method of forming an ID mark according to first embodiment forms an ID mark consisting of dots at the start of a series of semiconductor device manufacturing processes. The method of forming an ID mark may form an ID mark on a wafer during semiconductor device manufacturing processes.

In FIGS. 4A to 4C, the wafer 16 is etched during a given semiconductor device manufacturing process, to form irregularities each of, for example, 0.2 μm in size and 0.2 μm in height on the surface of the wafer 16. A He—Ne laser beam 18 is emitted onto the surface of the wafer 16 with the He—Ne laser beam 18 focusing above the surface of the wafer 16, to flatten a limited area of the irregularities. A He—Ne laser beam 19 focusing on the surface of the wafer 16 is emitted to form an ID mark consisting of dots in the flattened area.

In this way, the method of forming an ID mark roughens and flattens an area on a wafer and forms an ID mark consisting of dots in the flattened area during a given semiconductor device manufacturing process.

Second Embodiment

The first embodiment and modifications do not particularly specify a location in a bevel contour of a wafer where an ID mark is formed. An ID mark must sometimes be made at the outermost part of a bevel contour of a wafer. If an ID mark is close to products formed on a wafer, the ID mark may be erased during a CMP process that is frequently carried out in semiconductor device manufacturing. To avoid erasure by CMP processing, ID marks must be formed at the outermost part of a bevel contour of a wafer. The second embodiment of the present invention relates to the locations and number of ID marks to be formed on a bevel contour of a wafer.

In FIG. 5, the wafer 21 has a notch 23 formed on a bevel contour 22 extending along the periphery of the wafer 21. With respect to the notch 23 serving as a reference, three ID marks 24a to 24c having the same contents are formed on the bevel contour 22. Each ID mark has a rectangular shape of 30 μm×140 μm. The ID marks 24a to 24c are shifted from each other by 30 μm in vertical and horizontal directions, respectively. Even if the ID mark 24c that is closest to products 25 formed on the wafer 21 is erased, the ID mark 24a closest to the edge of the wafer 21 will remain to be read.

When forming the ID marks, the second embodiment employs, for example, a laser displacement gauge or light reflection to roughly detect an ID mark forming area on the bevel contour 22. Namely, the second embodiment first finds the notch 23 on the bevel contour 22 and does not precisely measure the shape of the bevel contour 22. As a result, the second embodiment is capable of detecting the ID forming area on the bevel contour 22 only in two seconds. In this ID forming area, the second embodiment forms identical ID marks (24a to 24c) by horizontally and vertically shifting them from one another. The second embodiment requires an ID mark forming time of 20 seconds and a total marking time of 36 seconds.

The second embodiment requires no accurate measurement of the shape of a bevel contour of a wafer when forming ID marks on the bevel contour, and therefore, requires a shortened marking time. More precisely, the second embodiment can halve the marking time of a comparison example mentioned below.

Comparison Example of Second Embodiment

It is preferable to form an ID mark as close to the edge of a wafer as possible, so that the ID mark will not be erased during a CMP process. To achieve this, a comparison example precisely measures the bevel contour of a wafer and guides an ID mark forming laser beam as close to the edge of the wafer as possible.

Figures 6, 7:
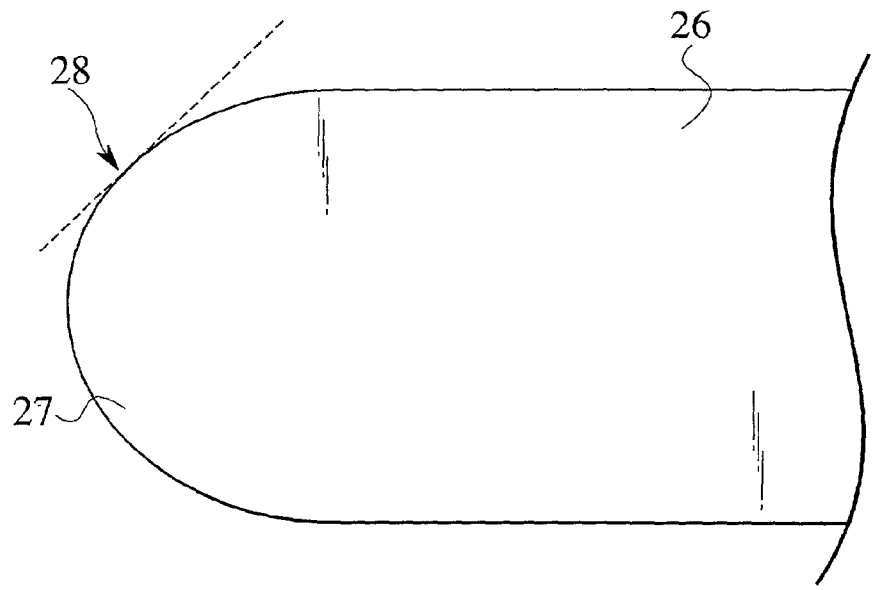
FIG. 6 is a table showing the marking durations of the second embodiment and a comparison example.
FIG. 7 explains a technique of finding a bevel contour shape of a wafer according to a comparison example of the second embodiment.

The comparison example will be explained in detail with reference to FIG. 7. A wafer 26 is set on a wafer stage, and a notch is detected on the wafer. The shape of a bevel contour 27 of the wafer 26 is found by emitting light onto the bevel contour 27. On the bevel contour 27, a nearly flat area 28 is found. To find the area 28, the bevel contour 27 must be precisely measured for a long time. As shown in FIG. 6, the comparison example requires 60 seconds to measure the shape of the bevel contour 27 (including a time to search for the nearly flat area 28), and 6 seconds to form an ID mark on the wafer 26. In addition, the comparison example requires 2 seconds to test the wafer and 4 seconds to transfer the wafer. In total, the comparison example requires 80 seconds to form an ID mark on one wafer. Most of the time is spent on measuring the shape of the bevel contour 27.

On the other hand, the second embodiment needs no high technology nor improved equipment to measure the shape of a bevel contour of a wafer, thereby shortening an ID mark formation time.

Modification 1 of Second Embodiment

Modification 1 of the second embodiment forms two ID marks instead of the three marks of the second embodiment. Forming two ID marks reduces the ID mark forming time per wafer from 36 seconds (for three ID marks) to 30 seconds. The problem of modification 1 is whether or not the two ID marks are sufficient to ensure the correct reading of at least one of the ID marks. To test this, 24 wafers were prepared with 12 having three ID marks and the remaining 12 having two ID marks.

The three ID marks on each three-ID-mark wafer were shifted from one another by 30 μm in horizontal and vertical directions. The two ID marks on each two-ID-mark wafer were shifted from each other by 50 μm in horizontal and vertical directions.

From these wafers, trench DRAMs were produced. After a bit line formation process, the wafers were subjected to an ID mark reading test. A result of the test is shown in FIG. 8.

In FIG. 8, a column "Read result" has a circle for an ID mark successfully read and a cross for an ID mark unsuccessfully read. A column "Read location" shows a number corresponding to the position of a successfully read ID mark. A number "1" represents an ID mark closest to the edge of the wafer. As the number increases, the corresponding ID mark separates away from the edge of the wafer. The tested wafers are numbered from 1 to 24 with the wafers 1 to 12 having three ID marks and the wafers 13 to 24 having two ID marks.

As shown in the test result of FIG. 8, the outermost ID marks are readable on most of the wafers. This indicates that ID marks are sufficiently readable even if they are formed without precisely measuring the bevel contours of the wafers. Roughly detecting the shape of the bevel contour of a wafer and forming a plurality of ID marks on the bevel contour allows at least one of the ID marks to be readable in any manufacturing process.

Modification 2 of Second Embodiment

Figure 9:
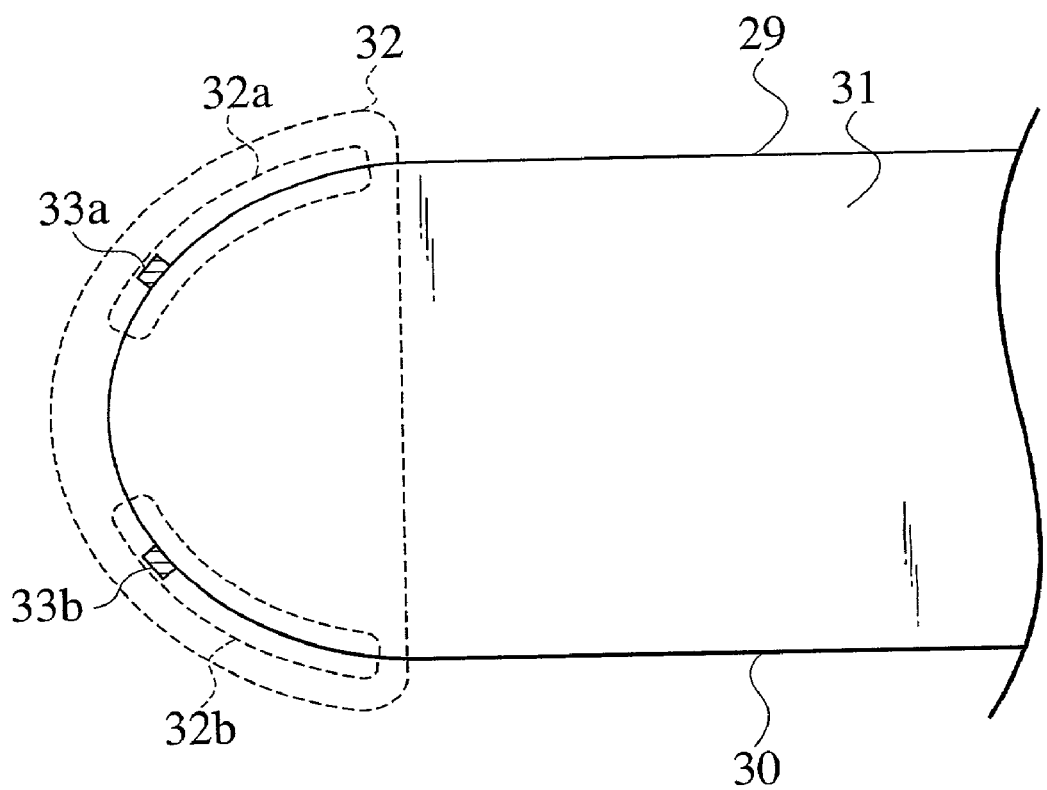
FIG. 9 is a sectional view showing a bevel contour formed along the periphery of a semiconductor wafer and ID marks on the bevel contour.

In FIG. 9, the wafer 31 has a bevel contour 32, which consists of a first bevel contour 32a close to a first principal plane 29 of the wafer 31 and a second bevel contour 32b close to a second principal plane 30 of the wafer 31 opposite to the first principal plane 29. ID marks 33a and 33b having the same data are formed on the first and second bevel contours 32a and 32b, respectively. Namely, the modification 2 forms the identical ID marks 33a and 33b on the surface and back peripheral parts of the wafer 31, respectively. The first principal plane 29 is the surface of the wafer 31 where semiconductor device is formed, and the second principal plane 30 is the back of the wafer 31.

The modification 2 divides a bevel contour of a wafer into a plurality of areas and forms identical ID marks in the divided bevel contours, respectively. Even if the ID mark 33a on the surface 29 of the wafer 31 is erased during a CMP process, the ID mark 33b on the back 30 of the wafer 31 remains for reading. Consequently, the modification 2 shortens ID mark forming and reading time to improve productivity.

Third Embodiment

Figure 10:
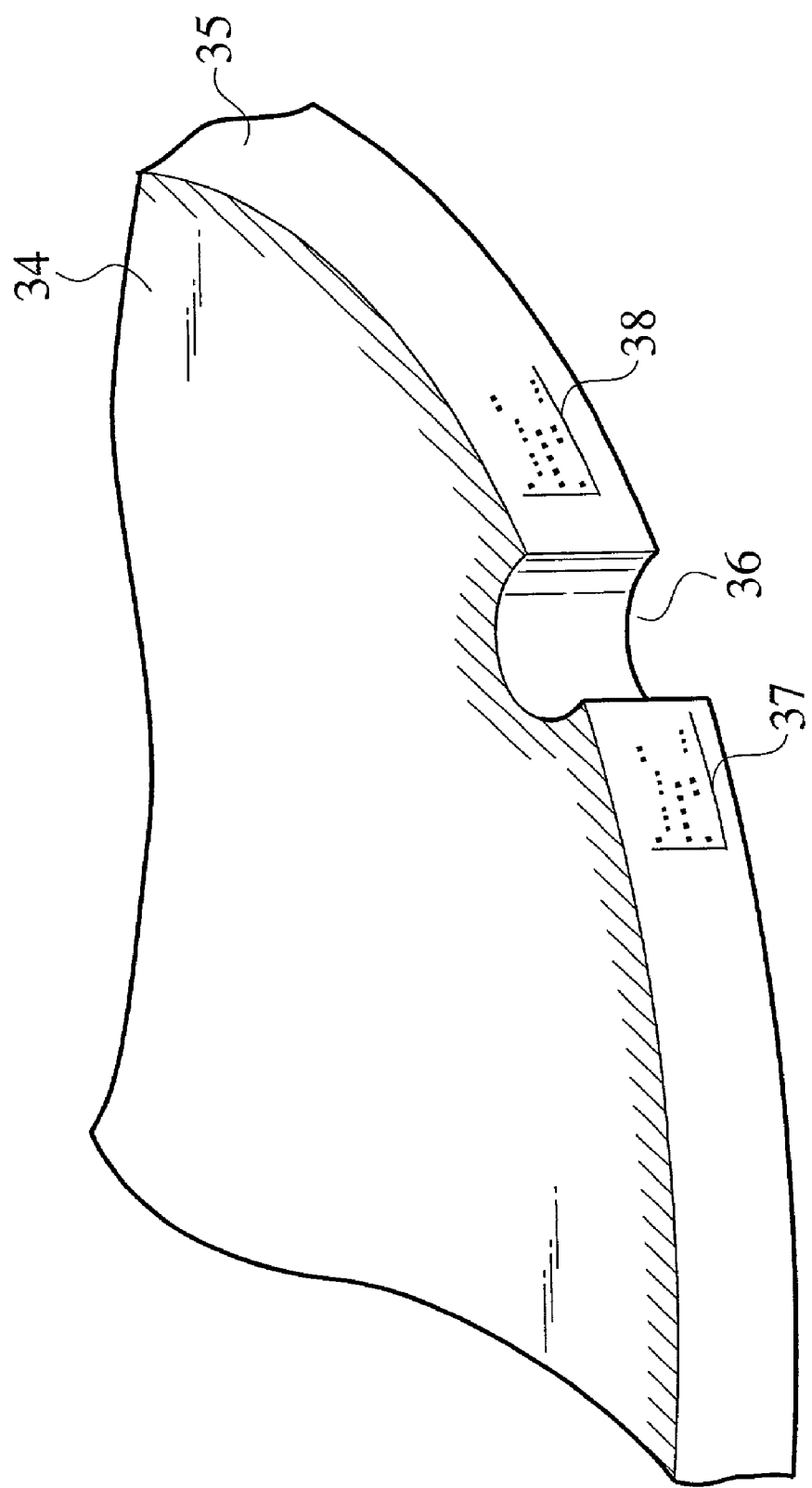
FIG. 10 is a perspective view partly showing a semiconductor wafer having an ID mark on each side of a notch according to a third embodiment of the present invention.

In FIG. 10, the wafer 34 has a reference position 36 and ID marks 37 and 38 formed on each side of the reference position 36. The reference position 36 is an object or a mark indicating a crystal orientation of the wafer 34. The reference position 36 is, for example, an orientation flat, a notch, or a mark. In FIG. 10, the ID mark 37 is a manufacture number formed by a wafer maker and the ID mark 38 is a mark formed by a device maker. The ID marks 37 and 38 are formed on the left and right sides of the reference position (notch) 36, respectively.

Figure 11:
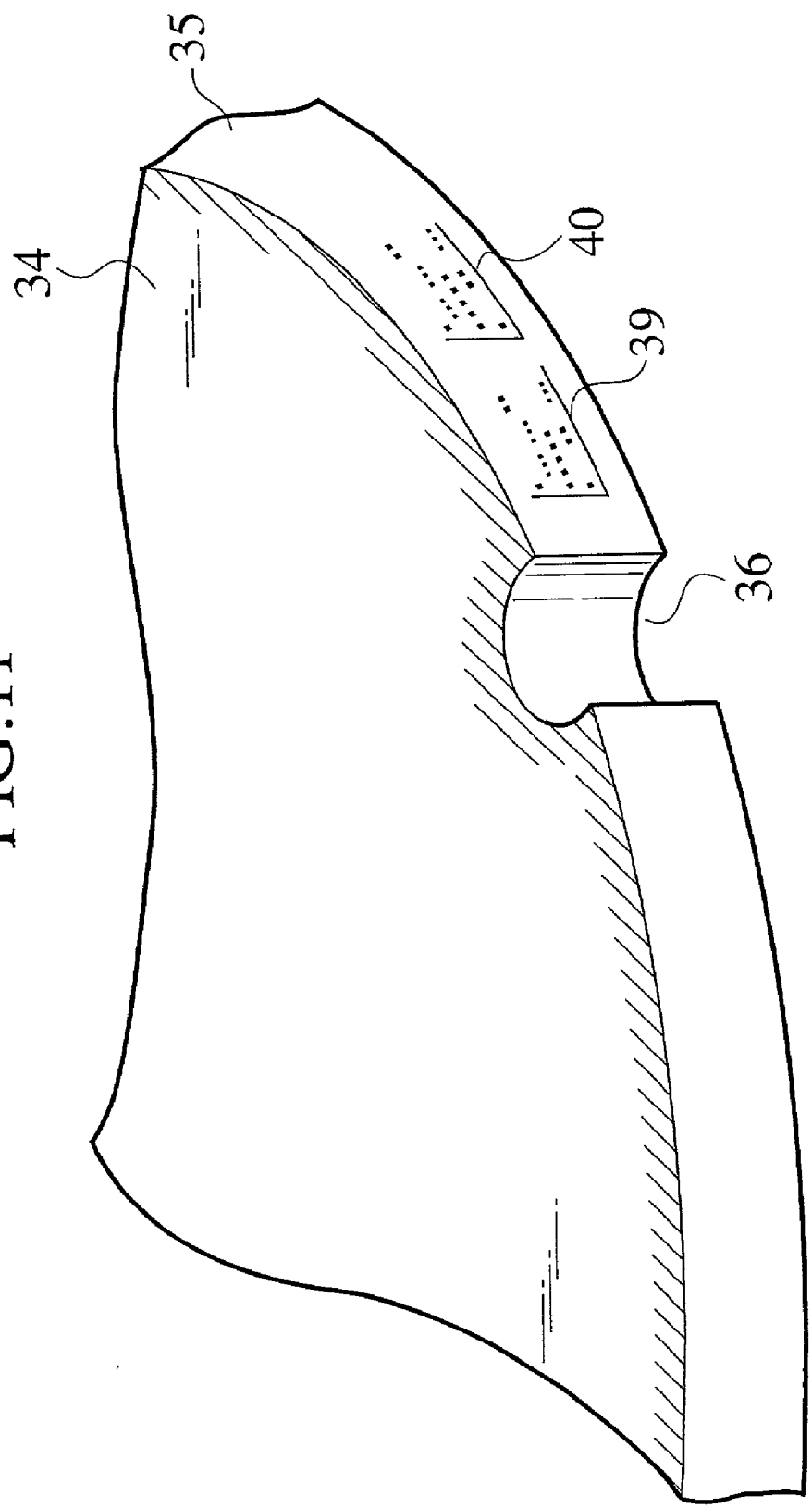
FIG. 11 is a perspective view partly showing a semiconductor wafer having ID marks on the right side of a notch according to a comparison example of the third embodiment.

In FIG. 11, a wafer 34 according to a comparison example has a notch 36 serving as a reference position and ID marks 39 and 40 formed on the same side of the notch 36. The ID marks 39 and 40 are formed by a wafer maker and a device maker, respectively.

Compared with the comparison example of FIG. 11, the third embodiment of FIG. 10 can shorten an ID mark read time. The reason for this will be explained.

In FIG. 11, the ID marks (two-dimensional codes) 39 and 40 formed on the same side of the notch 36 have each a vertical length of about 50 μm and a horizontal length of about 150 μm. The ID marks 39 and 40 are separated from each other because they are formed at different occasions by different marking units. A reader for reading ID marks has a view field of about 300 μm. When the reader is set relative to the notch 36 serving as a reference position, the second ID mark 40 moves outside of the view field of the reader. To read the second ID mark 40, the reader must be shifted from the initially set position.

Figures 12, 13:
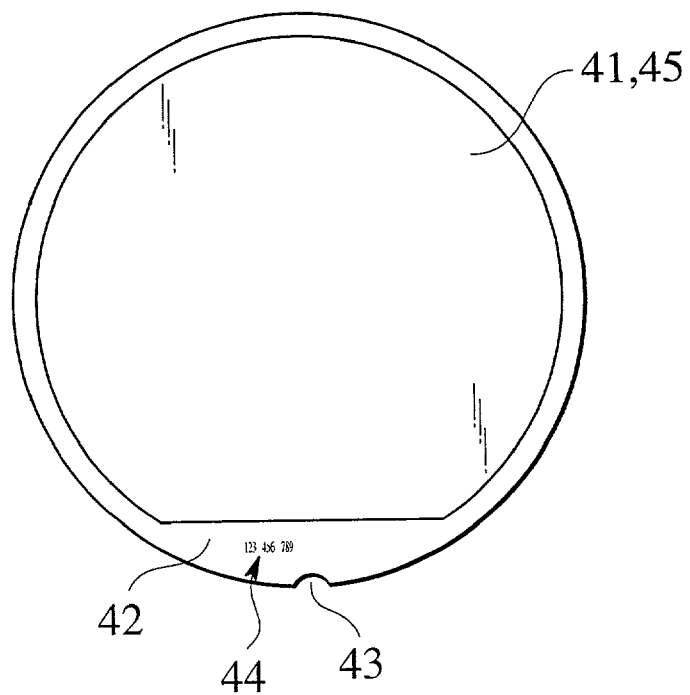
FIG. 12 is a table showing the time remained to make the ID marks of FIG. 11.
FIG. 13 is a plan view showing an SOI wafer according to a fourth embodiment of the present invention.

In FIG. 12, the total read time of the first ID mark 39 includes a reference position detection time and a read time. In addition to the reference position detection time and the read time, the total read time of the second ID mark 40 includes a camera moving time of 100 msec, greatly extending the total read time.

If a third ID mark is formed due to erasure of the first and second ID marks, the camera must further be shifted to read the third ID mark. This further extends the total read time.

Forming the wafer-maker ID mark 37 and device-maker ID mark 38 on each side of the reference notch 36 as shown in FIG. 10, reduces at least one movement of the camera to read the ID marks, reducing the total read time.

The third embodiment reduces an ID mark read time during a manufacturing process, to improve productivity. Namely, the third embodiment minimizes an adjustment time of the view field of an ID mark reader, to improve workability. After finding the reference position, the reader may be instructed to read the second ID mark instead of the first ID mark. In such a case, the third embodiment is also effective in minimizing a view field adjusting time and improving productivity.

According to the third embodiment, ID marks formed on each side of a reference position of a wafer are wafer- and device-maker ID marks. This does not limit the present invention. For example, an ID mark indicating the manufacturing history of a wafer may be formed on one side of a reference position of the wafer, and another ID mark indicating the manufacturing history of products may be formed on the other side of the reference position.

Modification of Third Embodiment

A modification of the third embodiment forms a wafer-maker ID mark (37 in FIG. 10) and a device-maker ID mark (38 in FIG. 10) on the surface and back of a wafer, respectively, to provide the same effect as the third embodiment. In particular, the modification forms the wafer-maker ID mark on the back of a bevel contour of the wafer and the device-maker ID mark on the surface of the bevel contour, to provide a new effect.

Recent semiconductor device manufacturing lines involve many CMP processes. The CMP processes easily erase ID marks made on the surface of a bevel contour of a wafer. Once an ID mark is erased, it is difficult to make the same mark again because data contained in the erased ID mark is unreadable.

To cope with this problem, the modification forms a wafer-maker ID mark on the back of a bevel contour of a wafer so that the ID mark is difficult to erase, and a device-maker ID mark on the surface of the bevel contour. At the same time, data contained in both the ID marks are stored in a host computer. If the device-maker ID mark is erased during a manufacturing process, the wafer-maker ID mark is read to retrieve the device-maker ID mark from the host computer and again form the device-maker ID mark on the wafer.

To cope with the erasure problem of ID marks, the device-maker ID mark may be formed on both the surface and back of the bevel contour of the wafer. This, however, doubles marking time, deteriorating productivity. It is preferable, therefore, to use the wafer-maker ID mark to retrieve the device-maker ID mark if the device-maker ID mark is erased.

Fourth Embodiment

Figure 14:
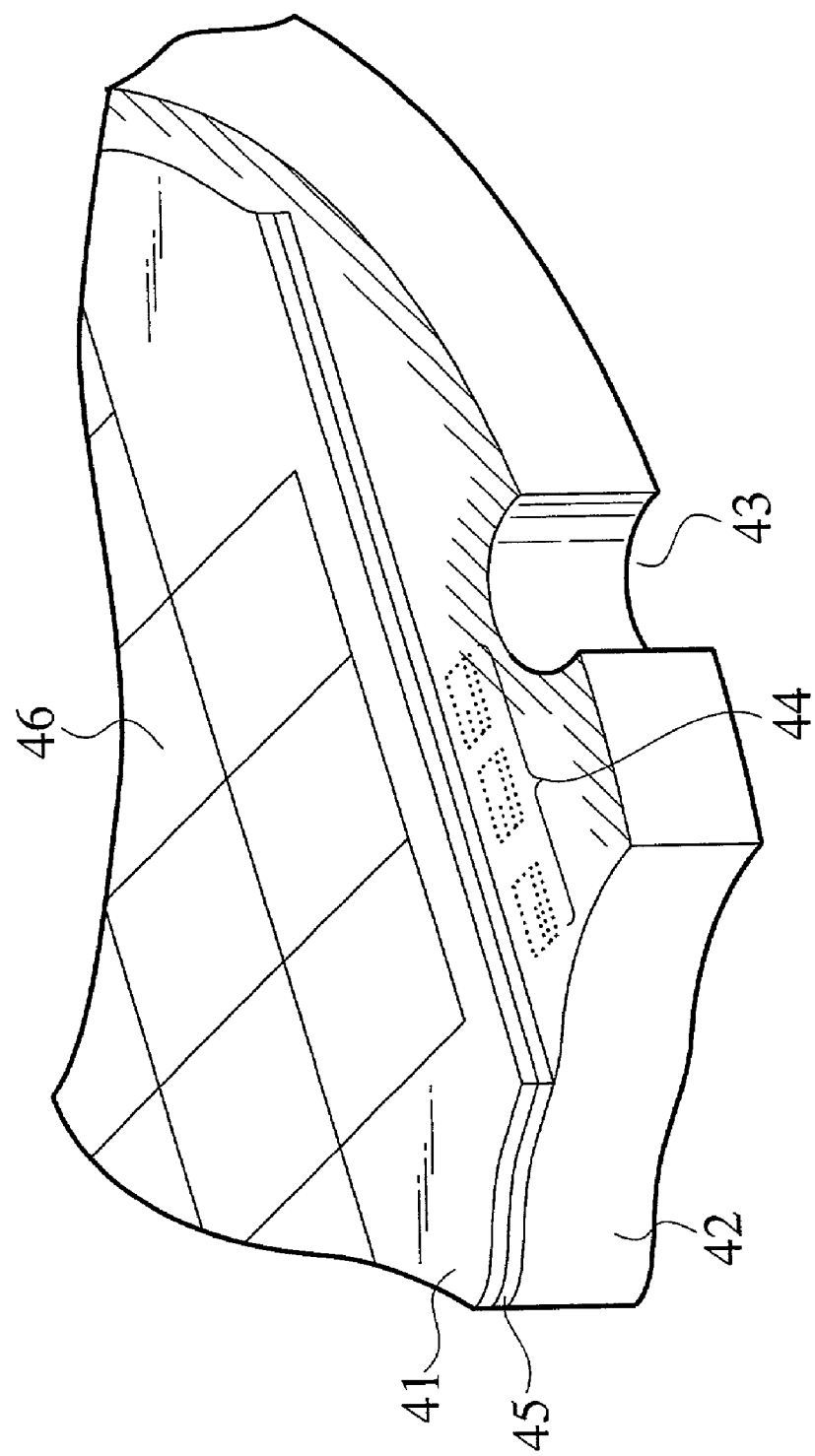
FIG. 14 is a perspective view showing a notch formed on the SOI wafer of FIG. 13.

In FIG. 13 and 14, the wafer is a silicon on insulator (SOI) wafer and has a monocrystalline silicon base wafer 42, an insulating layer 45 formed on a principal plane of the base wafer 42, a monocrystalline silicon layer 41 formed on the insulating layer 45, products 46 formed on the monocrystalline silicon layer 41, an ID mark 44 formed on the base wafer 42, and a notch 43 formed on a bevel contour of the base wafer 42. The ID mark 44 indicates, at the least, the properties, manufacturing conditions, and test results of the products 46. The insulating layer 45 is a buried oxide film. The monocrystalline silicon layer 41 is called an SOI layer. The buried oxide film 45 and SOI layer 41 are formed in an inner area of the base wafer 42, and therefore, the periphery of the principal face of the base wafer 42 is exposed. Around the notch 43, a relatively wide area is exposed on the base wafer 42. The ID mark 44 is formed on the principal plane of the base wafer 42 in the vicinity of the notch 43. Through a series of semiconductor device manufacturing processes, various products 46 are formed on the SOI layer 41, to form semiconductor integrated circuits on the SOI wafer.

A method of forming an ID mark on an SOI wafer according to the fourth embodiment will be explained. An SOI wafer of 200 mm diameter is prepared. The SOI wafer has a base wafer 42, a buried oxide film 45, and an SOI layer 41, each having the same plan shape. Photolithography is carried out to form a resist pattern on the SOI layer 41. The resist pattern has the shape of the SOI layer 41 of FIG. 13. The resist pattern is used as a mask to etch the periphery of the SOI layer 41 with a KOH solution. This selectively exposes the buried oxide film 45 on the periphery of the base wafer 42.

The buried oxide film 45 is etched with an HF solution to selectively expose the periphery of the base wafer 42 including an area where an ID mark 44 is formed. The resist pattern is removed, and the ID mark 44 is formed on the base wafer 42 close to a notch 43. The ID mark 44 is made of dots each being 5 μm in depth and 30 μm in diameter, the dots being made with a YAG laser beam.

The ID mark 44 is readable like ID marks formed on bulk wafers. Since the ID mark 44 is formed on the base wafer 42, no abnormality occurs on dots that constitute the ID mark 44.

According to the fourth embodiment, the SOI layer 41 and buried oxide film 45 are partly removed by etching on the base wafer 42. Instead, wafers having different sizes may be bonded together to form the SOI wafer of FIG. 13. The size difference between the bonded wafers exposes part of the base wafer 42, and the ID mark 44 is formed on the differential area. For example, a notched wafer serving as the base wafer 42 may be bonded to a wafer having an orientation flat and the SOI layer 41. The SOI wafer of FIG. 13 may be formed by an SIMOX method. This method places a mask plate on the base wafer 42 when implanting oxygen ions into the base wafer 42, to secure a marking area on the base wafer 42 where the ID mark 44 is formed.

The fourth embodiment emits a laser beam onto the part of the base wafer 42 where no SOI layer 41 or oxide film 45 exists, to make dots that form the ID mark 44. The fourth embodiment is capable of forming ID marks on SOI wafers like standard bulk wafers.

Comparison Example of Fourth Embodiment

Figure 15:
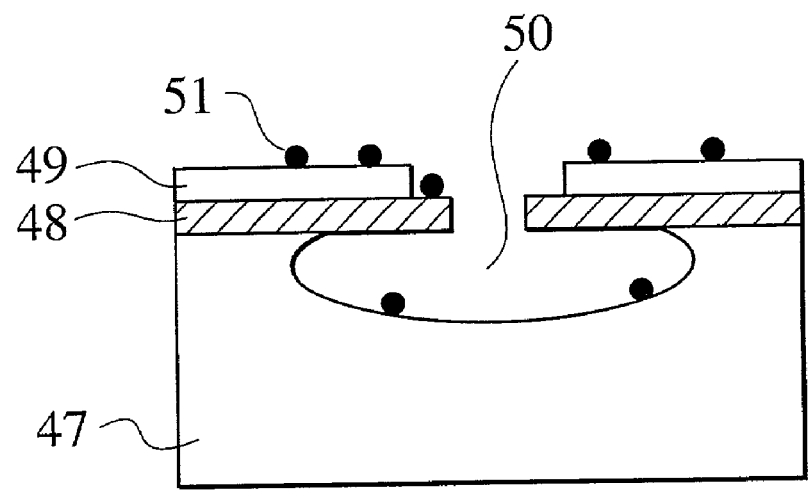
FIG. 15 is a sectional view showing a problem caused when using a laser beam to form a marking on a buried oxide film of an SOI wafer.

In FIG. 15, the SOI layer 49 is on a buried oxide film 48 that is on a base wafer 47, to constitute an SOI wafer. The SOI layer 49 is formed to a thickness of 1 μm or thinner when forming high-speed MOS transistors thereon. The laser beam emitted onto the SOI layer 49 is scattered by the buried oxide film 48 to make a relatively large dot 50 under the film 48. The large dot 50 may peel off the buried oxide film 48 and produce dust 51, affecting subsequent device forming processes.

According to the fourth embodiment of FIGS. 13 and 14, a laser beam is emitted onto the base wafer 42 instead of the SOI layer 41, causing none of the problems of the comparison example. Without requiring additional processes, the fourth embodiment forms ID marks on SOI wafers at low cost.

The fourth embodiment is capable of making ID marks on SOI wafers as on standard wafers without causing the peeling of buried oxide films or dust that affects device processes.

Modification of Fourth Embodiment

Figure 16:
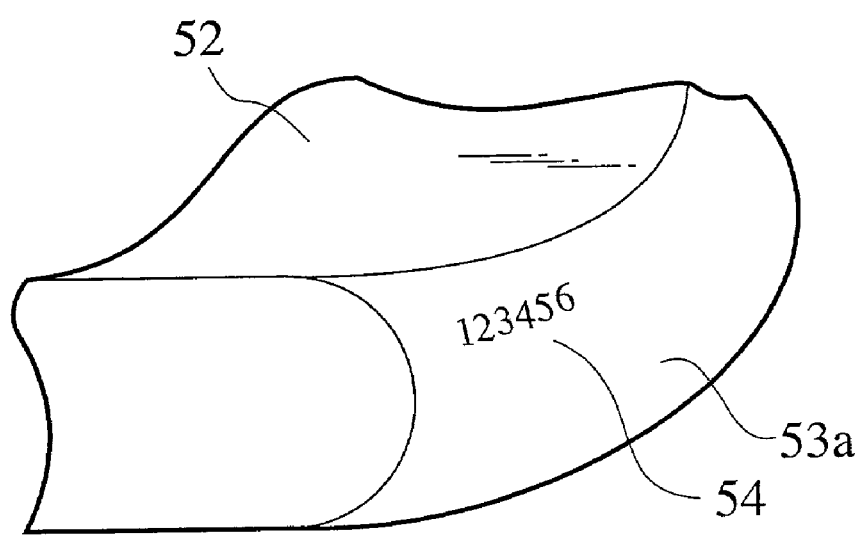
FIG. 16 shows an ID mark formed on a bevel contour of an SOI wafer according to a modification of the fourth embodiment.

In FIG. 16, an SOI wafer 52 has a diameter of, for example, 200 mm. The wafer 52 includes a base wafer having a bevel contour 53a. On the bevel contour 53a, a YAG laser beam is emitted to form dots each of 0.5 μm deep and 5 μm in diameter to form an ID mark 54. According to tests, the ID mark 54 involved no abnormality and was as readable and recognizable as an ID mark formed on a bulk wafer. The SOI wafer 52 is manufacturable by any one of the SIMOX method and the bonding method.

Notchless Wafer

The first to fourth embodiments form and read an ID mark on a semiconductor wafer according to a reference notch or orientation flat formed on the wafer.

The notch or orientation flat on a wafer involves the risk of deteriorating the processibility of the wafer and the performance of semiconductor device formed on the wafer. For example, the notch or orientation flat may vary the thickness and pattern sizes of a resist film formed on the wafer during a lithography process. The notch or orientation flat may also vary the etching quantities of an insulating film on the wafer during a spin etching process. In addition, the notch or orientation flat must carefully avoid hooks when the wafer is transferred onto a wafer port of an oxidation/LPCVD equipment. This is done by aligning the reference position of the wafer with that of the wafer port. For this purpose, the oxidation/LPCVD equipment must have a positioning mechanism, which increases the cost of the oxidation/LPCVD equipment. The notch or orientation flat serves as a singular point to destabilizing thermal balance and producing defective chips around the notch.

The notch easily gathers unwanted materials such as dust and resist during manufacturing processes. It is difficult to remove such materials from the notch. These materials may become floating particles which contaminate the wafer. The notch or orientation flat interferes with the products to be formed on the wafer, reducing the number of acceptable chips to be formed from the wafer. In this way, the notch or orientation flat causes various problems.

The notch or orientation flat on a wafer, however, plays an important role identifying the crystal orientation of the wafer, and the crystal orientation is a critical factor determining the carrier mobility, etching speed, and epitaxial growth speed of the wafer. If the notch or orientation flat were omitted, it would be difficult to identify and control the crystal orientation of the wafer. If the crystal orientation became uncontrollable, the wafer might produce an uneven impurity profile in the ion implanting process and unstable mobility of transistors formed on the wafer, rendering chips formed from the wafer unacceptable.

To cope with these problems, the fifth to ninth embodiments of the present invention provide circular semiconductor wafers each having a reference ID mark that indicates a crystal orientation of the wafer without relying on a notch or an orientation flat.

Fifth Embodiment

Figure 17:
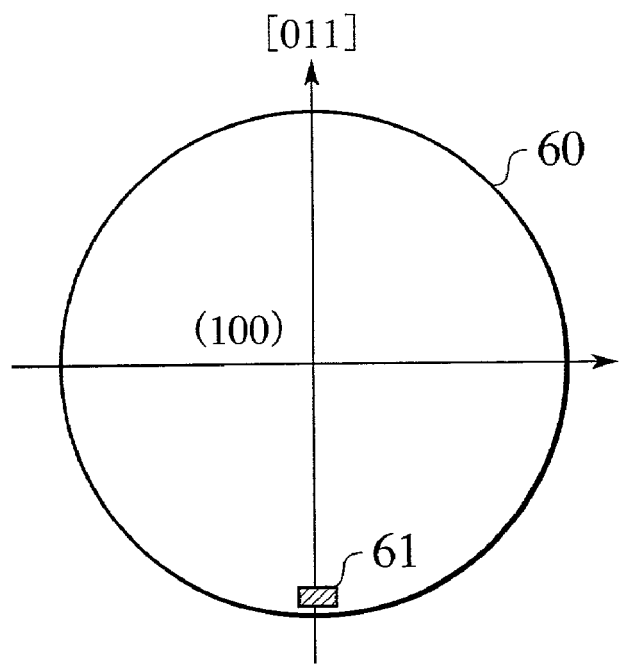
FIG. 17 is a plan view showing a first principal plane of a semiconductor wafer according to a fifth embodiment of the present invention.

In FIG. 17, the wafer 60 is circular and has no notch or orientation flat on the periphery thereof. The periphery of the wafer 60 has a bevel contour. On the first principal plane of the wafer 60 inside the bevel contour, semiconductor device is formed. The first principal plane is also circular and has (100) crystal faces and a [011] orientation line. A reference ID mark 61 is formed on the bevel contour along the [011] orientation line and indicates the crystal orientation of the first principal plane of the wafer 60. The reference ID mark 61 may be made of alphanumeric characters, a bar code, or a two-dimensional code. If the reference ID mark 61 is a two-dimensional matrix code, it will be made of 8 ×32 dots or 16×16 dots. In the following explanation, the reference ID mark 61 is a two-dimensional code.

Figure 18:
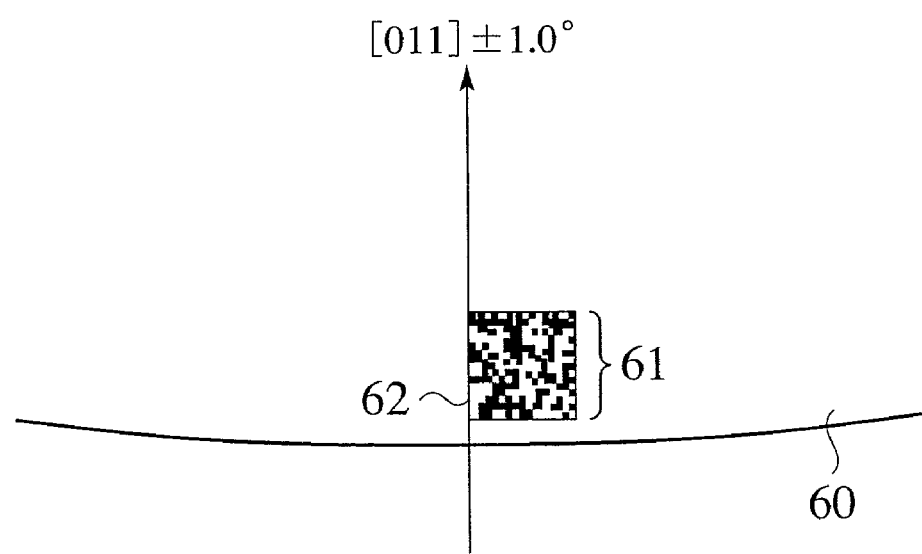
FIG. 18 is an enlarged plan view showing a reference ID mark formed on a bevel contour of the wafer of FIG. 17.

In FIG. 18, the reference ID mark 61 is a two-dimensional matrix code including an L-shaped guide cell 62. The guide cell 62 is used to identify the [011] orientation line of the (100) crystal faces. The guide cell 62 is arranged in the range of ±1.0 degrees around the [011] orientation line. Namely, the guide cell 62 substantially agrees with the [011] orientation line.

Figure 19:
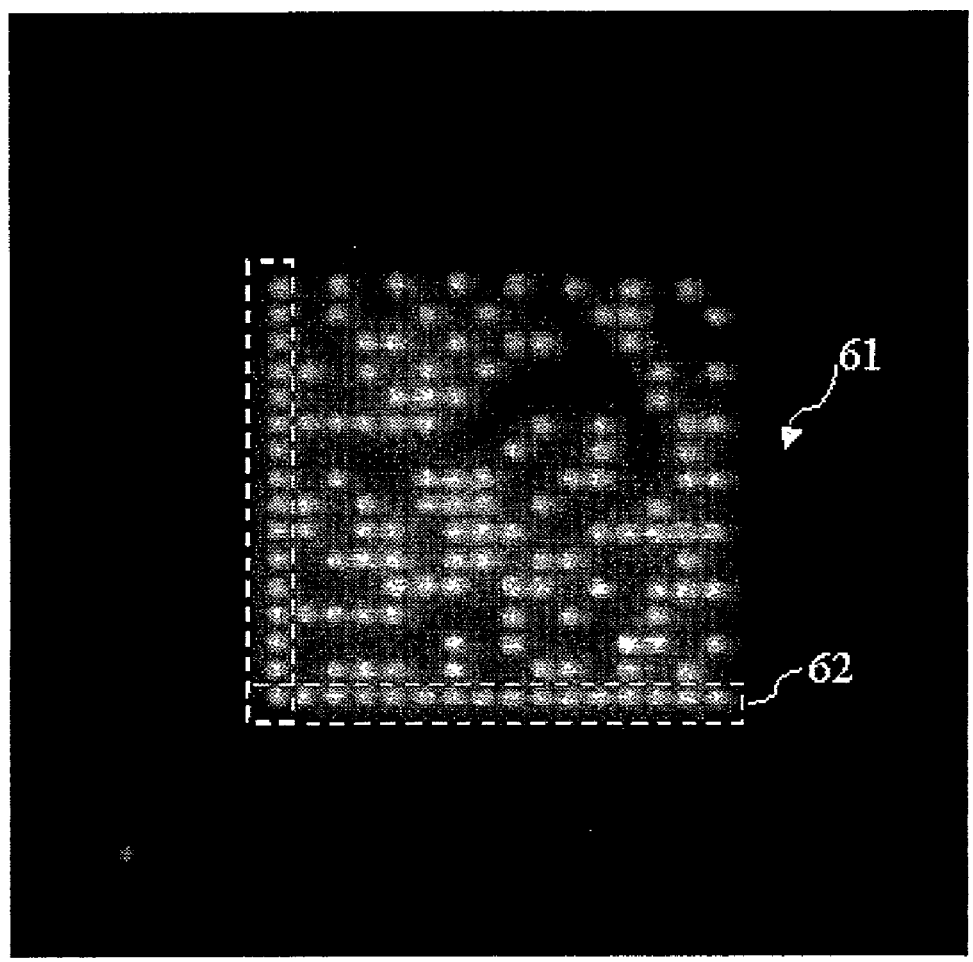
FIG. 19 is an enlarged plan view showing a two-dimensional matrix code having an L-shaped guide cell and serving as a reference ID mark.

FIG. 19 is an enlarged plan view showing the two-dimensional matrix code 61 including the L-shaped guide cell 62. The code 61 consists of a matrix of 16×16 dots. A side length of the code 61 is, for example, 100 μm. The guide cell 62 consists of 31 dots arranged along two orthogonal sides of the code 61. The guide cell 62 is on the [011] orientation line and serves to identify the same.

The equipment for manufacturing the wafer 60 in FIG. 17 has an orientation measuring unit to measure a crystal orientation of the wafer 60 and a marking unit to form a reference ID mark at a required position on the wafer 60 according to the measured crystal orientation.

Figure 20:
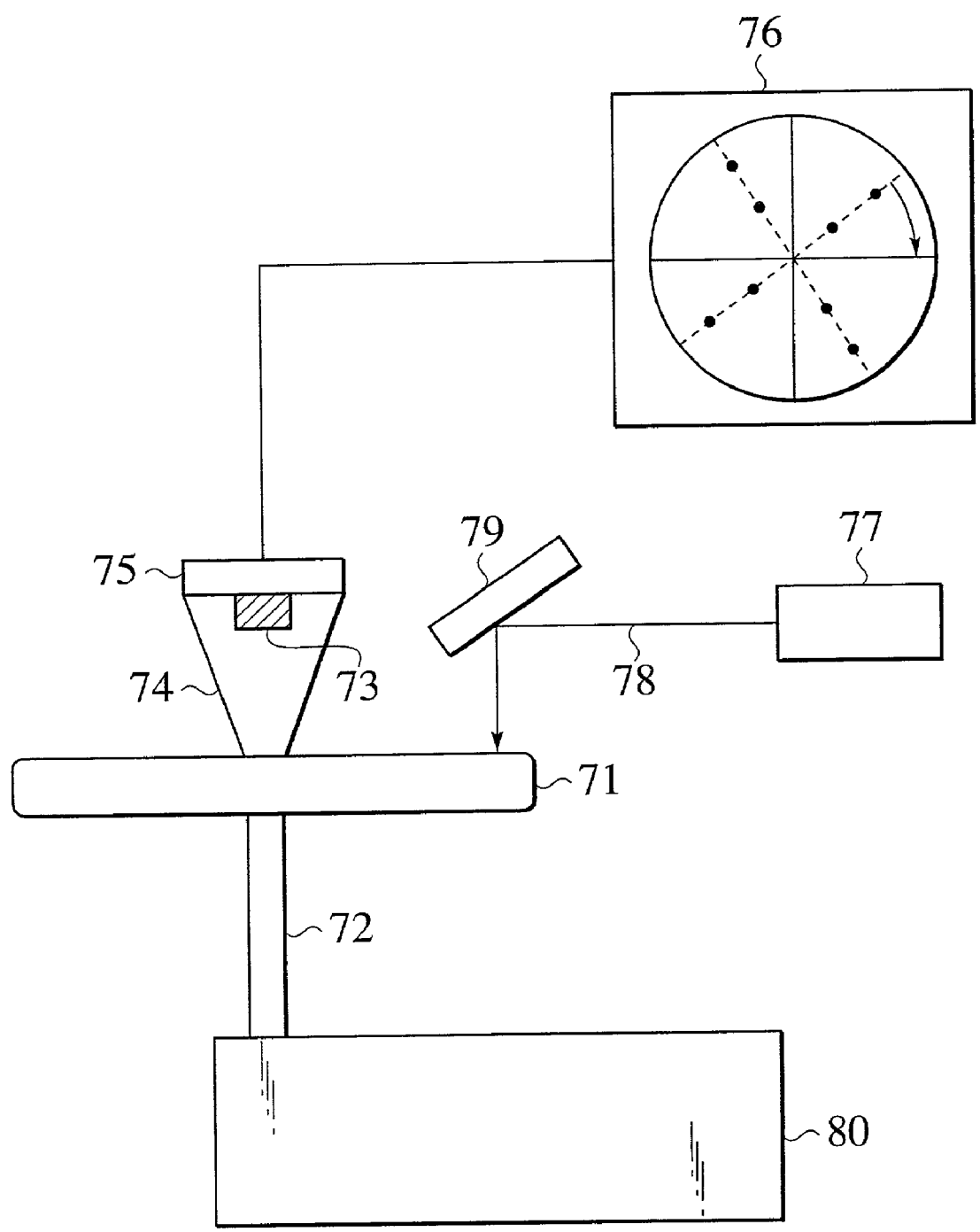
FIG. 20 is a block diagram showing a semiconductor wafer manufacturing equipment according to a fifth embodiment of the present invention.

In FIG. 20, the equipment for manufacturing the wafer 71 has an X-ray tube 80 to emit X-rays 72 toward a second principal plane of a wafer 71 opposite to a first principal plane of the wafer 71, a two-dimensional X-ray detector 75 to detect scattered X-rays 74 from the wafer 71, a display 76 to display a two-dimensional Laue image formed with the scattered X-rays 74, a laser source 77 and a mirror 79 to emit a laser beam 78 toward the periphery of the wafer 71 and form a reference ID mark there, a measuring device to measure the offset angle between an irradiation spot of the laser beam 78 on the wafer 71 and a crystal orientation line, and a rotating device to rotate the wafer 71 or a laser marker consisting of the laser source 77 and mirror 79. The X-ray tube 80, X-ray detector 75, and display 76 form an orientation measuring unit. The laser marker, measuring device, and rotating device form a marking unit. The X-ray detector 75 is arranged above the first principal plane of the wafer 71, to detect the X-rays 74 that have passed through and scattered by the wafer 71.

The X-ray detector 75 includes an X-ray stopper 73 to stop unscattered X-rays 72 from directly entering a fluorescent screen and CCD camera of the X-ray detector 75. The wafer 71 is a circular semiconductor wafer having no notch or orientation flat. The X-ray detector 75 consists of the fluorescent screen and CCD camera that are arranged in parallel with the wafer 71. The fluorescent screen generates fluorescence when irradiated with X-rays. The CCD camera senses the fluorescence and converts it into an electric signal.

A method of manufacturing the wafer 71 in FIG. 20 measure a crystal orientation line perpendicular to a crystal orientation face on a first principal plane of a wafer and form a reference ID mark at an optional position on the wafer. The method of manufacturing the wafer 71 will be explained with reference to FIG. 21 to 24.

(1) In stage S0I, the wafer 71 is transferred into a manufacturing equipment. The wafer 71 has the first principal plane where (100) crystal faces are exposed and a diameter of 300 mm. The wafer 71 has no notch or orientation flat, and there is no need for positioning of the wafer 71 with respect to a wafer stage of the manufacturing equipment by means of a notch or orientation flat.

(2) In stage S02, the center of the wafer 71 is aligned with a rotation center of the wafer stage having a rotation mechanism. In stage S03, the X-ray tube 80 having a molybdenum (Mo) target emits X-rays 72 toward the second principal plane of the wafer 71 at a voltage of 40 kV and a current of 30 mA. The X-rays 72 are scattered by the wafer 71 toward the fluorescent screen.

Figure 22A:
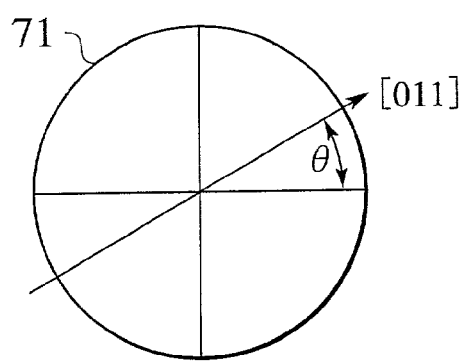
FIG. 22A is a plan view showing a rotation angle of a wafer observed in a semiconductor device manufacturing process.
Figure 22B:
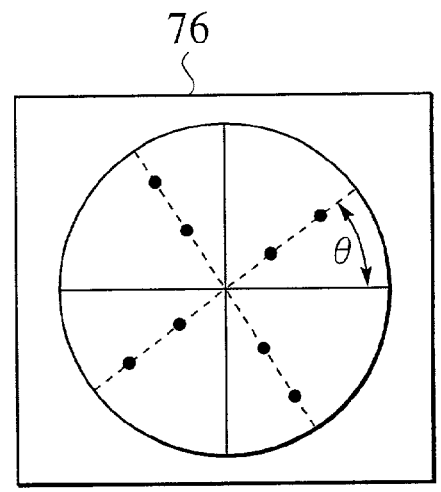
FIG. 22B shows a Laue image of the wafer of FIG. 22A displayed on a display.

(3) In stage S04, the CCD camera catches fluorescence from the fluorescent screen and provides a Laue image on the display 76. According to the Laue image, a crystal orientation line of the wafer 71 is detected. At this time, the rotation angle of the wafer 71 and the Laue image are, for example, as shown in FIGS. 22A and 22B.

(4) In stage S05, the Laue image is used to calculate an offset angle (θ) between a laser spot made by the laser marker (77, 79) and a [011] orientation line of the wafer 71. In stage S06, the wafer 71 is rotated so that the [011] orientation line of the wafer 71 overlaps with the laser spot made by the laser marker.

Figure 23A:
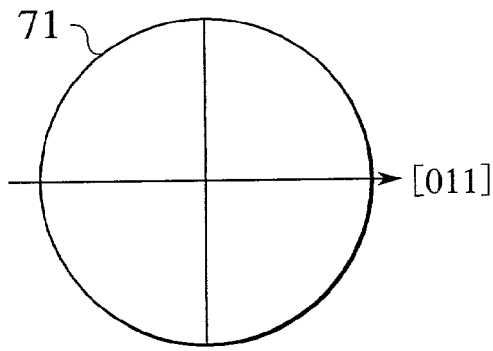
FIG. 23A is a plan view showing a rotation angle of the wafer of FIG. 22A after rotational correction.
Figure 23B:
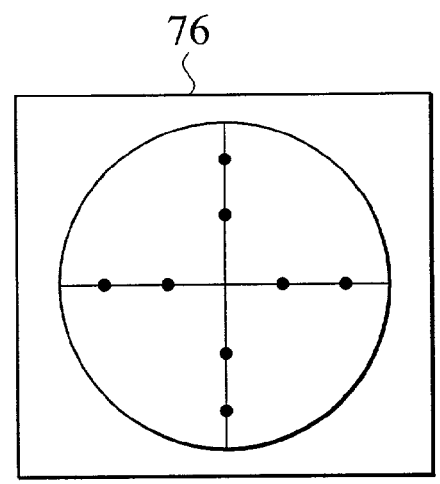
FIG. 23B shows a Laue image of the wafer of FIG. 23A.
Figure 24:
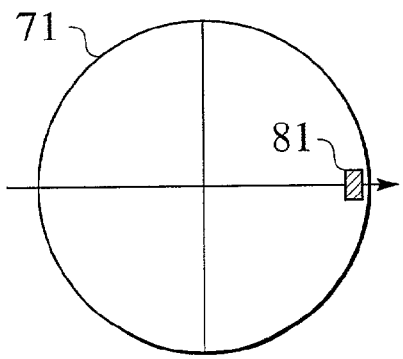
FIG. 24 is a plan view showing a reference ID mark formed on the wafer of FIG. 23A.

(5) In stage S07, X-rays are emitted toward the wafer 71, and in stage S08, a Laue image is obtained. In stage S09, a distance between the laser spot made by the laser marker (77, 79) and the [011] orientation line is evaluated. The wafer 71 after rotation and the Laue image are, for example, as shown in FIGS. 23A and 23B. Instead of rotating the wafer 71, the laser marker may be rotated. In stage S10, it is checked to see whether the offset angle is greater than 1°. If it is greater than 1°, the flow returns to stage S06, and if it is less than 1°, the flow advances to stage S11.

(6) In stage S11, a position for forming a reference ID mark on the wafer 71 is determined. In stage S12, a reference ID mark 81 is formed on the [011] orientation line at a position 2 mm away from the edge of the wafer 71. The reference ID mark 81 consists of dots each being a recess melted by the laser marker (77, 79). The dots of the reference ID mark 81 may represent a numeric expression.

A technique of forming the dots that form the reference ID mark 81 will be explained. For example, an He—Ne laser beam having a Gaussian energy distribution is focused on the surface of the wafer 71. The part of the wafer 71 irradiated with the laser beam melts and recrystallizes to form a dot of, for example, 5 µm in size and 0.5 µm in height. This process makes a plurality of such dots to form the reference ID mark 81. The reference ID mark 81 is read by a reader provided for, for example, an exposing equipment or an ion implanting equipment.

(7) The wafer 71 is moved outside the manufacturing equipment. The time from transferring the wafer 71 into the equipment in stage S01 to moving the wafer 71 out of the equipment in stage S13 is 9 seconds per wafer in fifth embodiment.

The fifth embodiment irradiates a wafer with X-rays to obtain a Laue image of the wafer, measures a crystal orientation line of the wafer according to the Laue image, and forms a reference ID mark at the edge of the wafer according to the measured orientation line. The fifth embodiment is capable of processing a circular wafer having no notch or orientation flat through a series of semiconductor manufacturing processes. Compared with wafers having notches or orientation flats, the wafers having none of these according to the fifth embodiment are superior in terms of etching speed, film growing speed, CMP speed, and the evenness of the wafer surface. Any process such as a lithography process can control the crystal orientation of a wafer according to a reference ID mark made on the wafer according to the fifth embodiment.

The reference ID mark 61, 81 formed on the wafer 60, 71 eliminate the need for a notch or an orientation flat on the wafer. Such a circular wafer minimizes wafer-to-wafer variations and can produce uniform semiconductor device at high yield.

The reference ID mark 61, 81 enables, for example, an oxidation/LPCVD equipment to have no wafer positioning device, thereby reducing the cost of the equipment.

Modification 1 of Fifth Embodiment

Figure 25:
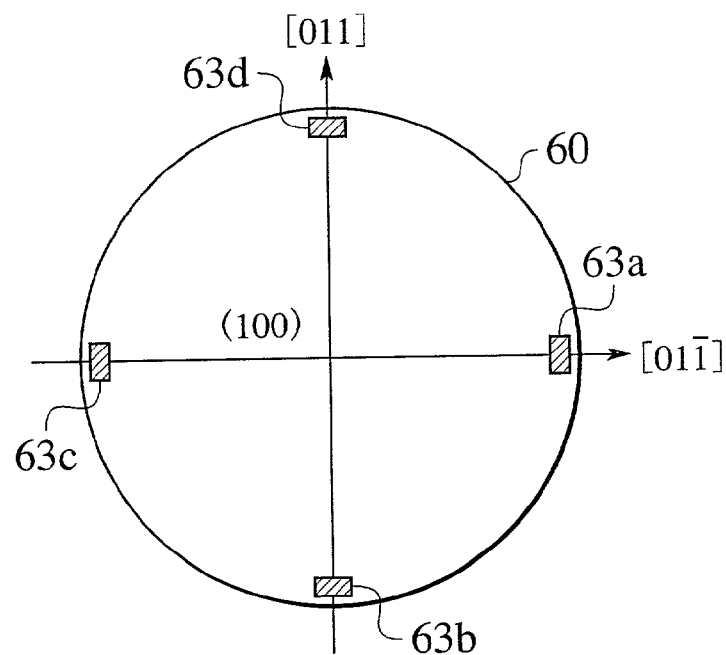
FIG. 25 is a plan view showing a semiconductor wafer according to modification 1 of the fifth embodiment.

In FIG. 25, the wafer 60 is circular and has no notch or orientation flat. The surface of the wafer 60 exposes (100) crystal faces. The wafer 60 has a bevel contour where reference ID marks 63a to 63d are formed to identify a crystal orientation of the wafer 60. More precisely, the two reference ID marks 63b and 63d are formed on a [011] orientation line, and the two reference ID marks 63a and 63c are formed on a [011] orientation line.

Even if some of the reference ID marks are erased in a CMP process, the remaining reference ID marks will serve to identify the crystal orientation of the wafer 60. By increasing the number of reference ID marks, the crystal orientation of the wafer 60 may be more precisely detectable.

Figure 26:
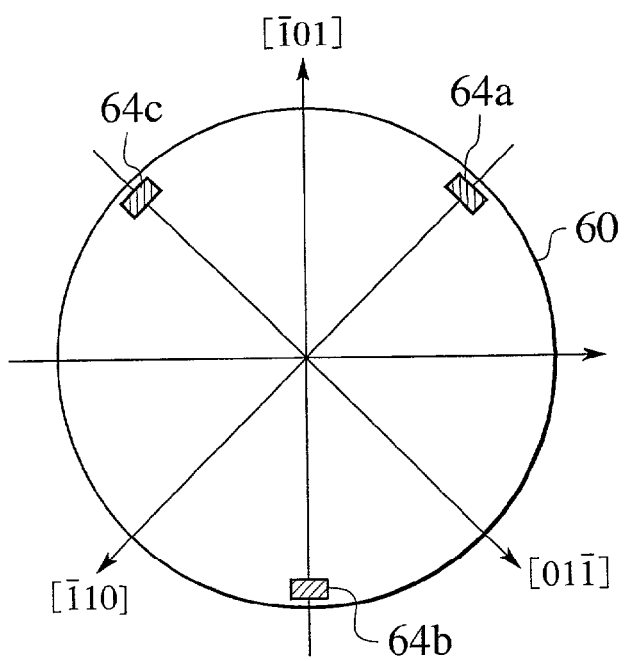
FIG. 26 is a plan view showing a semiconductor wafer having reference ID marks between orthogonal crystal orientation lines according to modification 1 of the fifth embodiment.

In FIG. 25, all of the reference ID marks are formed on the crystal orientation lines. This does not limit the present invention. For example, as shown in FIG. 26, reference ID marks 64a and 64c may be formed between orthogonal orientation lines. In this case, the reference ID marks 64a and 64c contain data indicating positional relationships between the orientation lines and L-shaped guide cells contained in the reference ID marks 64a and 64c.

Modification 2 of Fifth Embodiment

Figure 27:
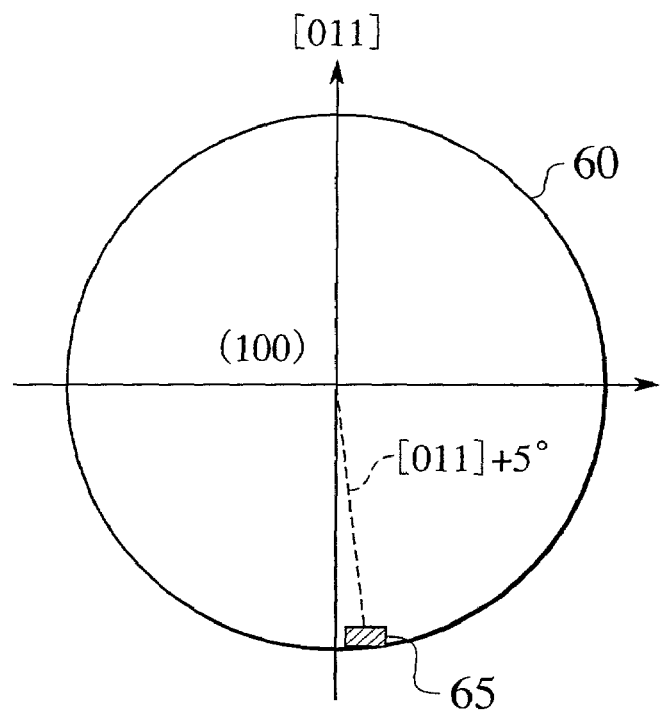
FIG. 27 is a plan view showing a semiconductor wafer according to modification 2 of the fifth embodiment.

In FIG. 27, the wafer 60 has a reference ID mark 65 shifted from a [011] orientation line. The reference ID mark 65 contains data indicating coordinates relative to the [011] orientation line. In this example, the reference ID mark 65 is shifted from the [011] orientation line by 5° in a counterclockwise direction.

Figure 28:
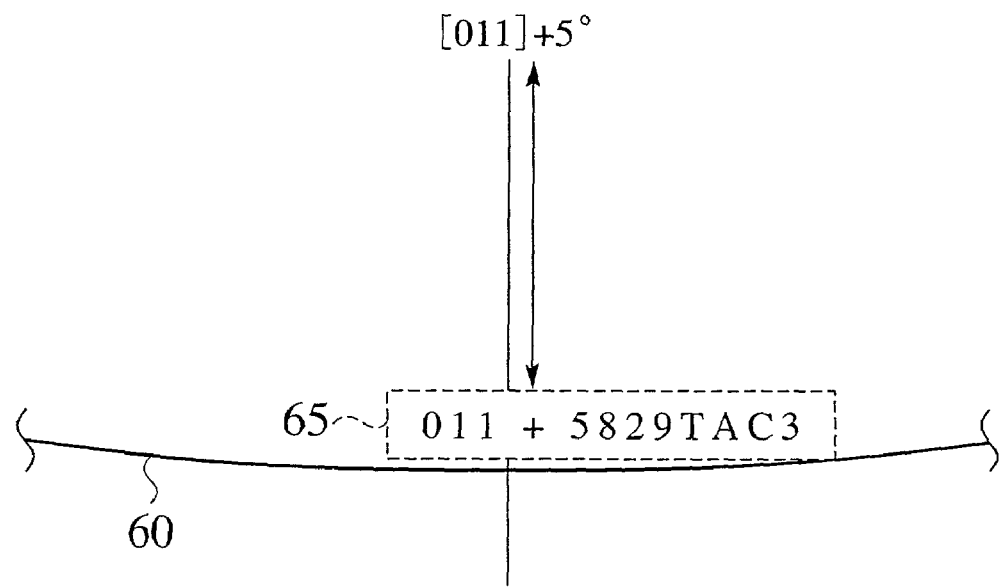
FIG. 28 is an enlarged plan view showing a reference ID mark formed on the periphery of the wafer of FIG. 27.

In FIG. 28, the reference ID mark 65 consists of alphanumeric characters of "011+5829TAC3" in which "011" indicates the [011] orientation line and "+5" indicates that the mark "+" is at a position shifted from the [011] orientation line by 5° in the counterclockwise direction.

Modification 3 of Fifth Embodiment

As in the modification 2 of the second embodiment shown in FIG. 9, modification 3 of the fifth embodiment divides a bevel contour of a wafer into areas in the wafer thickness direction and forms identical reference ID marks in the respective divided areas.

In FIG. 9, the bevel contour 32 of the wafer 31 is divided into the first bevel contour 32a on the first principal face 29 of the wafer 31 and the second bevel contour 32b on the second principal plane 30 of the wafer opposite to the first principal plane 29. Identical reference ID marks 33a and 33b are formed on the first and second bevel contours 32a and 32b, respectively. Namely, the reference ID marks 33a and 33b having the same data are formed on the surface and back of the wafer 31, respectively.

Even if the reference ID mark 33a on the surface 29 of the wafer 31 is erased during a CMP process, the reference ID mark 33b on the back 30 of the wafer 31 will remain for reading. This results in shortening a reference ID mark formation time and a mark reading time, improving productivity.

Modification 4 of Fifth Embodiment

Modification 4 of the fifth embodiment detects X-rays reflected from a wafer, forms a Laue image from the detected X-rays, and measures a crystal orientation line of the wafer according to the Laue image.

In the equipment as shown in FIG. 29, an X-ray detector 82 is on the X-ray incident side (second principal plane side) of a wafer 71 and in parallel with the wafer 71, to detect X-rays 74 reflected by the wafer 71. An X-ray tube 80 has a tungsten (W) target. The X-ray detector 82 has an X-ray image tube and no direct beam stopper. The other parts of the equipment and the effect thereof are substantially the same as those of the equipment of FIG. 20.

Modification 5 of Fifth Embodiment

Modification 5 of the fifth embodiment tilts a mirror of a semiconductor wafer manufacturing equipment to control a reflected laser beam in two axes directions and finely adjust a laser beam spot on a wafer.

Figure 30A:
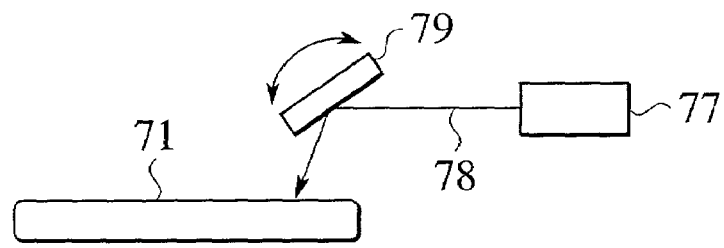
FIGS. 30A, 30B, 31A, and 31B show the operations of a marking unit according to the modification 5 of the fifth embodiment.
Figure 30B:
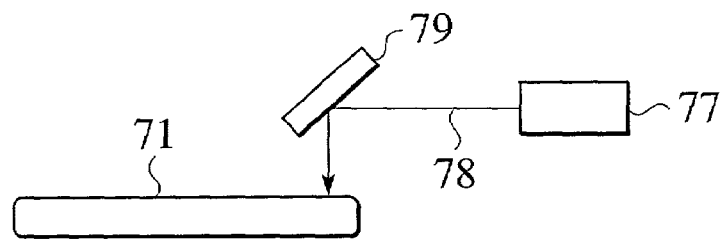

In FIG. 30A and 30B, the mirror 79 of the equipment is tiltable in parallel with a [011] orientation line, to guide a laser beam 78 to a required position away from the edge of a wafer 71. The modification 5 is capable of forming a reference ID mark at a required position on the [011] orientation line. In FIG. 30B, the mirror 79 vertically guides the laser beam 78 to the wafer 71.

Figure 31A:
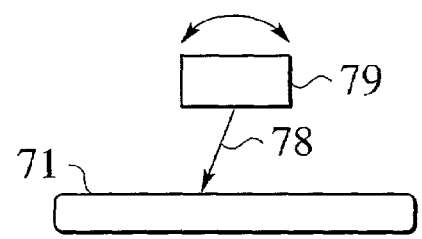
Figure 31B:
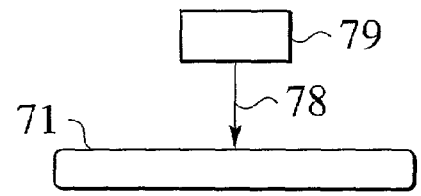

FIGS. 31A and 31B show the mirror 79 and wafer 71 seen from a laser source 77. The mirror 79 is tiltable orthogonally to the [011] orientation line, to guide the laser beam 78 to a required position away from the [011] orientation line. The modification 5 is capable of forming a reference ID mark at a required position on the periphery of the wafer 71. In FIG. 31B, the mirror 79 vertically guides the laser beam 78 to the wafer 71.

Figure 21:
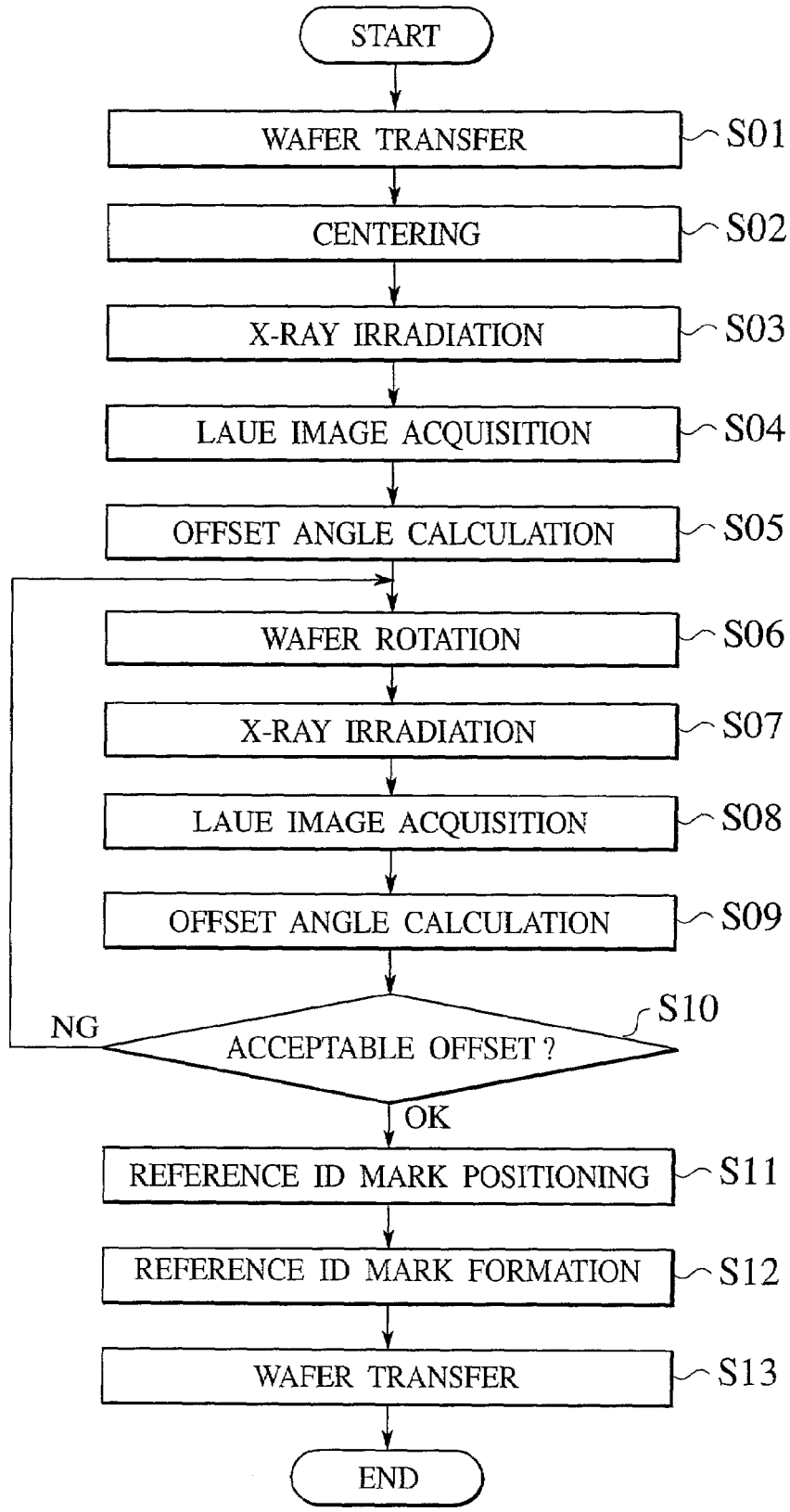
FIG. 21 is a flowchart showing a semiconductor wafer manufacturing method achieved with the equipment of FIG. 20.

In the flowchart of FIG. 21, stage S05 calculates an offset angle, and stage S06 rotates the wafer 71. Thereafter, the modification 5 tilts the mirror 79 in the directions of the two axes to finely adjust the position of a laser beam spot on the wafer 71. It is not necessary for the modification 5 to repeat the stages from stage S06 of wafer rotation to stage S10 of offset detection of FIG. 21. Once stage S08 obtains a Laue image and stage S09 calculates an offset angle, the modification 5 corrects the offset angle by finely controlling the mirror 79.

Modification 6 of Fifth Embodiment

Modification 6 of the fifth embodiment emits a laser beam to a side face of a wafer.

Figure 32:
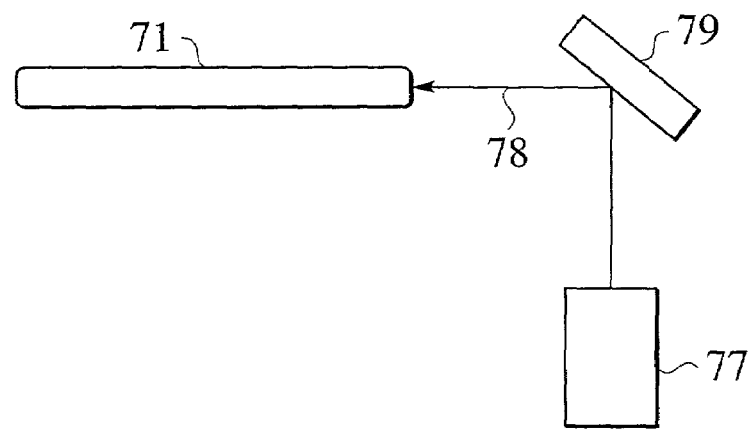
FIG. 32 is a block diagram showing a marking unit of a semiconductor wafer manufacturing equipment according to modification 6 of the fifth embodiment.

In FIG. 32, a laser source 77 emits a laser beam 78 orthogonally to a principal plane of a wafer 71. The laser beam 78 is orthogonally reflected by a mirror 79 and irradiates the side face of the wafer 71.

Figure 33:
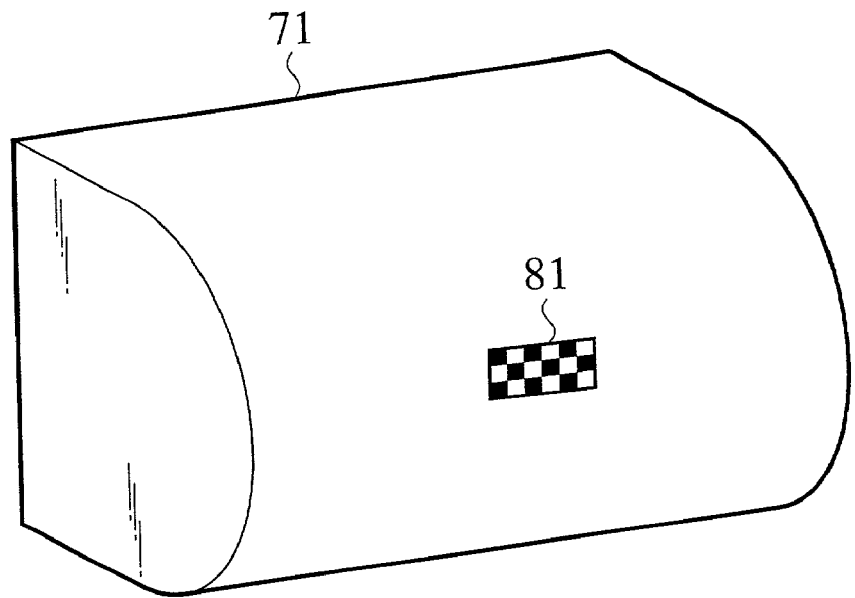
FIG. 33 shows a two-dimensional dot matrix reference ID mark formed by the marking unit of FIG. 32 on the side face of a wafer.
Figure 34:
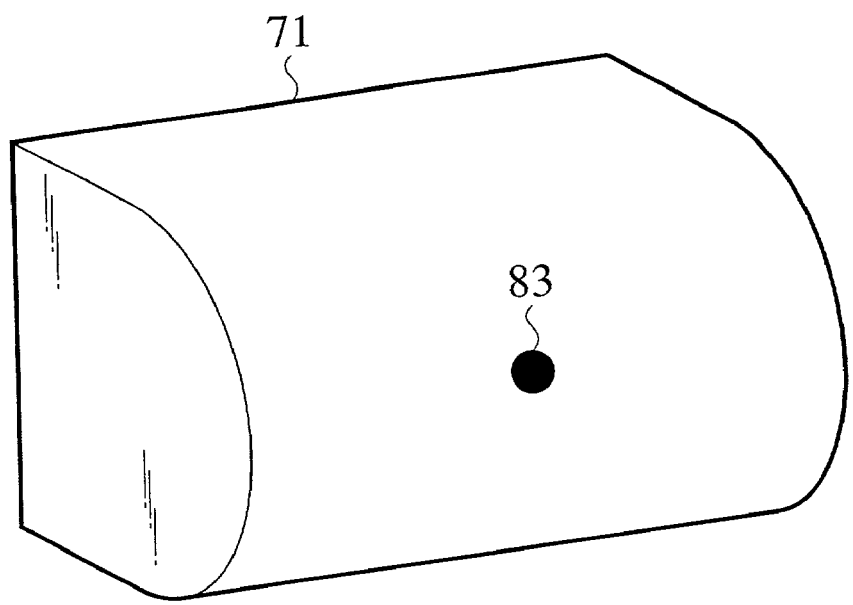
FIG. 34 shows a recessed reference ID mark formed by the marking unit of FIG. 32 on the side face of a wafer.

FIGS. 33 and 34 show examples of reference ID marks formed on the wafer 71 by the marking unit of FIG. 32. In FIG. 33, the reference ID mark is a two-dimensional matrix of dots. In FIG. 34, the reference ID mark is a simple recess.

The fifth embodiment and its modifications employ Mo or W as an X-ray-tube target. This does not limit the present invention. The target may be copper (Cu). The X-ray detector of the fifth embodiment consists of a fluorescent screen and an X-ray image tube. This does not limit the present invention. The X-ray detector may be made of an X-ray CCD camera, a position sensitive proportional counter (PSPC), and a channel plate. The fifth embodiment uses a laser marker to form a reference ID mark on a wafer. This does not limit the present invention. Any other equipment is employable to form a reference ID mark on a wafer. The reference ID mark may be a two-dimensional matrix of dots, a simple recess, alphanumeric characters, a bar code, functioning to specify a crystal orientation line of the wafer.

Sixth Embodiment

Figure 38:
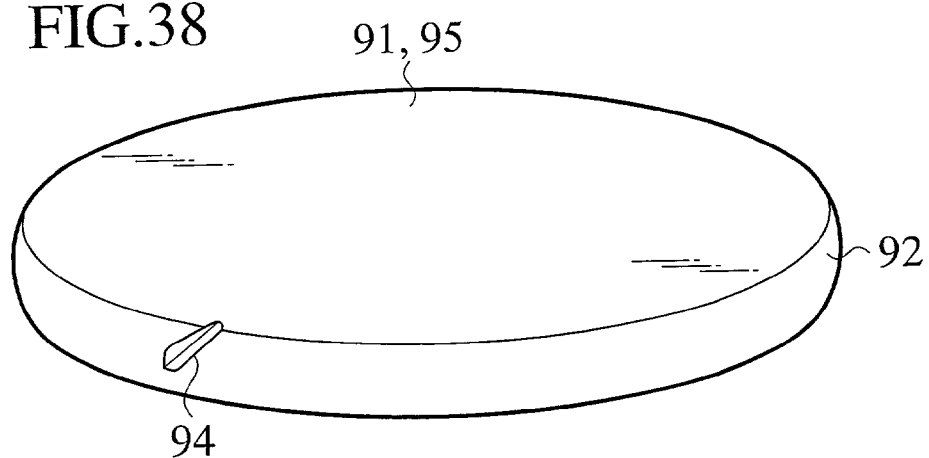
FIG. 38 is a perspective view showing a wafer having an orientation determining area made according to the method of FIG. 36.

In FIG. 38, the semiconductor wafer 91 according to the sixth embodiment has a circular first principal plane 95 on which semiconductor device is formed, a bevel contour 92 formed on the periphery of the wafer 91, a recess 94 formed on the bevel contour 92 and having a bottom inclined with respect to the first principal plane 95, an etch pit formed on the bottom of the recess 94 and remaining after a polishing process carried out on the wafer 91, and a reference ID mark formed on the bevel contour 92 to indicate a crystal orientation line of the wafer 91. The etch pit is surrounded by second-orientation crystal faces that are different from the first-orientation crystal faces exposed at the first principal plane 95 of the wafer 91. Here, the first-orientation crystal faces are each a (100) crystal face, and the second-orientation crystal faces include a (111) crystal face and other crystal faces equivalent to the (111) crystal face. The first- and second-orientation crystal faces are not limited to these and may be other crystal faces.

Figure 35:
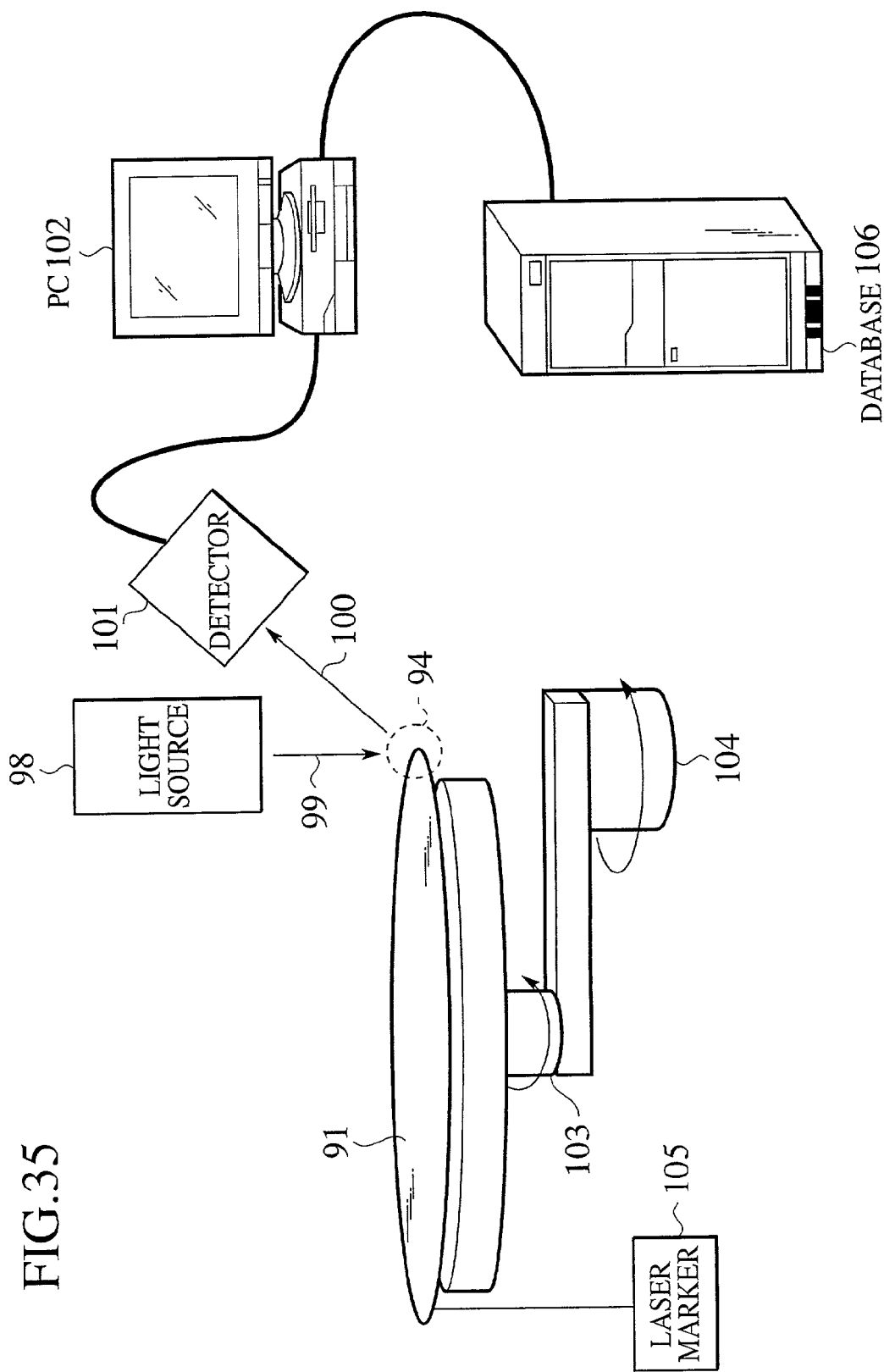
FIG. 35 is a block diagram showing an equipment for measuring and evaluating the rotation angle dependence of the intensity of reflected light from an etch pit formed on a wafer and forming an orientation mark on the wafer, according to the sixth embodiment.

In FIG. 35, the equipment for manufacturing the wafer 91 according to the sixth embodiment has a wafer stage to hold the wafer 91, a first rotary unit 103 to rotate the wafer stage around the center of the wafer 91, a light source 98 to emit light 99 toward the recess 94, a detector 101 to detect scattered light (reflected light) 100 from the etch pit 97, a second rotary unit 104 to rotate the wafer stage around the recess 94, a computer (PC) 102 to evaluate the rotation angle dependence of the scattered light 100 detected by the detector 101, a database 106 to store the rotation angle dependence of the intensity of scattered light from the etch pits on the whole circumferential area of the wafer 91, and a laser marker 105 to form a reference ID mark on the periphery of the back of the wafer 91.

The light source 98, detector 101, second rotary unit 104, PC 102, and database 106 form an orientation measuring unit. The laser marker 105 forms a marking unit. In this example, the light 99 emitted toward the recess 94 is a white light whose range is narrowed to within 1 mm$^2$ or smaller.

A method of manufacturing a semiconductor wafer according to the sixth embodiment of the present invention will be explained with reference to FIG. 36. The sixth embodiment anisotropically etches a semiconductor wafer to form etch pits on the wafer, detects scattered light from the etch pits, and determines a crystal orientation of the wafer according to the detected light.

(1) In stage S21, a monocrystalline ingot (a boron-doped, p-type monocrystalline ingot having a specific resistance of 5 to 10 Ωcm) is lifted. Stage S23 carries out a block process on the ingot, and stage S24 slices the ingot into wafers. No crystal orientation measurement is carried out on the ingot, and no orientation flats or notches are formed on the wafers. A principal plane of each wafer exposes (100) crystal faces.

(2) Stage S25 chamfers the edge of each wafer to form a bevel contour. Stage S26 forms a recess 94 serving as an orientation determining area on the bevel contour 92 as shown in FIG. 38.

Figure 37:
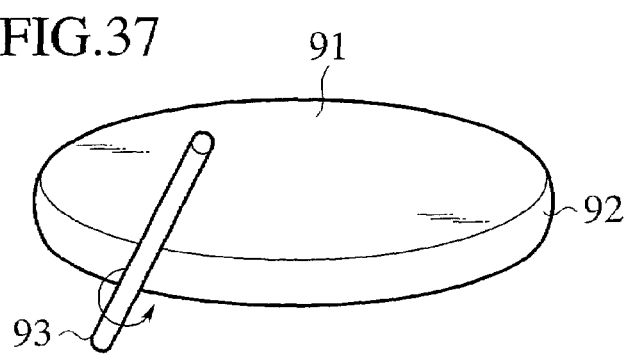
FIG. 37 is a perspective view showing a wafer on which an orientation determining area is formed according to the method of FIG. 36.
Figure 39A:
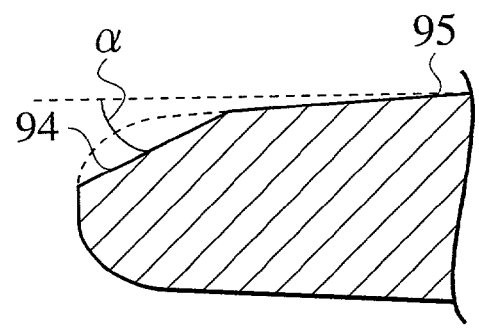
FIGS. 39A and 39B are sectional and plan views showing the orientation determining area of FIG. 38.
Figure 39B:
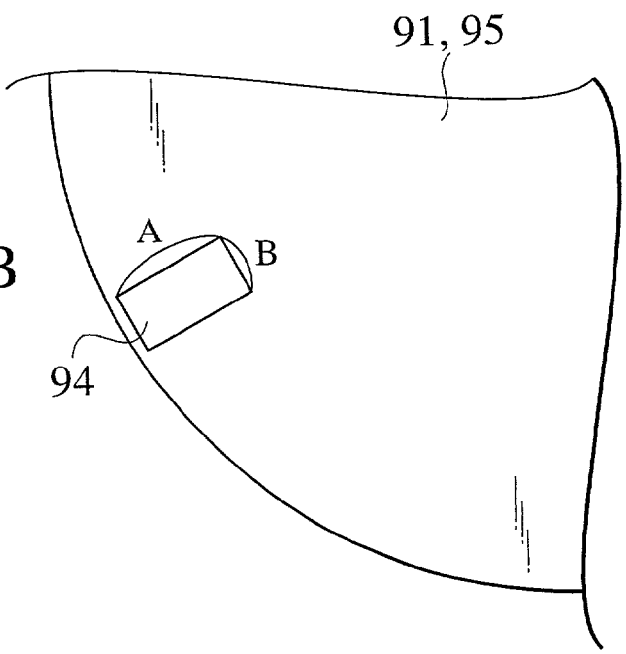

Forming the recess 94 will be explained with reference to FIG. 37. A jig bar 93 is rotated and pressed against a part of the bevel contour 92, to cut a part of the bevel contour 92. The cut part on the bevel contour 92 is the recess 94 as shown in FIG. 38. In FIG. 39A, the bottom of the recess 94 is inclined with respect to the first principal plane 95 of the wafer 91 on which semiconductor device is formed. The inclination angle a of the bottom of the recess 94 is in the range of 20° to 60°. In FIG. 39B, the sizes A×B of the recess 94 are, for example, 0.3 mm×0.2 mm. The recess 94 may be formed on the back or side of the wafer 91.

(3) Stage S27 laps the wafer 91. Stage S28 removes undulation on the first principal plane 95 of the wafer 91, to highly flatten the first principal plane 95. To achieve this, stage S28 carries out anisotropic etching with an alkali solution on the wafer 91. The anisotropic etching involves different etching speeds depending on the crystal orientations of the wafer 91. The alkali solution may be a KOH solution or an NaOH solution. For example, a 20% NaOH solution is employed at 85 to 90° C. to etch the first principal plane 95 for 8 minutes.

Figure 40A:
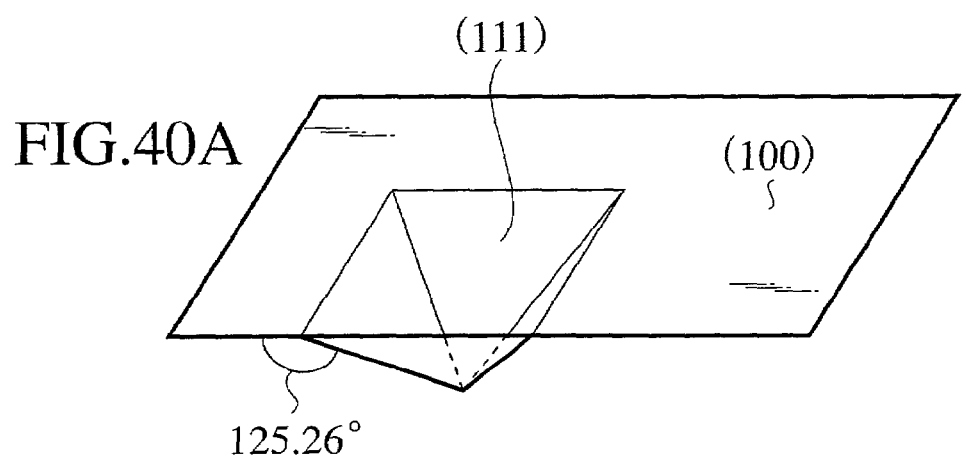
FIGS. 40A and 40B are perspective and plan views showing an etch pit formed in a (100) crystal face and defined by second-orientation crystal faces including a (111) crystal face and equivalent crystal faces.
Figure 40B:
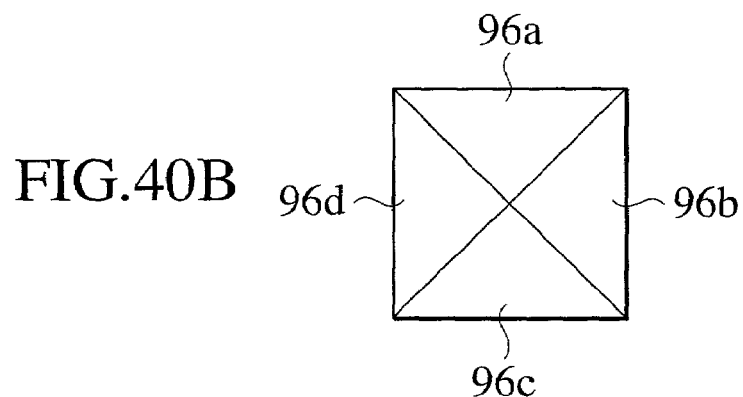

In FIG. 40A, the anisotropic etching forms etch pits on the first principal plane 95 where the (100) crystal faces are exposed. Each of the etch pits are defined by the second-orientation crystal faces including the (111) crystal face. Each line defined by the intersecting second-orientation crystal faces forms an angle of 125.26° with respect to the (100) crystal faces. In FIG. 40B, each etch pit in the (100) crystal faces has a point symmetric shape, and the second-orientation crystal faces 96a to 96d have substantially the same shape.

Figure 41:
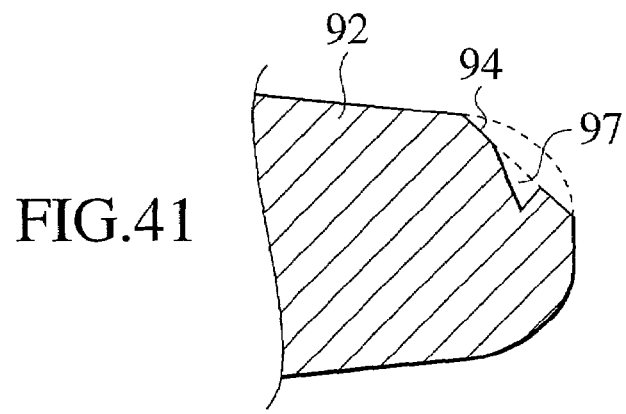
FIG. 41 is a sectional view showing an etch pit formed on the bottom of the orientation determining area of FIG. 38.

In FIG. 41, the etch pits 97 are formed not only on the first principal plane 95 but also on the bevel contour 92 and the bottom of the recess 94. The bottom of the recess 94 is inclined with respect to the (100) crystal faces, and therefore, the etch pit 97 on the bottom of the recess 94 is not of a point symmetric shape.

(4) Stage S30 polishes the bevel contour 92 of the wafer 91. Stage S31 employs a double-face polishing machine to polish the first and second principal planes of the wafer 91. The etch pit 97 on the bottom of the recess 94 remains after the polishing of the bevel contour 92. The bevel contour polishing of stage S30 and the wafer polishing of stage S31 erase the etch pits on the first and second principal plains and bevel contour 92. However, the bottom of the recess 94 is not polished, and therefore, the etch pit 97 on the bottom of the recess 94 remains.

(5) Stage S32 employs an equipment of FIG. 35 to provide the wafer 91 with orientation data.

The wafer 91 is fixed on the wafer stage. The first rotary unit 103 is rotated. When the recess 94 on the bevel contour of the wafer 91 is irradiated with the white light 99 from the light source 98, the first rotary unit 103 stops rotations. The white light 99 irradiates the etch pit 97 in the recess 94. The second rotary unit 104 is rotated, and the detector 101 detects the intensity of scattered light from the etch pit 97. The second rotary unit 104 rotates the first rotary unit 103, wafer stage, and wafer 91 around the recess 94, to evaluate the rotation angle dependence of the intensity of scattered light from the second-orientation crystal faces of the etch pit 97. Namely, data related to the rotation angle dependence of the intensity of scattered light is collected with respect to the rotation angles of the second rotary unit 104.

Figure 42:
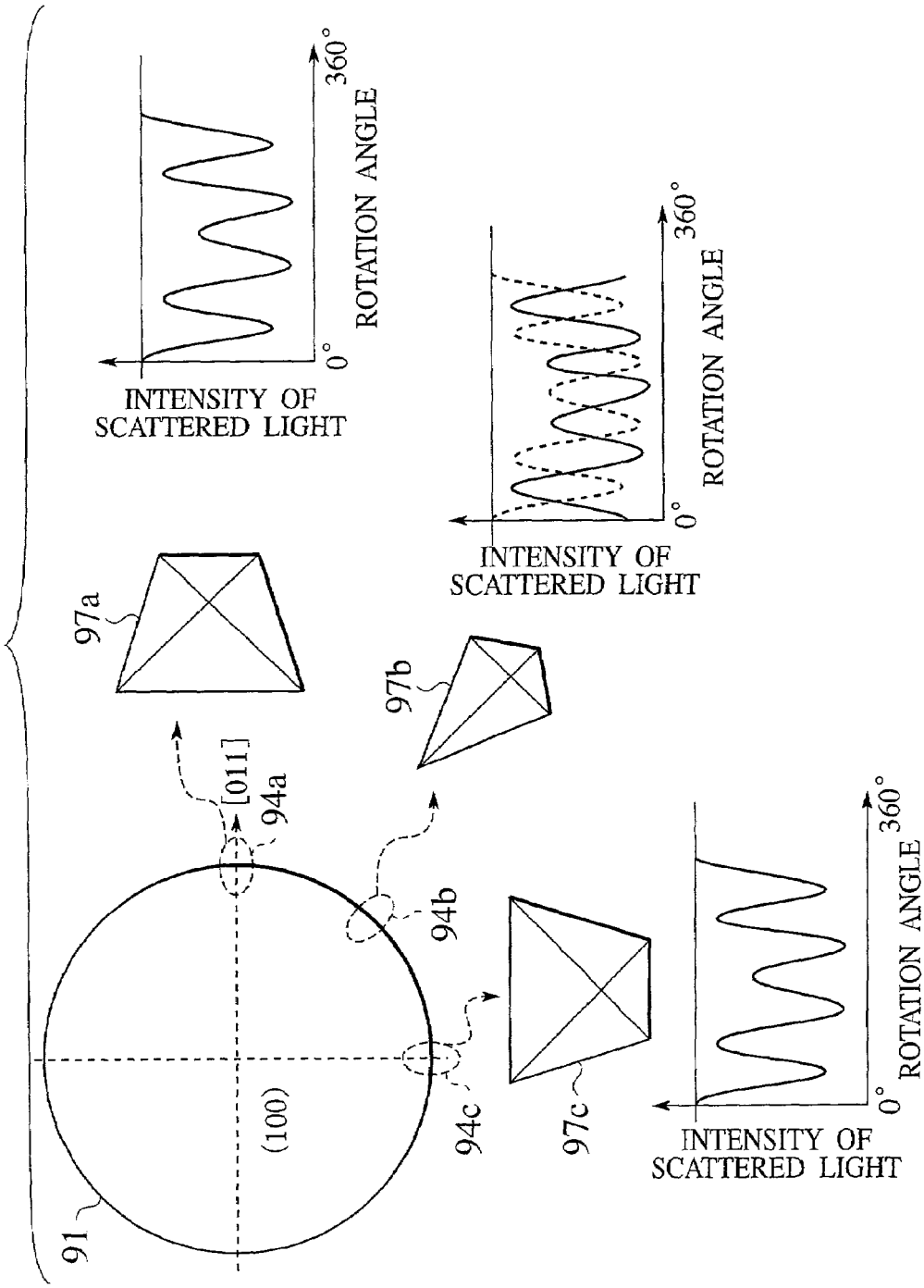
FIG. 42 shows orientation determining areas formed at different locations on a wafer, the shapes of etch pits formed in the orientation determining areas, and the intensity profiles of scattered light from the etch pits.

The bottom of the recess 94 is inclined with respect to the (100) crystal faces, and therefore, the location of the recess 94 on the bevel contour 92 of the wafer 91 determines the shape of the etch pit 97 on the bottom of the recess 94. In FIG. 42, recesses 94a to 94c are formed at different locations on the bevel contour of the wafer 91, and etch pits 97a to 97c are formed on the bottoms of the recesses 94a to 94c, respectively. The shapes of the etch pits 97a to 97c are determined by the locations of the recesses 94a to 94c. Namely, the rotation angle dependence of the intensity of scattered light from an etch pit provides a specific profile corresponding to the shape of the etch pit.

(6) The data representing the rotation angle dependence is compared with the data stored in the database 106, to determine the crystal orientation of the recess 94. The database 106 stores the rotation angle dependence of each of the etch pits formed on the entire circumferential area of the wafer 91. The data in the database 106 is prepared in advance through tests or simulations.

A profile of the detected rotation angle dependence is compared with the data stored in the database 106, and a profile proximal to the detected profile is retrieved from the database 106. A crystal orientation related to the retrieved profile is determined as the crystal orientation of the recess 94. According to the sixth embodiment, the inclination angle of the bottom of each recess formed in the tests or simulations is equal to the inclination angle of the bottom of the recess 94 formed in stage S26.

(7) According to the determined crystal orientation of the recess 94, a reference ID mark indicating a crystal orientation of the wafer 91 is formed on the back of the bevel contour 92 of the wafer 91. Namely, the reference ID mark is formed on the face opposite to the face where the recess 94 is made. The reference ID mark is made by the laser marker 105 having, for example, a YAG high-output laser. The reference ID mark may be formed on the surface of the wafer 91, or the surface of the bevel contour 92 of the wafer 91.

(8) Stage S34 finds the crystal orientation of the wafer 91 according to the reference ID mark and carries out, for example, a first lithography process involving an exposing process.

The sixth embodiment employs a circular semiconductor wafer having no notch or orientation flat and forms a recess serving as an orientation determining area before carrying out an anisotropic etching process in stage S28 and polishing process in stages S30 and S31. Even after the polishing process, an etch pit remains in the recess to scatter light, the scattered light providing crystal orientation data. According to the crystal orientation data, a reference ID mark indicating the crystal orientation of the wafer is formed on the wafer.

An X-ray diffraction technique to find the crystal orientation of a wafer needs several minutes to several tens of minutes per wafer, thus decreasing productivity. To meet the current manufacturing cost of semiconductor device, it is necessary to find the crystal orientation of each wafer in about one minute. The X-ray diffraction technique is prohibited from employing a strong X-ray source which would shorten processing time because the strong X-ray source is hazardous to workers and consumes large quantities of power. On the other hand, the sixth embodiment detects the crystal orientation of a wafer with the use of visible light, increasing detection speed. The sixth embodiment is capable of processing one wafer in a minute. Compared with X-rays, light causes no hazard to workers and consumes little power. The sixth embodiment is capable of safe, precise, and speedy determination of the crystal orientation of a wafer.

Figure 43:
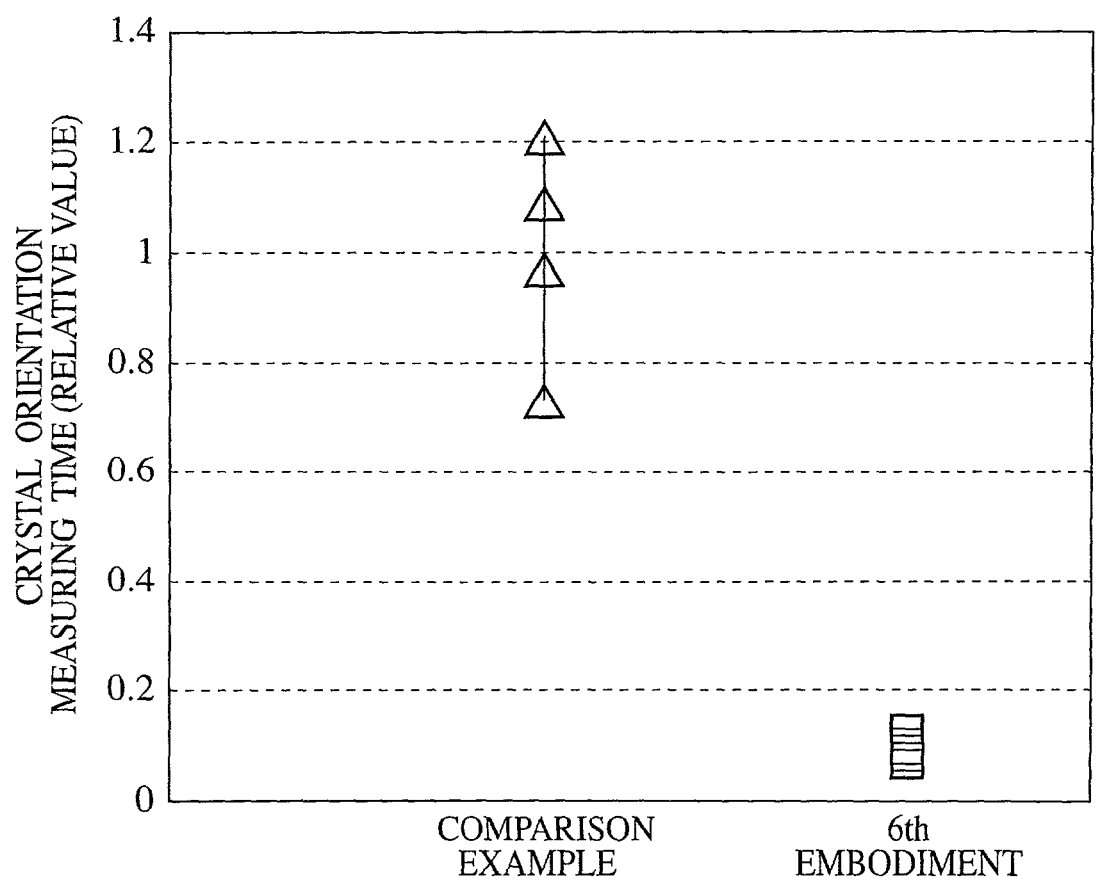
FIG. 43 is a graph showing the measuring time for finding crystal orientation according to the sixth embodiment and a comparison example.

In FIG. 43, compared with the X-ray diffraction technique, the sixth embodiment shortens the time to between ⅕ and ⅒. When applied to DRAM manufacturing, the sixth embodiment is effective in improving the yield of DRAMs.

Figure 36:
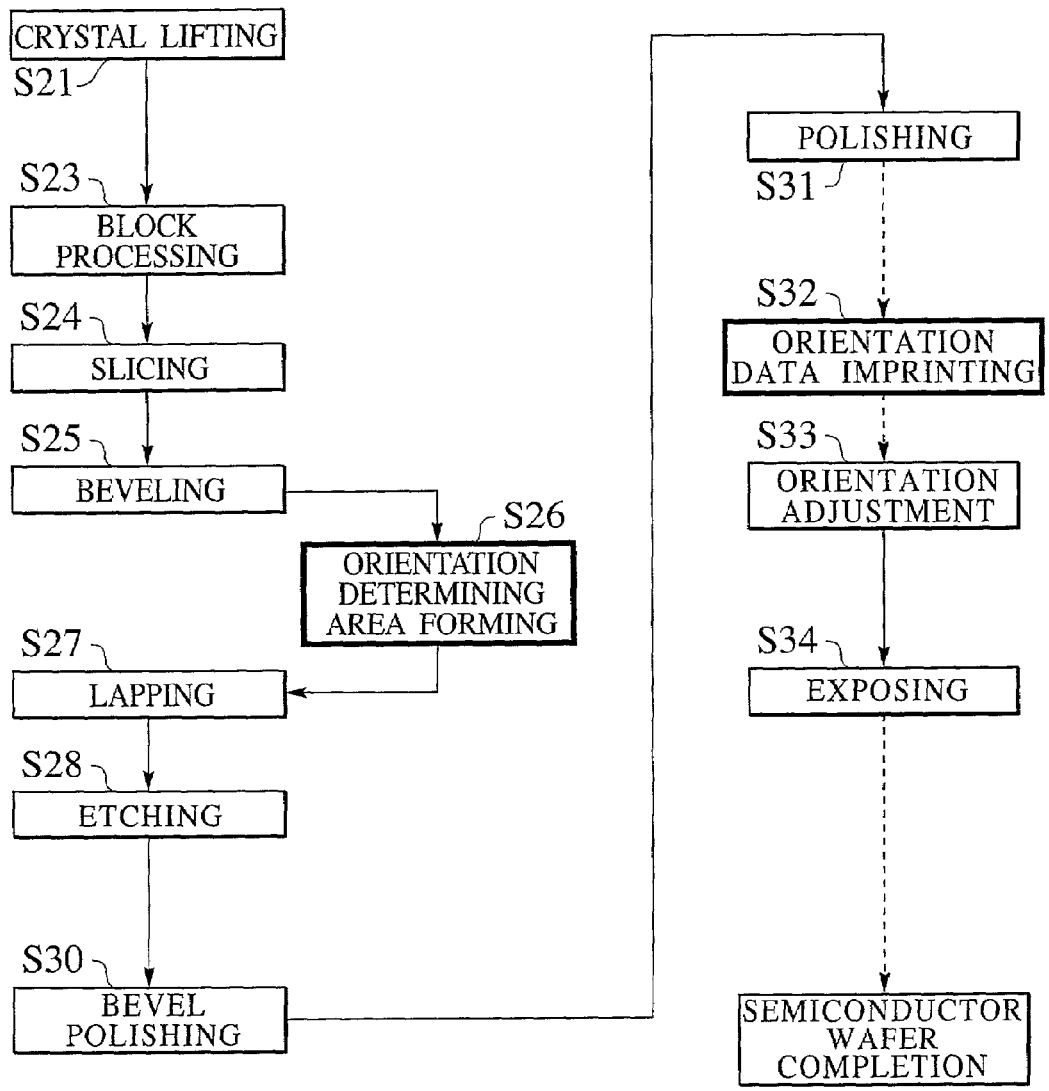
FIG. 36 is a flowchart showing a semiconductor wafer manufacturing method according to an sixth embodiment of the present invention.

The alkali etching process in stage S28 of FIG. 36 forms etch pits on the whole surface of a wafer. The sixth embodiment may use these etch pits to find a crystal orientation on the wafer and make an ID mark on the wafer to indicate the crystal orientation. In this case, the ID mark must have a depth of 10 μm or deeper so that the mark will not be erased by the polishing processes carried out in stages S30 and S31.

According to the sixth embodiment, a soft laser mark of 10 μm or shallower is sufficient. The mark may be formed on a wafer when the wafer's crystal orientation is adjusted in a first exposing process in a semiconductor device manufacturing line.

According to the sixth embodiment, an ID mark forming location on a bevel contour of a wafer may have a different shape from the other part of the bevel contour, improving the accuracy of ID mark formation and reading at the location.

Modification 1 of Sixth Embodiment

Modification 1 of the sixth embodiment collectively measures the intensity of reflected light from an etch pit on a wafer without rotating the wafer.

Figure 44:
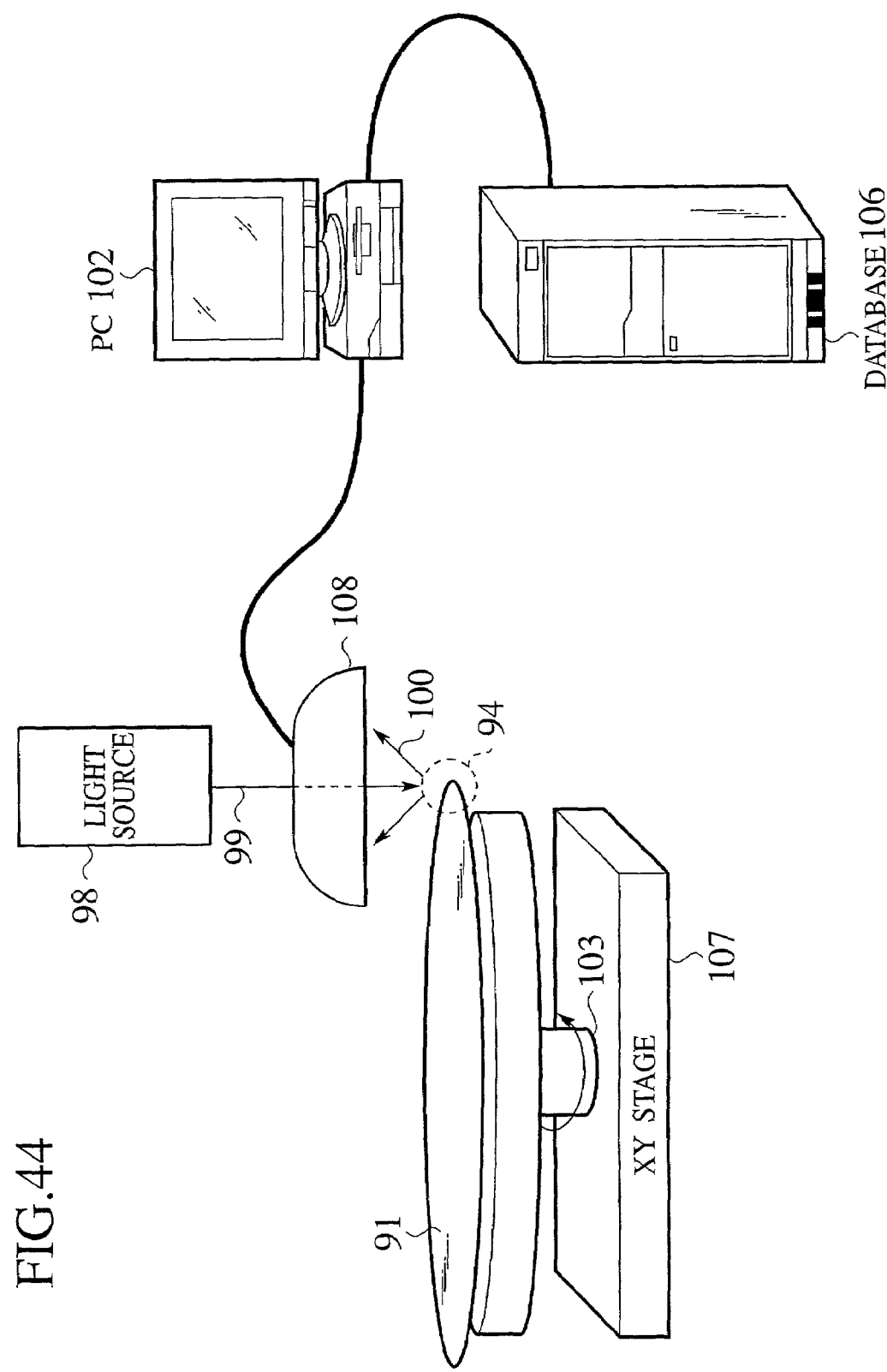
FIG. 44 is a block diagram showing a semiconductor wafer manufacturing equipment according to modification 1 of the sixth embodiment.

In FIG. 44, the equipment according to the modification 1 of the sixth embodiment has a detector 108 to detect the intensity of light 100 reflected by second-orientation crystal faces that define an etch pit. The etch pit may be the one shown in FIG. 40A. The detector 108 has a detecting face that surrounds white light 99 emitted from a light source 98, to collectively detect the reflected light 100 from the etch pit.

The detecting face of the detector 108 is spherical and has a center hole allowing the white light 99 to pass from the light source 98, for effective detection of the light 100 reflected by the etch pit. It is not necessary to turn a wafer 91 around a recess 94 having the etch pit. The equipment of FIG. 44 is provided with a first rotary unit 103 and an XY stage 107 and has no second rotary unit 104 of FIG. 35. The other parts of the equipment of FIG. 44 are the same as those of FIG. 35, and therefore, are not explained further.

In FIG. 44, the wafer 91 is set on a wafer stage and is rotated by the first rotary unit 103. The bevel contour of the wafer 91 has the recess 94 serving as an orientation determining area onto which the white light 99 is emitted from the light source 98. At this time, the first rotary unit 103 is stopped. The white light 99 irradiates the etch pit in the recess 94. The detector 108 collectively detects the intensity of light scattered by the etch pit. At this time, the first rotary unit 103, wafer stage, and wafer 91 are stopped.

The modification 1 of the sixth embodiment provides the same effect as the sixth embodiment. The detector 108 wholly covers the recess 94, to collectively detect the light 100 scattered by the etch pit in all directions without rotating the wafer 91. This shortens the time required to acquire data related to the rotation angle dependence of the scattered light.

Modification 2 of Sixth Embodiment

The sixth embodiment and the modification 1 thereof detect the rotation angle dependence of the intensity of scattered light from an etch pit in a recess on a wafer through the detector (101, 108), compare a profile of the rotation angle dependence with profiles stored in a database (106), and determine the crystal orientation of the recess.

The bottom of the recess is inclined with respect to a first principal plane of the wafer, and the shape of the etch pit in the recess is determined by the location of the recess on the periphery of the wafer. In FIG. 42, the recesses 94a to 94c formed at different locations on the wafer 91 have the individually shaped etch pits 97a to 97c respectively.

Modification 2 of the sixth embodiment detects the shape of an etch pit (97a to 97c) on the bottom of a recess (94a to 94c) serving as an orientation determination area, compares the detected etch pit shape with reference to etch pit shapes stored in a database, and determines the crystal orientation of the recess.

A semiconductor wafer manufacturing equipment according to modification 2 of the sixth embodiment has a shape measuring unit instead of the detector (101, 108) of the equipment of FIGS. 35 and 44. The shape measuring unit measures the shape of an etch pit on the bottom of a recess serving as an orientation determination area. The shape measuring unit may include a CCD camera or a photosensitive camera. The shape of an etch pit to be measured is a plan shape as shown in FIG. 42, and the etch pit may be formed on a first principal plane of a wafer or on the bottom of a recess.

The semiconductor wafer manufacturing equipment of the modification 2 is similar to that of FIG. 44 and has a first rotary unit 103 and an XY stage 107. The other parts of the equipment are the same as those of FIG. 44, and therefore, are not explained further.

The database 106 stores the plan shapes of etch pits on the whole circumferential face of the wafer 91. The data stored in the database 106 are prepared in advance through tests or simulations.

The first rotary unit 103 is driven, and white light 99 is emitted to the recess 94. The plan shape of the etch pit 97 on the bottom of the recess 94 is detected with, for example, a CCD camera. Two-dimensional image data representing the plan shape is transferred to a computer (PC) 102. The PC 102 compares the image data with data stored in the database 106 and determines the crystal orientation of the recess 94 according to the results of the comparison.

More precisely, the PC 102 compares the detected plan shape of the etch pit 97 with the reference etch pit plan shapes stored in the database 106, retrieves a proximate one among the reference etch pit plan shapes, and finds a crystal orientation corresponding to the proximate plan shape. The inclination angle of the bottom of each recess used for the tests or simulations to accumulate data in the database 106 is equal to the inclination angle of the bottom of the recess 94 formed on the target wafer 91.

The modification 2 of the sixth embodiment provides the same effect as the sixth embodiment. The modification 2 compares a detected etch pit plan shape with reference etch pit plan shapes without needing to find a profile indicating the rotation angle dependence of the intensity of scattered light. Namely, the modification 2 does not require rotation of the wafer 91 or the detection of light scattered by an etch pit.

Seventh Embodiment

The Seventh embodiment of the present invention provides a method of and an equipment for detecting the crystal orientation of a semiconductor wafer. To detect the crystal orientation, the seventh embodiment use crystal defects on or in the wafer.

Figure 45:
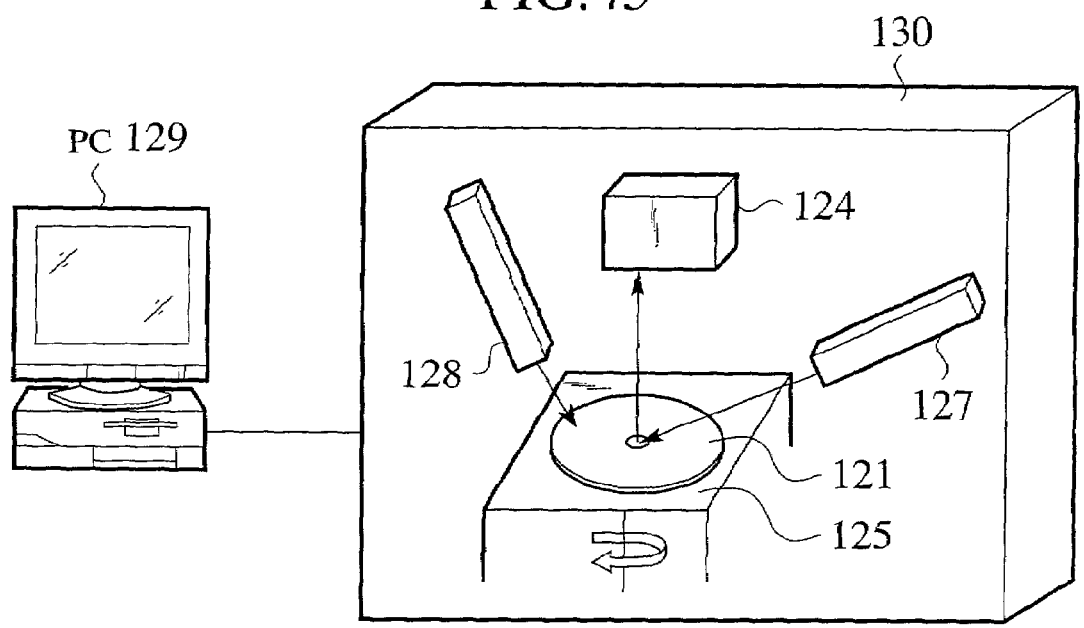
FIG. 45 is a perspective view showing the semiconductor wafer manufacturing equipment of the seventh embodiment.

In FIG. 45, the equipment has an infrared laser source 127, a wafer stage 125 having a rotary mechanism, a scattered light detector 124, a laser marker 128 having a marking mechanism to carry out a numbering operation, a chamber 130 to cover the equipment, and a computer (PC) 129 to analyze the rotation angle dependence of the intensity of scattered light.

The laser source 127 emits an infrared laser beam, which obliquely irradiates the rotation center of the first principal plane of the wafer 121 on the wafer stage 125. The detector 124 is arranged above the first principal plane of the wafer 121, to detect the intensity of laser beam scattered by crystal defects in the wafer 121.

The chamber 130 covers the wafer stage 125, laser source 127, detector 124, laser marker 128, and wafer 121 and blocks external infrared light. The PC 129 has software to analyze data related to the rotation angle dependence of the intensity of scattered light. The laser marker 128 emits a laser beam that focuses on the periphery of the wafer 121 to melt a spot on the wafer 121. The molten wafer recrystallizes to form a small dot of, for example, 5 μm in size and 0.5 μm in height. The laser marker 128 may employ an He—Ne laser having Gaussian energy distribution.

Figure 46:
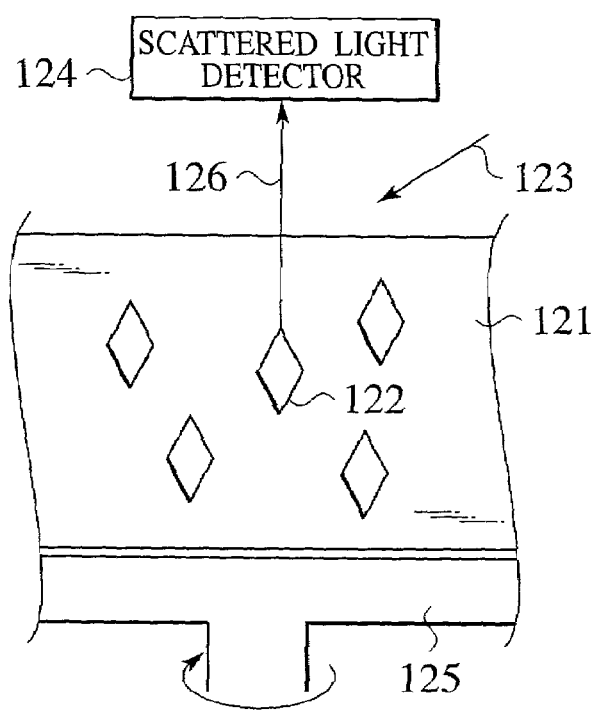
FIG. 46 explains the principle of a semiconductor wafer manufacturing equipment according to a seventh embodiment of the present invention.

FIG. 46 is a sectional view partly showing a semiconductor wafer. In FIG. 46, the wafer 121 contains crystal defects 122 such as crystal originated particles (COPs) or bulk microdefect (BMDs). An infrared beam 123 is obliquely made incident to a first principal plane of the wafer 121. The infrared beam 123 may be an infrared laser beam. Part of the infrared beam 123 penetrates the wafer 121 and is scattered by specific crystal orientation faces of the crystal defects 122. The scattered infrared light is detected by a detector 124 set above the first principal plane of the wafer 121.

The wafer 121 is set on a wafer stage 125 having a rotary mechanism. The infrared light 123 is emitted toward the rotation center of the wafer 121. The wafer 121 is continuously rotated, and the intensity of the scattered light 126 from the crystal defects 122 at the rotation center is continuously detected. The intensity of the scattered light periodically changes. Namely, the detected intensity of the scattered light has rotation angle dependence. According to a profile of the intensity of the scattered light, it is possible to determine the crystal orientation of the wafer 121.

The infrared beam 123 may be an infrared laser beam of 1000 nm in wavelength. In this case, the depth of the wafer 121, which the infrared laser beam 123 can reach, is about 50 μm from the first principal plane of the wafer 121. Accordingly, crystal defects up to a depth of about 50 μm from the first principal plane are detectable.

Figure 47A:
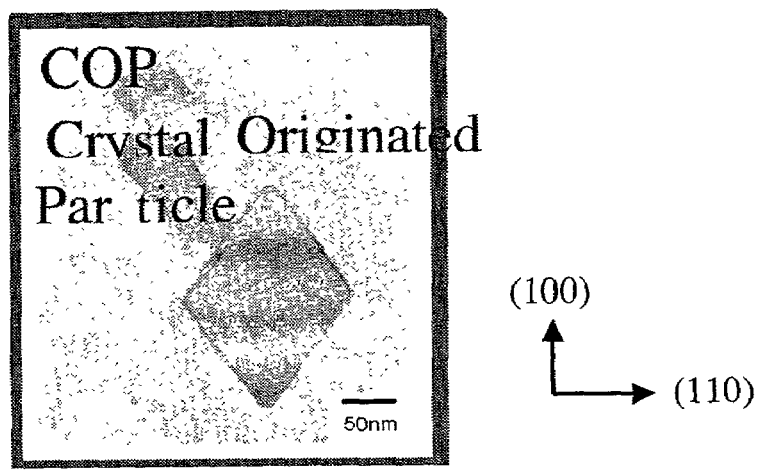
FIG. 47A is a microscopic image showing a crystal defect called COP (crystal originated particle)
Figure 47B:
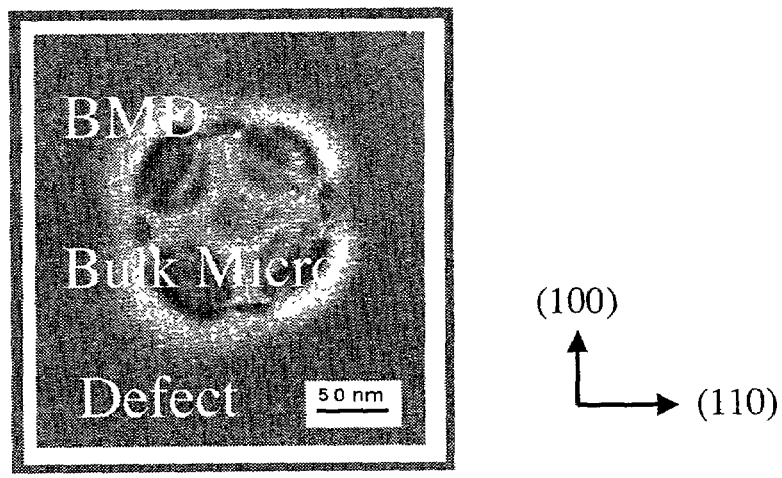
FIG. 47B is a microscopic image showing a crystal defect called BMD (bulk microdefect)

The crystal defect shown in FIG. 47A is a COP, and the crystal defect shown in FIG. 47B is a BMD.

When detecting the crystal orientation of a wafer manufactured by Czochralski (CZ) method or epitaxial growth method, the seventh embodiment relies on COPs.

When detecting a crystal orientation of a wafer manufactured by annealing or IG heat treatment, the seventh embodiment relies on BMDs. A BMD has a structure of six to eight faces, and a COP has an octahedral structure. COPs and BMDs are crystal defects in which specific crystal orientation faces including a (111) crystal face are exposed. As in the fifth embodiment, the intensity of light scattered by the crystal orientation faces of the COP or BMD has rotation angle dependence.

A method of detecting the crystal orientation of a semiconductor wafer according to the seventh embodiment of the present invention will be explained with reference to FIG. 48.

(1) The wafer 121 is set on the wafer stage 125. The wafer 121 may be a circular CZ wafer having no notch or orientation flat. On the first principal plane of the wafer 121, (100) crystal faces are exposed. The wafer 121 has, for example, a specific resistance of 10 to 20 Ω·cm and an oxygen concentration [Oi] of 12 to $14 \times 10^{17}$ atoms/cm$^3$ (old ASTM).

(2) In FIG. 48, stage S40 drives the rotary mechanism of the wafer stage 125 to rotate the wafer 121. The infrared laser source 127 obliquely emits an infrared laser beam to the first principal plane of the wafer 121. Stage S41 operates the detector 124 to continuously measure the intensity of scattered laser beam from crystal defects in the wafer 121. Preferably, stages S40 and S41 are carried out in parallel, and any one of them can be started first. Namely, any one of the rotary mechanism and detector 124 can be started first.

Figure 49:
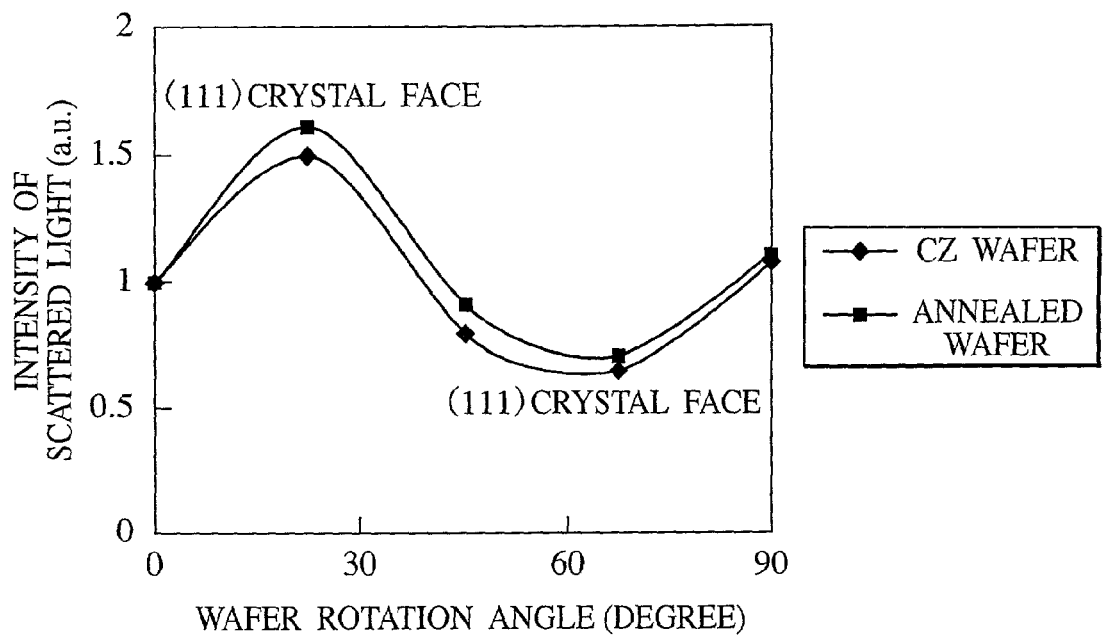
FIG. 49 is a graph showing the rotation angle dependence of the intensity of scattered light measured on a CZ wafer and an annealed wafer.

(3) In stage S42, the PC 129 analyzes data concerning the rotation angle dependence of the intensity of scattered laser beam. Stage S43 determines the crystal orientation of the wafer 121. More precisely, profiles as shown in FIG. 49 represent changes in the intensity of scattered laser beam with respect to various rotation angles of the wafer 121. The PC 129 analyzes the profiles. In FIG. 49, a curve with rhombuses is a COP profile actually measured on a CZ wafer according to the method of the seventh embodiment. The rotation angle dependence of the intensity of scattered light is periodic and sinusoidal. At a rotation angle of the wafer 121 corresponding to a maximal or minimal value on the profile, a (111) crystal face of the COP just faces the laser beam.

Although not shown, an actual COP profile was measured on an epitaxial wafer, and the results of the measurement resembled the profile of the CZ wafer. The epitaxial wafer had an epitaxial layer having a specific resistance ρVG of 10 to 20 Ω·cm and a thickness tVG of 3 μm. The epitaxial wafer was a p/p-type wafer having no notch. On a first principal plane of the epitaxial wafer, (100) crystal faces were exposed.

When the wafer 121 is rotated, the wafer stage 125 may vibrate, causing noise. In this case, the rotation of the wafer 121 may be stopped, thus reducing measuring points. Reducing measuring points may deteriorate measuring accuracy. Even from a small number of measuring points, the software of the PC 129 can approximate a sine curve and analyze the sine curve to correctly determine the crystal orientation.

(4) The wafer stage 125 is again rotated, and a [011] line of the wafer 121 is aligned with a laser spot of the laser marker 128. In stage S44, the laser marker 128 is operated to form a reference ID mark on the periphery of the wafer 121. The reference ID mark indicates the crystal orientation of the wafer 121. The location on the wafer 121, where the reference ID mark is formed, may be 2 mm away from the edge of the wafer 121. The reference ID mark may be formed to a size of 3 mm×8 mm.

Experimental Example 1 of Seventh Embodiment

An annealed wafer was made in a reduced atmosphere. The annealed wafer had a specific resistance ρ of 10 to 30 Ω·cm and an oxygen concentration [Oi] of 10 to 12×10$^{17}$ atoms/cm$^3$. On a first principal plane of the annealed wafer, (100) crystal faces were exposed. In FIG. 49, a curve with squares is a BMD profile measured on the annealed wafer. A maximal or minimal value of the profile corresponds to a rotation angle of the annealed wafer at which a (111) crystal face of a BMD directly focuses a laser beam.

Experimental Example 2 of Seventh Embodiment

Experimental example 2 of the seventh embodiment measures the crystal orientation of a wafer when forming patterns by exposure on the wafer, instead of forming a reference ID mark on the wafer. After determining the crystal orientation, a reference ID mark is formed on the wafer, the wafer is positioned according to the reference ID mark, and patterns are formed by exposure on the wafer.

Comparison Example of Seventh Embodiment

A CZ wafer was prepared according to the seventh embodiment, and the crystal orientation of the CZ wafer was determined according to a Laue image made by the X-ray diffraction technique of the fifth embodiment. On a first principal plane of the CZ wafer, (100) crystal faces were exposed. The CZ wafer had a specific resistance ρ of 10 to 20 Ω·cm and an oxygen concentration [Oi] of 12 to 14×10$^{17}$ atoms/cm$^3$ (old ASTM).

Figure 50:
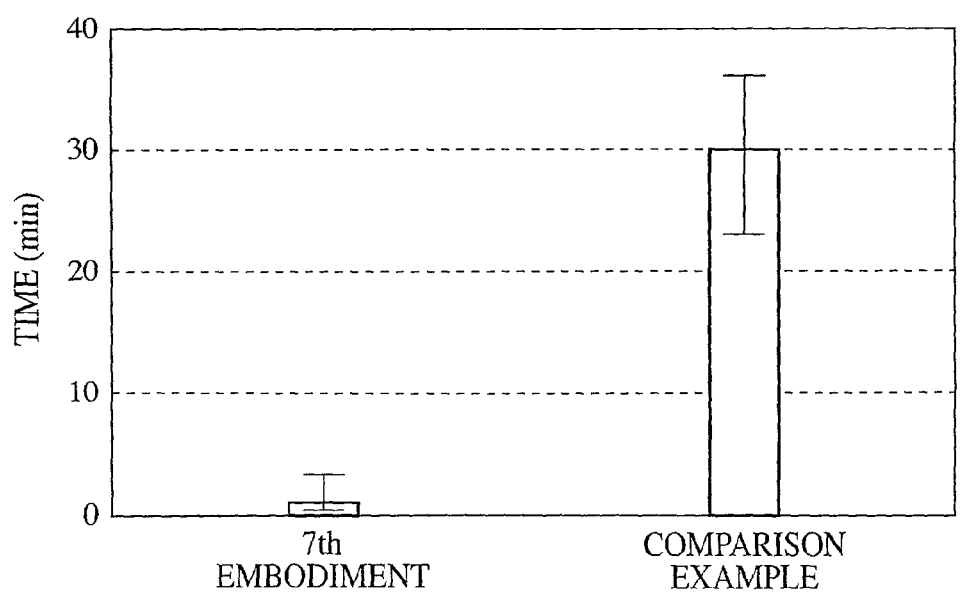
FIG. 50 is a graph showing time durations for the determination of the wafer crystal orientation according to the seventh embodiment and a comparison example.

The seventh embodiment, the experimental examples 1 and 2 thereof, and the comparison example could each determine the crystal orientation of a wafer. After determining the crystal orientation, the experimental example 2 could adjust the crystal orientation of the wafer in a pattern exposing process. "Seventh embodiment" in FIG. 50 indicates durations needed by the seventh embodiment and the experimental examples 1 and 2 thereof, and "Comparison example" indicates the durations needed by the comparison example of the seventh embodiment. The "Seventh embodiment" needs one to two minutes per wafer to determine the crystal orientation, and the "Comparison example" needs about 10 to 20 minutes per wafer, i.e., about 10 times as long as the duration of the "Seventh embodiment" to determine the crystal orientation. This is because the X-ray diffraction technique employed by the comparison example can correctly determine a wafer crystal orientation only by means of a narrow X-ray slit, i.e., a limited measurement area. Namely, the X-ray diffraction technique must measure weak X-rays passing through the narrow slit for a long time.

As in the sixth embodiment, and the seventh embodiment, the experimental examples 1 and 2 thereof are capable of safe, quick, and precise determination of the crystal orientation of a circular wafer having no notch or orientation flat.

The seventh embodiment, the experimental examples 1 and 2 thereof, and the comparison example measure the crystal orientation of a wafer in semiconductor device manufacturing processes. They are also capable of measuring the crystal orientation of a wafer in wafer manufacturing processes.

Light to irradiate a wafer is not limited to infrared light. It may be visible light. Instead of the infrared laser source 127 of FIG. 45, a visible laser beam source may be employed to emit a visible laser beam to a first principal plane of a wafer. In this case, the scattered light detector 124 detects light of visible wavelengths.

In the above explanation (FIGS. 45 and 46), the laser beam 123 obliquely irradiates a first principal plane of a wafer, and the detector 124 is arranged above the first principal plane. These laser beam incident angle and scattered light detecting directions do not limit the present invention. For example, a laser beam may be emitted from just above a first principal plane of a wafer, and the detector 124 may be obliquely arranged to detect scattered light. Alternatively, a laser beam may be obliquely emitted, and the detector 124 may be arranged to detect obliquely scattered light.

Eighth Embodiment

A semiconductor wafer manufacturing equipment according to the eighth embodiment will be explained. This equipment is based on the experimental example of eighth embodiment. The equipment emits white light toward the surface of an alkali-etched wafer, detects reflected light from the wafer surface, determines the crystal orientation of the wafer, and forms a mark on the wafer.

Figure 51:
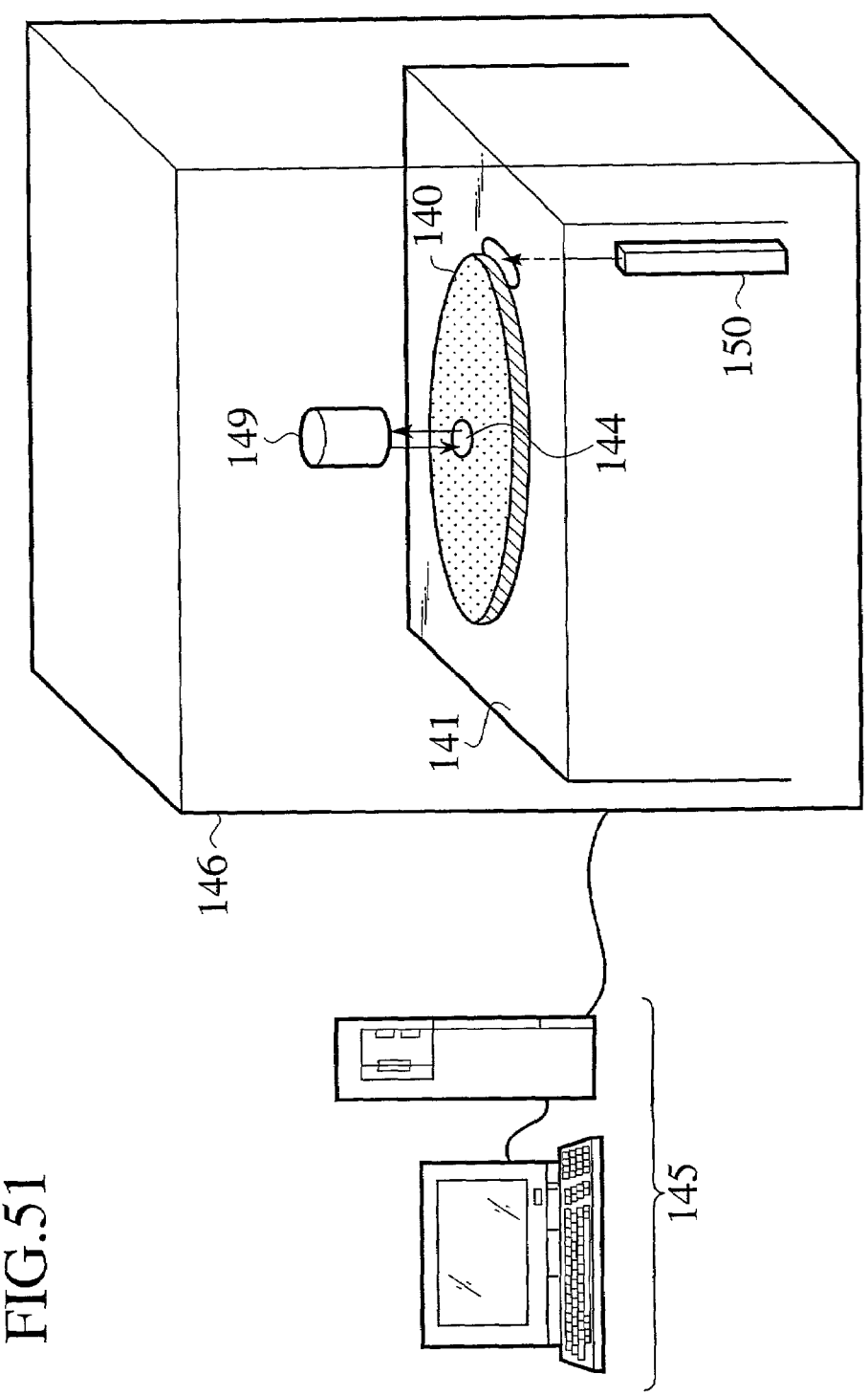
FIG. 51 is a perspective view showing a semiconductor wafer manufacturing equipment according to the eighth embodiment.

In FIG. 51, the equipment has a wafer stage 141 on which a target wafer 140 and a detecting unit 149 are set. The detecting unit 149 emits light toward a first principal plane of the wafer 140 and measures the intensity of scattered light from etch pits 144 formed on the first principal plane. The equipment further has a computer 145 for analyzing data related to the rotation angle dependence of the intensity of scattered light, a laser marker 150 for forming a reference ID mark on the wafer 140 to indicate a crystal orientation of the wafer 140, and a chamber 146. The chamber 146 covers at least the wafer stage 141, wafer 140, and detecting unit 149, thus blocking external light. The computer 145 has software to analyze data related to the rotation angle dependence of the intensity of scattered light and correct the inclination angle of the wafer 140.

On the first principal plane of the wafer 140, first-orientation crystal faces ((100) in this example) are exposed, and etch pits each defined by second-orientation crystal faces, that are different from the (100) crystal faces, are formed by alkali etching. The second-orientation crystal faces include a (111) crystal face and crystal faces equivalent to the (111) crystal face. The detecting unit 149 has functions of emitting light toward the first principal plane of the wafer 140 and functions of measuring the intensity of scattered light from the etch pits 144. The laser marker 150 emits a laser beam to the periphery of a second principal plane of the wafer 140, to form a reference ID mark with a plurality of dots. The reference ID mark may be formed on the periphery of the first principal plane or the side face of the wafer 140 instead of the second principal plane thereof.

Figure 52:
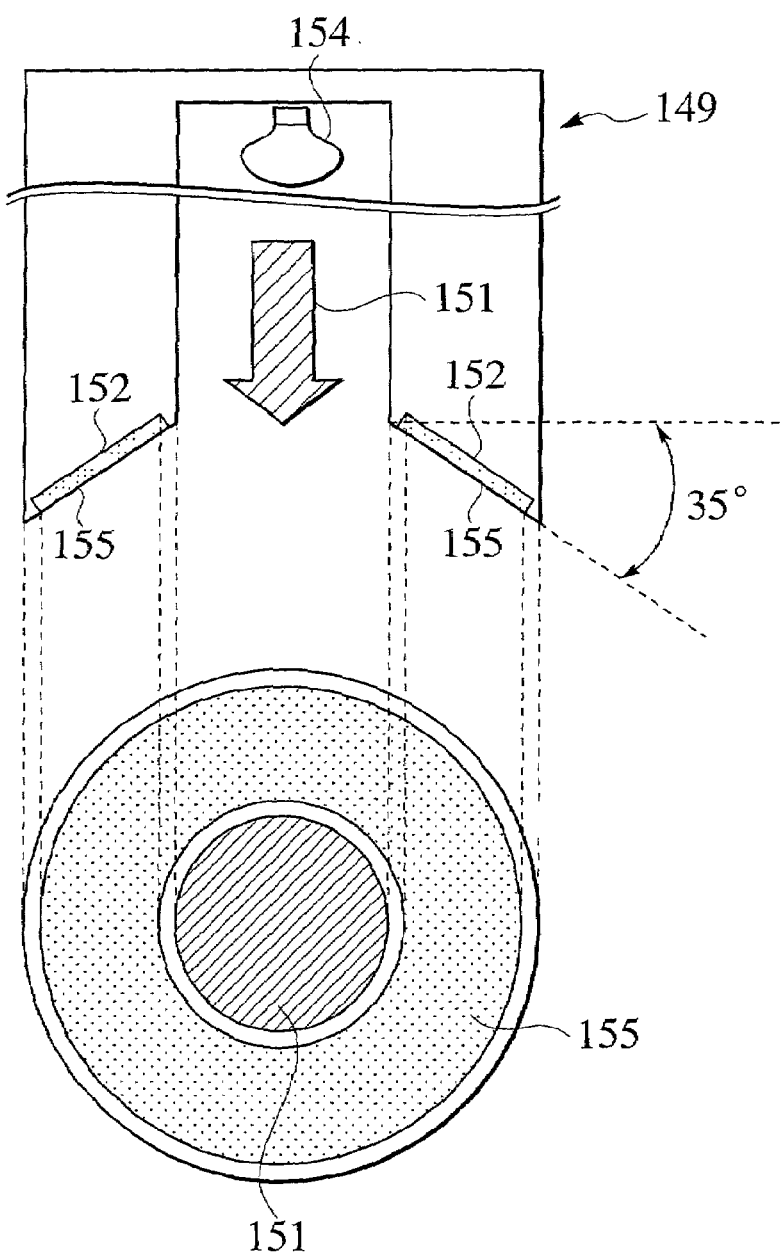
FIGS. 52A and 52B are sectional and bottom views showing a detecting unit according to the eighth embodiment.

FIGS. 52A and 52B show the detecting unit 149, of which FIG. 52A is a sectional view and FIG. 52B is a bottom view. The detecting unit 149 has a light source 154 to emit light 151 toward the first principal plane of the wafer 140 set on the wafer stage 141, and a photodetector 152 to measure the intensity of scattered light from etch pits formed on the first principal plane of the wafer 140. The photodetector 152 may be a CCD camera having 300,000 pixels and a diameter of 1.25 cm.

The photodetector 152 has an annular photosensitive face 155 that surrounds an emission mouth from which the light 151 is emitted. The photosensitive face 155 is substantially circular and has an inclination angle of 35.3±1°. The detecting unit 149 is the integrated light source 154 and photodetector 152.

The light 151 irradiating the wafer 140 is a parallel light flux that does not diverge or converge. The light 151 may be white light or monochromatic light. It may be visible light or infrared light. The light source 154 may be a monochromatic laser or an infrared laser.

The light source 154 emits the parallel light flux 151 toward the first principal plane of the wafer 140. Part of the parallel light flux 151 is scattered by the etch pits on the first principal plane and is detected by the 35°-inclined photodetector 152. The photodetector 152 surrounds the light source 154, and therefore, can simultaneously measure light scattered by the etch pits in all directions without rotating the wafer 140 or photodetector 152. The computer 145 evaluates the intensity of the detected light according to rotation angles of the photosensitive face 155 around the parallel light flux 151.

Figure 53:
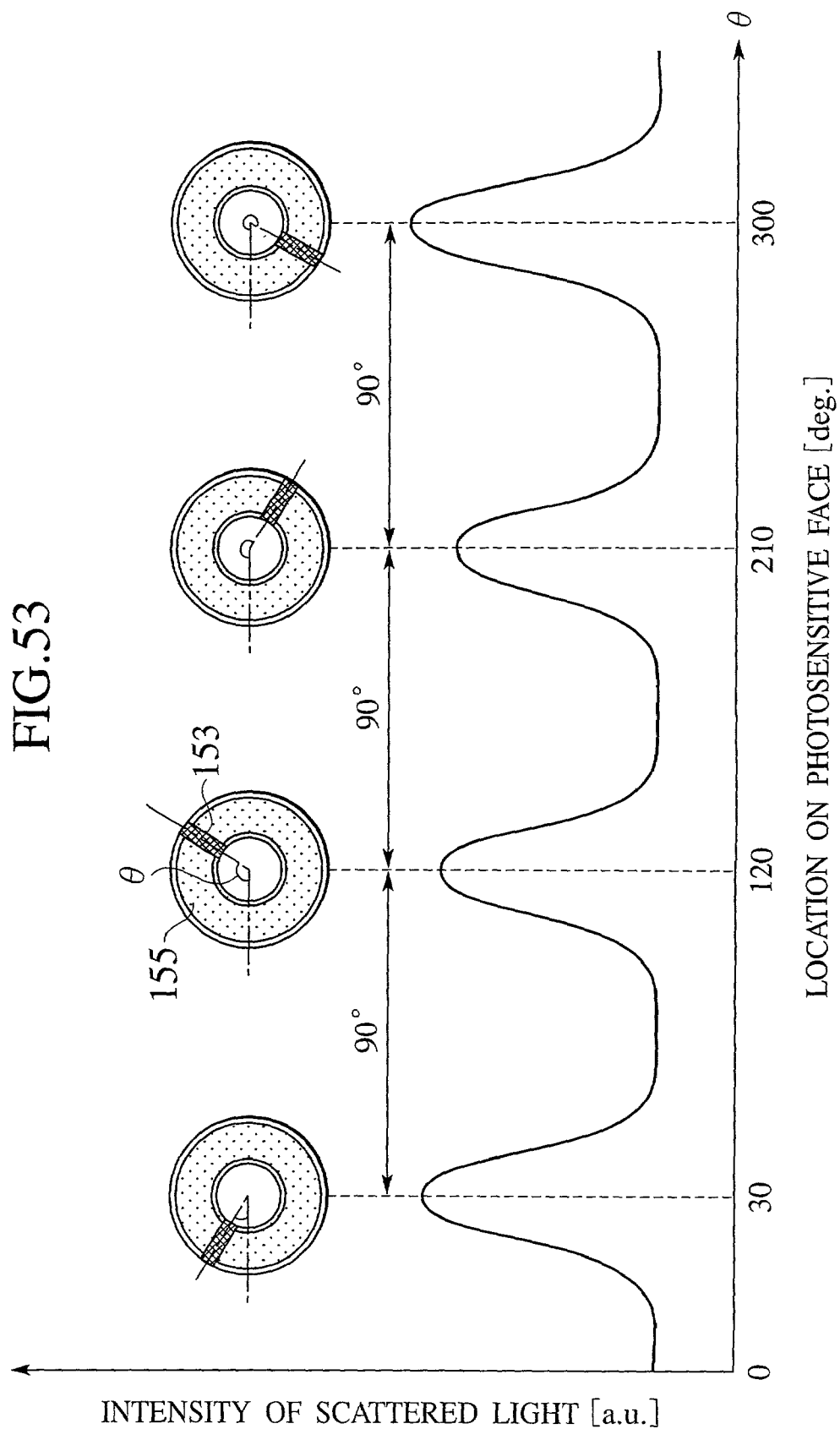

In FIG. 53, an abscissa indicates rotation angles on the photosensitive face 155, and an ordinate indicates relative values representing the intensity of scattered light. A part 153 on the annular photosensitive face 155 indicates a corresponding rotation angle. Scattered light intensity peaks of substantially the same level appear at four locations at intervals of 90°. This is because each etch pit is defined by four crystal faces. These crystal faces include the (111) crystal face and crystal faces equivalent to the (111) crystal face. The annular photosensitive face 155 is capable of simultaneously detecting scattered light from the (111) and equivalent crystal faces of etch pits.

Peaks shown in FIG. 54 are irregular in intervals and intensity levels. The peaks appear at the rotation angles of 10°, 50°, 170°, and 310° and their levels are uneven. This phenomenon occurs when crystal faces exposed at the first principal plane of the wafer 140 are shifted from the (100) crystal faces, or when the detecting unit 149 is inclined with respect to the first principal plane of the wafer 140. In this case, the first principal plane of the wafer 140 or the detecting unit 149 is corrected by using the computer 145, so that four peaks having the same intensity level may appear at regular intervals as shown in FIG. 53.

Figure 55A:
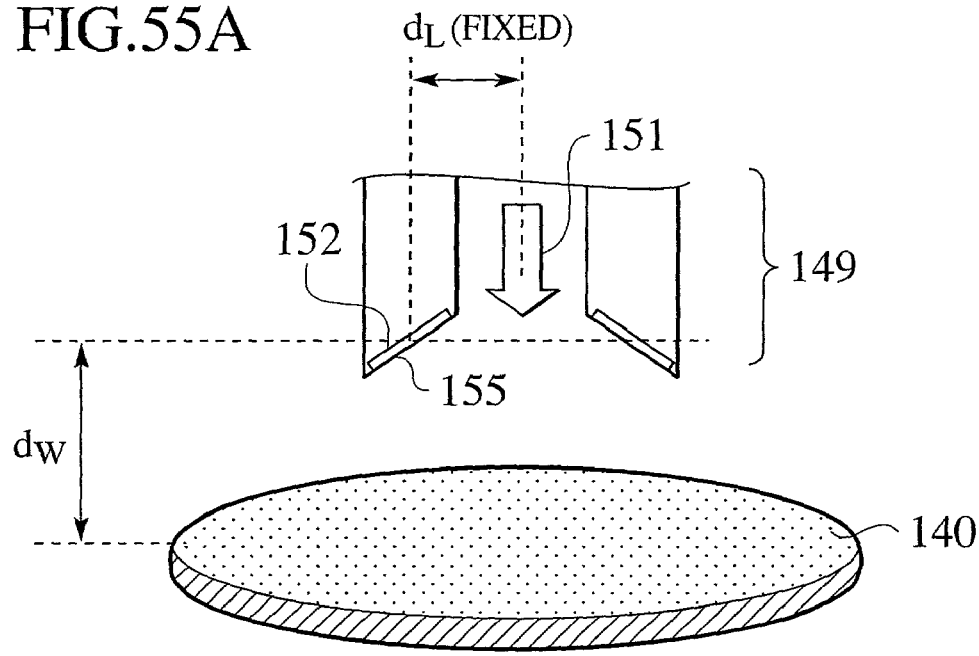
FIG. 55A shows a relationship between a distance (dL) between a parallel light flux and a photodetector and a distance (dW) between the photodetector and a wafer.

A distance between the wafer 140 and the photodetector 152 of the detecting unit 149 has an optimum value. As shown in FIG. 55A, it is preferable that a distance between the center of the parallel light flux 151 and the center of the photosensitive face 155 is 0.7 times a distance between the first principal plane of the wafer 140 and the center of the photosensitive face 155.

Figure 55B:
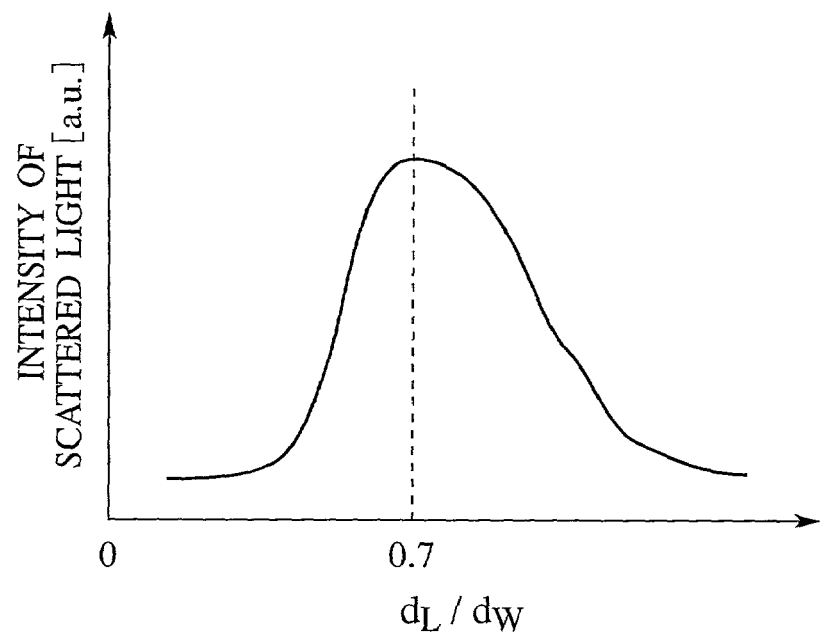
FIG. 55B is a graph showing an optimum value of dL/dW to improve detecting efficiency.

In FIG. 55B, an abscissa indicates dL/dW and an ordinate indicates the intensity of scattered light. The distance dL is a distance between the center of the parallel light flux 151 and the center of the photosensitive face 155. The distance dW is a distance between the first principal plane of the wafer 140 and the center of the photosensitive face 155. The distance dL is fixed, and the distance dW is changed. As shown in FIG. 55B, a maximal value of the intensity of scattered light is obtained at (dL/dW)=0.7±0.1. With this value, the scattered light 148b from the (111) and equivalent crystal faces are most efficiently detected.

Correcting the distance between the detecting unit 149 and the wafer 140 and the inclination of the wafer 140 or detecting unit 149 improves detection accuracy.

A semiconductor wafer manufacturing method according to the eighth embodiment of the present invention will be explained. The eighth embodiment forms etch pits on a wafer by anisotropic etching using an alkali solution and employs the etch pits to determine the crystal orientation of the wafer.

Figure 56:
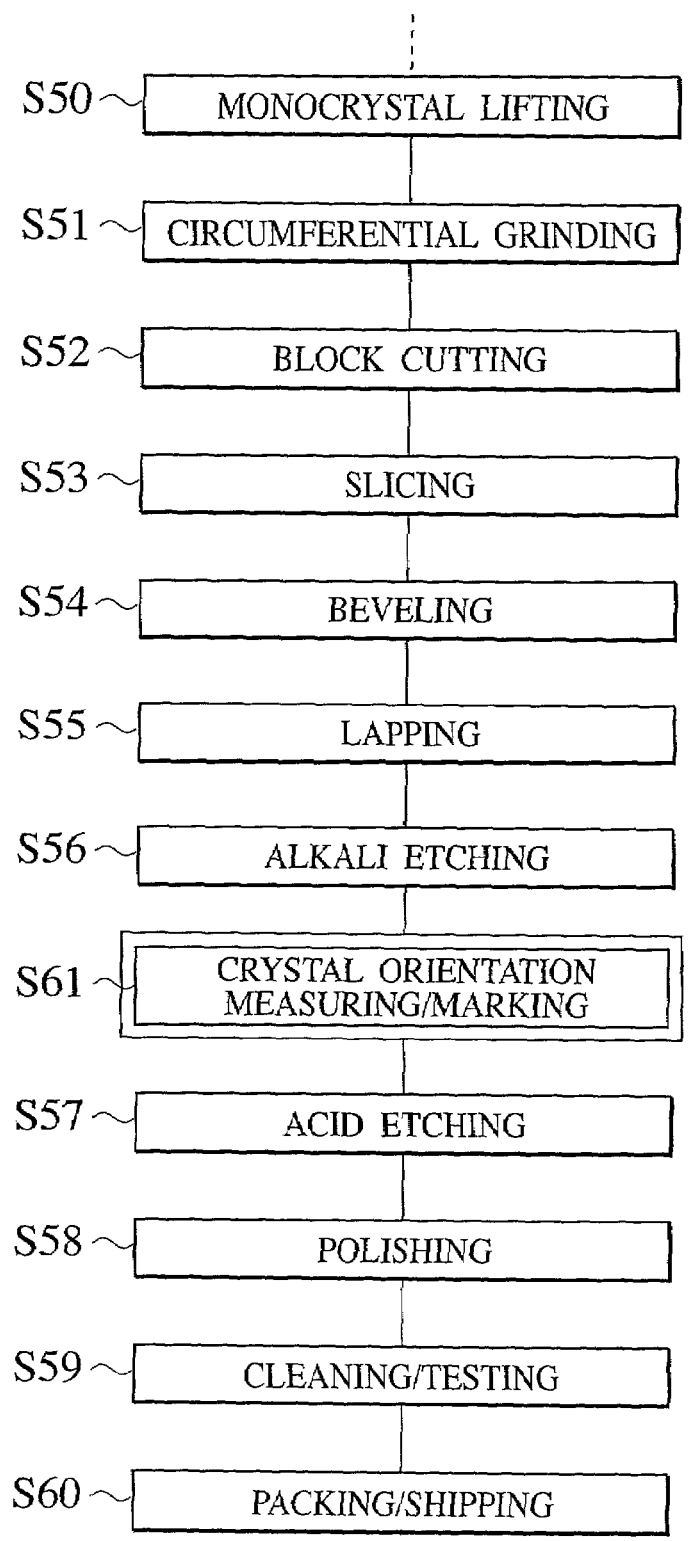
FIG. 56 is a flowchart showing a semiconductor wafer manufacturing method according to the eighth embodiment.

(1) In FIG. 56, stage S50 lifts a monocrystalline ingot. Stage S51 carries out a circumferential grinding process to determine the diameter of wafers produced from the ingot. Stage S52 carries out a block cutting process and stage S53 carries out a slicing process to form disk wafers from the ingot. A first principal plane of each wafer exposes (100) crystal faces. The monocrystalline ingot receives no crystal orientation measurement nor notch/orientation flat formation. The circumferential shape of each wafer, therefore, is circular.

(2) Stage S54 chamfers the edge of each wafer to form a bevel contour that is inclined with respect to the first principal plane of the wafer. Stage S55 laps the first principal plane and bevel contour of each wafer.

(3) Stage S56 carries out an anisotropic etching process to mainly remove undulation on the first principal plane of each wafer. The anisotropic etching process employs an alkali solution and involves different etching speeds depending on the crystal orientations of the wafer. The alkali solution may be KOH or NaOH. The anisotropic etching process forms etch pits on the first principal plane of each wafer. The etch pits are defined by crystal faces that are different from the (100) crystal face.

(4) Stage S61 employs a semiconductor wafer manufacturing equipment as shown in FIG. 51 to measure the crystal orientation and form a mark. More precisely, stage S61 of FIG. 56 emits a parallel light flux to the etch pits. The parallel light flux is reflected by second-orientation crystal faces that define each etch pit. Stage S61 detects the reflected light, evaluates the rotation angle dependence of the intensity of the reflected light, and forms a reference ID mark on the wafer to indicate the crystal orientation of the wafer.

(5) Stage S57 carries out an acid etching process with an acid solution to mainly remove the etch pits. Stage S58 carries out a polishing process on the first principal plane and bevel contour of each wafer. Stage S59 cleans and tests the wafers. Stage S60 packs and ships the wafers.

Experimental Example of Eighth Embodiment

Figure 57:
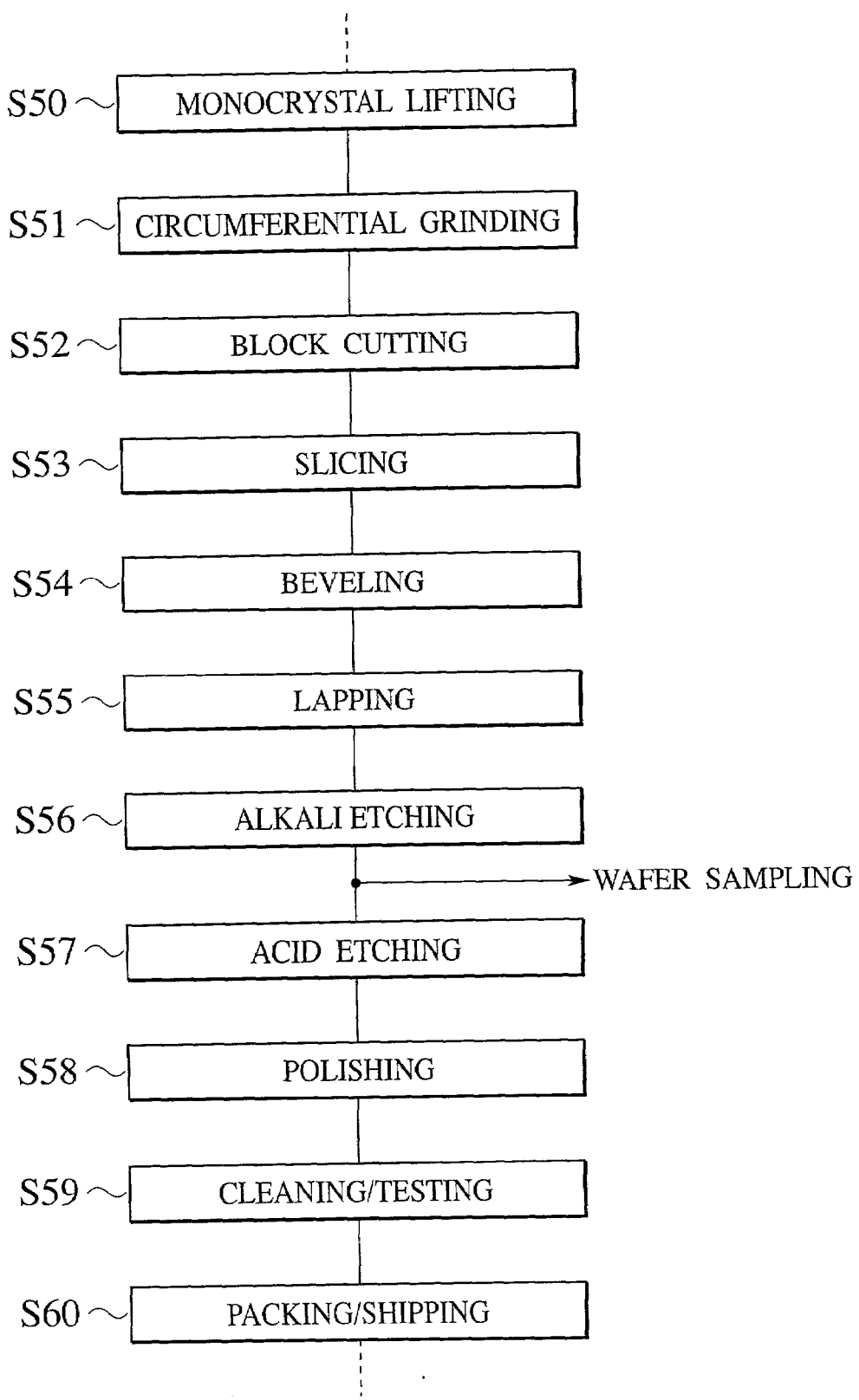
FIG. 57 shows a semiconductor wafer manufacturing flow including a wafer sampling stage according to the experimental example of the eighth embodiment.

An experimental example according to the eighth embodiment will be explained. The flowchart shown in FIG. 57 is substantially the same as that of FIG. 56. Instead of stage S61 as shown in the flowchart of FIG. 56, the flowchart of FIG. 57 picks up a sample wafer. After the alkali etching in stage S56 and before the acid etching in stage S57, the sample wafer is taken from the wafer manufacturing line.

Figure 58:
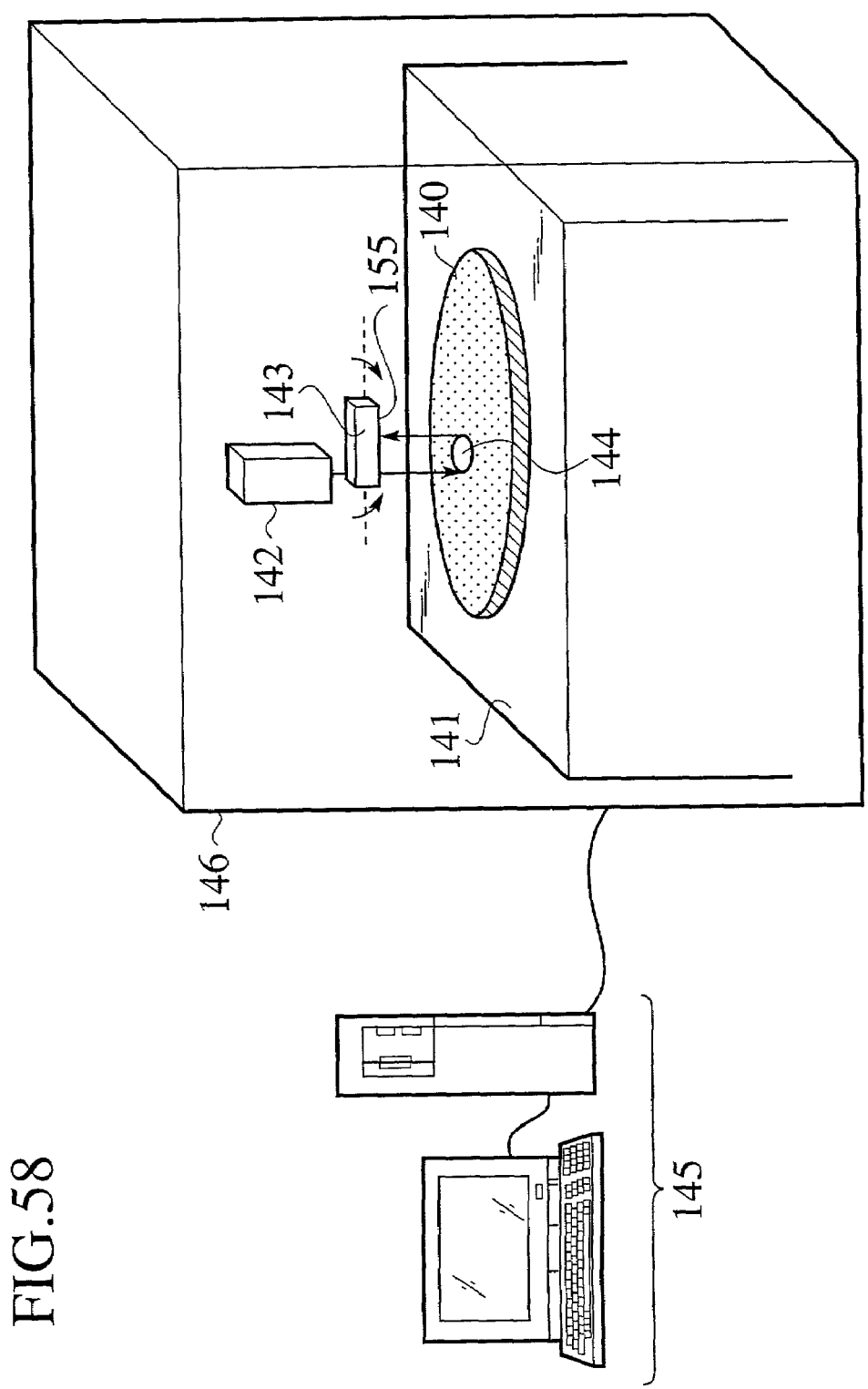
FIG. 58 is a perspective view showing an experimental equipment according to the experimental example of the eighth embodiment.

In FIG. 58, the sample wafer 140 is set on a wafer stage 141. On the first principal plane of the sample wafer 140, there are many etch pits. Each etch pits are defined by second-orientation crystal faces that are different from the (100) crystal face which is a first-orientation crystal face. A light source 142 is arranged above the first principal plane of the sample wafer 140, to emit white light vertically to the etch pits 144 exposed at the first principal plane. Scattered light from the etch pits 144 is detected by a scattered light detector 143. A chamber 146 covers the sample wafer 140, wafer stage 141, light source 142, and detector 143, to block external light.

Figure 59:
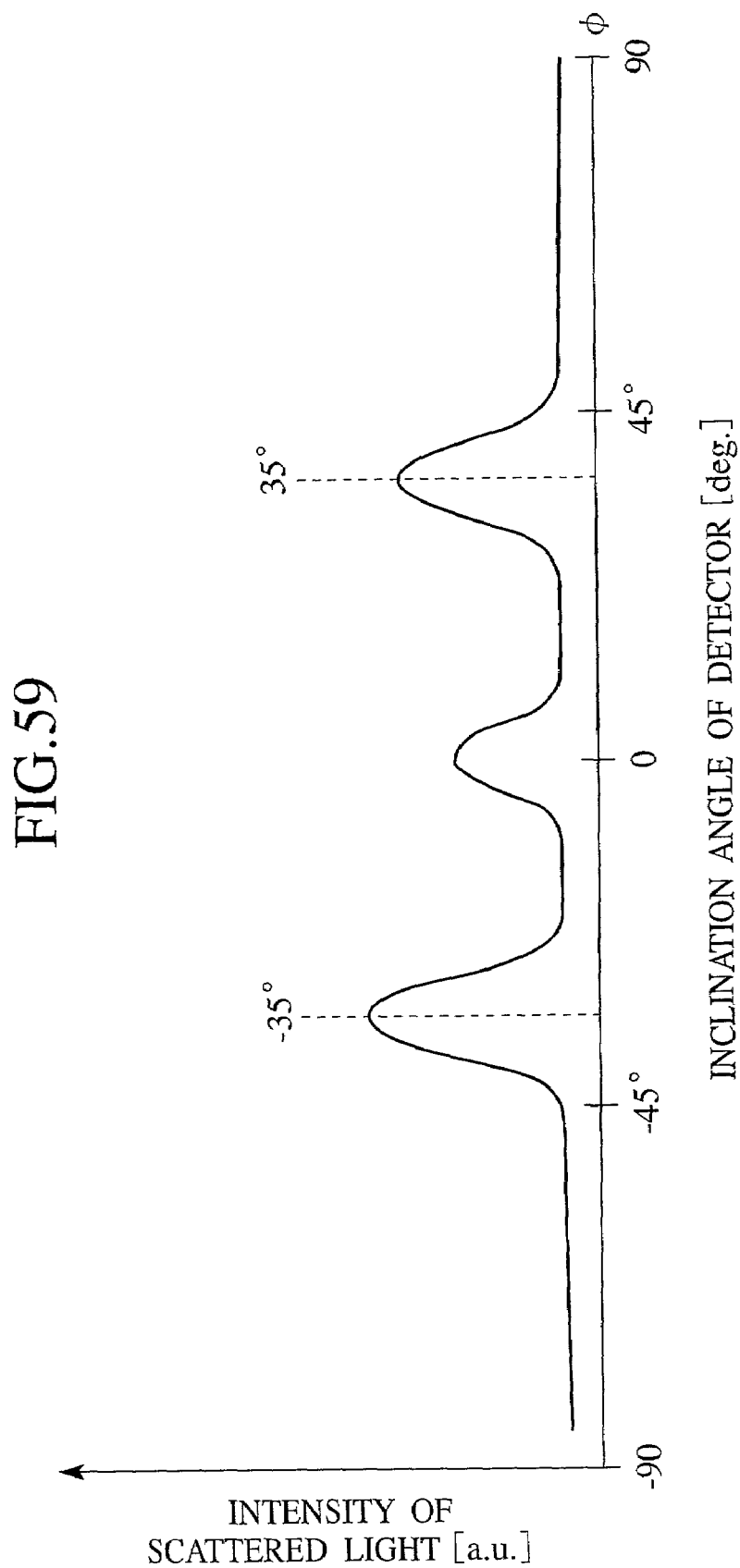
FIG. 59 is a graph showing the intensity of scattered light measured by the equipment of FIG. 58 and the inclination angles of a photodetector.

The detector 143 has a photosensitive face 155. The photosensitive face 155 is inclined with respect to the (100) crystal faces, to measure changes in the intensity of scattered light. In FIG. 59, the intensity of scattered light changes with respect to the inclination angle of the photosensitive face 155. An abscissa indicates the inclination angle of the photosensitive face 155, and an ordinate indicates relative values representing the intensity of scattered light. When the photosensitive face 155 is parallel with the (100) crystal faces, i.e., when the inclination angle of the photosensitive face 155 is zero, a peak appears. When the photosensitive face 155 is inclined by 35° and −35°, peaks also appear.

Figure 60:
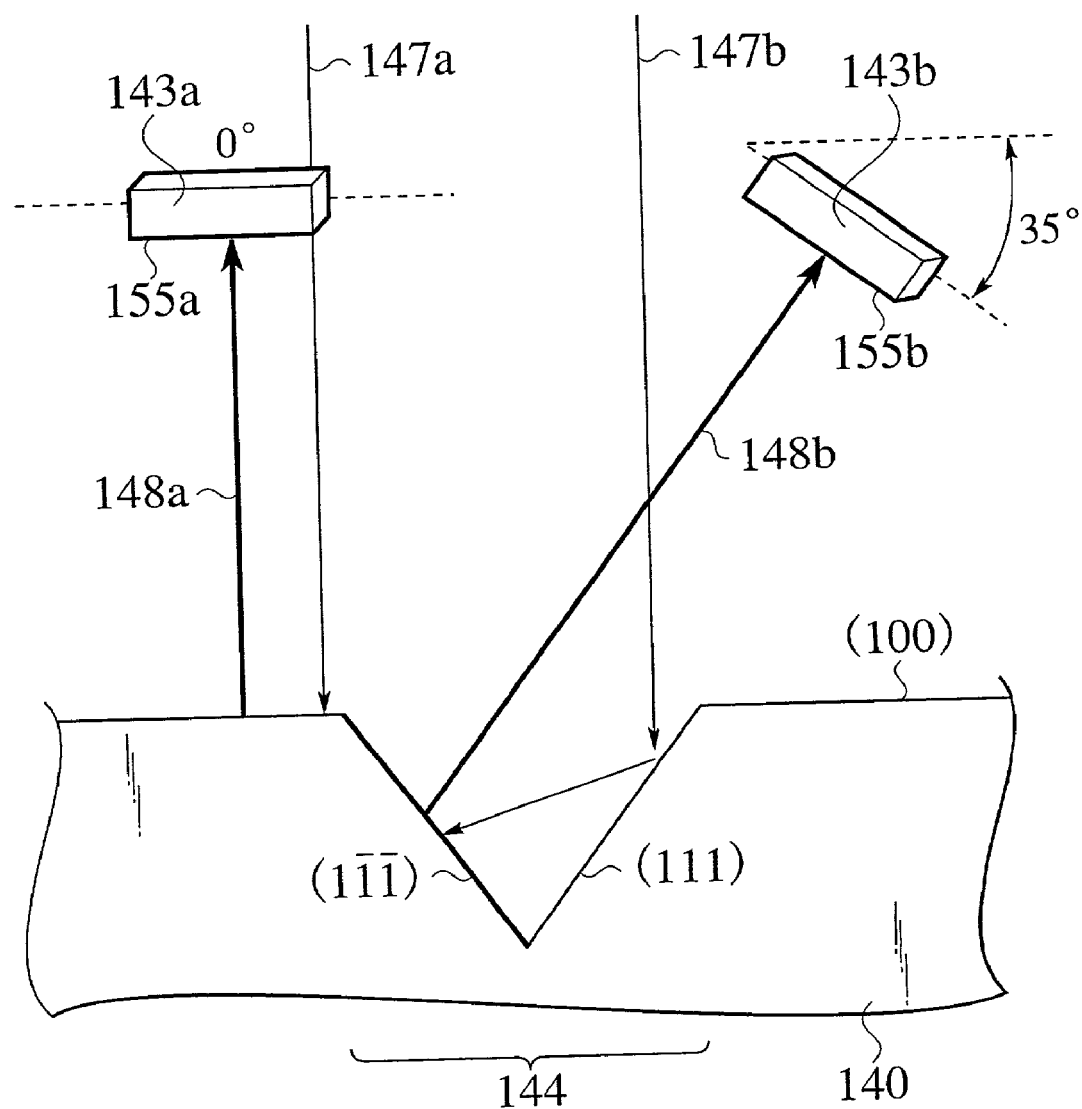
FIG. 60 shows a relationship between an inclination angle of a photodetector and scattered light from an etch pit.

FIG. 60 explains light scattering by an etch pit 144 formed on the first principal plane of the sample wafer 140. Light (147*a*, 147*b*) from the light source 142 vertically advances toward the (100) crystal faces. A detector 143*a* having a photosensitive face 155*a* of 0° inclination detects scattered light 148*a* directly from the (100) crystal faces, providing the 0°-inclination peak of FIG. 59.

A detector 143*b* having a photosensitive face 155*b* of 35° inclination detects scattered light 148*b* from the etch pit 144, providing the 35°-inclination peak of FIG. 59. In FIG. 60, the etch pit 144 is defined by second-orientation crystal faces including a (111) crystal face and crystal faces equivalent to the (111) crystal face. Light entering the etch pit 144 is reflected by the second-orientation crystal faces and is detected by the detector 143*b* having the 35°-inclined photosensitive face 155*b*.

Comparison Example of Eighth Embodiment

After the alkali etching process (S56) and before the acid etching process (S57), a comparison example of the eighth embodiment emits X-rays to a wafer to find the crystal orientation of the wafer. According to the found crystal orientation, a reference ID mark is made on the wafer using marking equipment.

Figure 61:
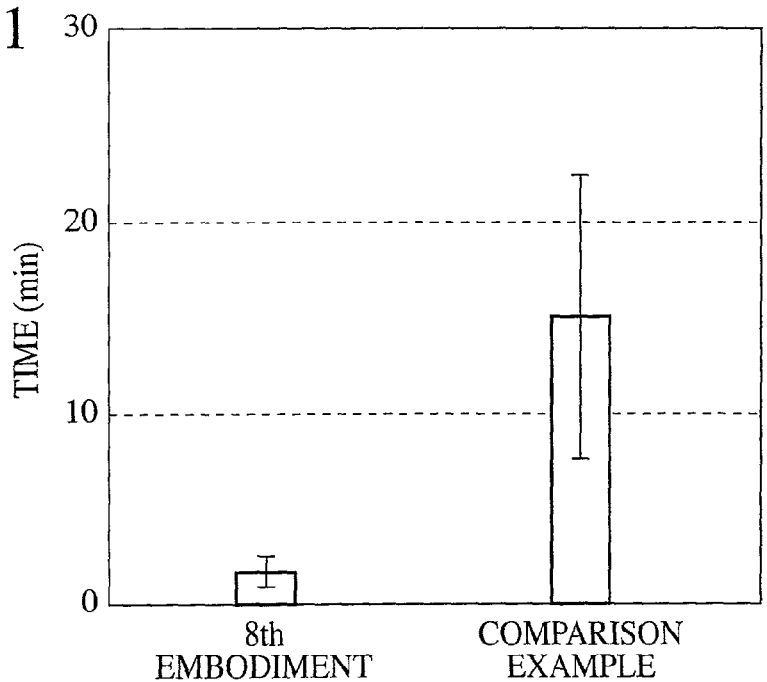
FIG. 61 is a graph showing the crystal orientation measuring time and marking time of the eighth embodiment and a comparison example.

In FIG. 61, the comparison example needs 10 to 20 minutes per wafer, while the eighth embodiment needs only 1 to 2 minutes per wafer. The eighth embodiment employs visible light or infrared rays. On the other hand, the comparison example employs X-rays that are hazardous to humans, and therefore, requires an equipment to ensure safety.

The eighth embodiment is capable of safe, quick, and precise measurement of wafer crystal orientation and formation of a mark on the wafer accordingly, thereby suppressing manufacturing cost.

Ninth Embodiment

Recent high-performance semiconductor integrated circuits are produced from SOI wafers to realize low power consumption and high-speed operation. A direct bonding technique to form an SOI wafer requires two wafers, and therefore, increases the cost of the wafer. For example, an 8-inch SOI wafer costs about 100,000 yen. The most critical problem of the SOI wafers is the decrease of the manufacturing cost thereof.

To improve the characteristics of semiconductor device formed on wafers, semiconductor device manufacturing processes employ various elements. To prevent such elements from contaminating wafers, the wafers are cleaned. It is difficult, however, to completely clean dust (elements) collected in notches formed on the wafers. Dust caught in notches causes contamination, reducing the yield of semiconductor device formed from the wafers.

The ninth embodiment of the present invention provides, as in the fourth embodiment, an SOI wafer having a monocrystalline silicon base wafer, an insulating layer formed on a principal plane of the base wafer, and an SOI layer (monocrystalline silicon layer) formed on the insulating layer. In particular, the ninth embodiment provides an SOI wafer having a circular base wafer without notches or an orientation flat, and a method of manufacturing such a SOI wafer.

Figure 62A:
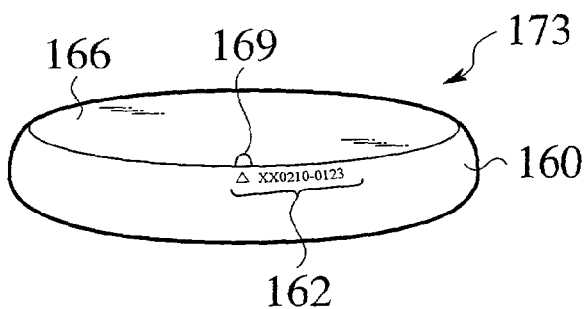
FIG. 62A is a perspective view showing an SOI wafer according to a ninth embodiment of the present invention.

In FIG. 62A, the SOI wafer 173 is made of a circular base wafer 160, a bevel contour formed along the periphery of the base wafer 160, an insulating layer formed on the base wafer 160, an SOI layer formed on the insulating layer, a reference position 169 formed on the periphery of the SOI layer, and a reference ID mark indicating the crystal orientation of the SOI layer.

The reference position 169 is a notch or an orientation flat indicating the crystal orientation of the SOI layer. In this example, the reference position 169 is a notch.

Figure 62B:
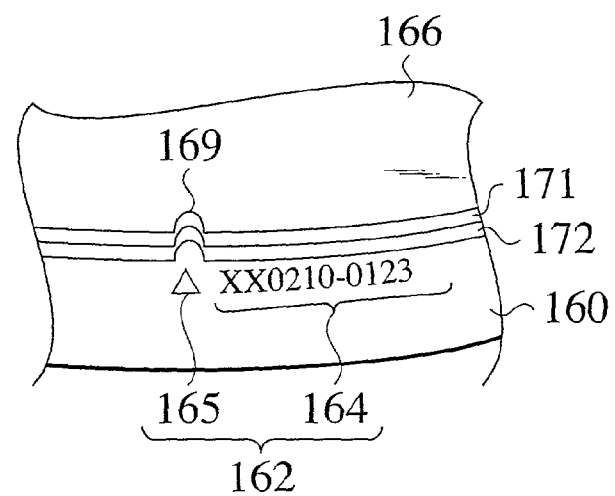
FIG. 62B is an enlarged view showing a notch and a reference ID mark formed on the wafer of FIG. 62A.

In FIG. 62B, the reference ID mark 165 is formed in the vicinity of the notch 169. The insulating layer 172 is formed on a principal plane of the base wafer 160, and the SOI layer 171 is arranged on the insulating layer 172. The notch 169 is formed on the peripheries of the insulating layer 172 and SOI layer 171. The notch 169 may be formed at least on the periphery of the SOI layer 171. The insulating layer 172 may or may not have a notch 169.

The reference ID mark 165 is formed on the bevel contour of the base wafer 160 and is aligned with the notch 169. Adjacent to the reference ID mark 165, an ID mark 164 containing data related to the SOI wafer 173 is formed on the bevel contour of the base wafer 160. In this example, the reference ID mark 165 is a triangle. This does not limit the present invention. As explained in the first to eighth embodiments, the reference ID mark 165 may have any shape if it is of use in identifying the crystal orientation of the SOI layer 171. The ID mark 164 is mainly used to manage the quality of the SOI wafer 173 and is made of alphanumeric characters. In the following explanation, the reference ID mark 165 and ID mark 164 are collectively referred to as ID mark 162.

A method of manufacturing the SOI wafer 173 according to the ninth embodiment will be explained. The SOI wafer 173 is formed by the direct bonding technique. The SOI wafer 173 is manufactured by bonding the base wafer and the SOI layer wafer.

In FIG. 63A, the base wafer 160 is circular and has no reference position such as a notch or an orientation flat. The periphery of the base wafer 160 has a bevel contour 163. In FIG. 63B, the ID mark 162 is formed on the bevel contour 163 close to the principal plane 161.

In FIG. 64, stage S71 lifts a monocrystalline ingot. Stage S72 carries out a circumferential grinding process on the ingot to fix the diameter of wafers produced from the ingot. Stage S75 carries out a slicing process on the ingot, to form disk wafers. The monocrystalline ingot is not subjected to crystal orientation measurement nor to notch/orientation flat formation, and therefore, each of the wafers are circular.

Stage S76 chamfers the edge of each wafer, to form a bevel contour along the periphery of the wafer. The bevel contour is inclined with respect to a main plane of the wafer. Stage S77 carries out a lapping process on the principal plane and bevel contour of each wafer. Stage S78 carries out an etching process to mainly remove undulation on the principal plane of each wafer. The etching process includes an alkali etching process using an alkali solution and an acid etching process using an acid solution.

Stage S79 carries out a polishing process on the principal plane and bevel contour of each wafer. The polished wafers are cleaned and tested. An ID mark 162 identifying the crystal orientation and for managing the quality of an SOI wafer is made on the bevel contour of each wafer. This completes the base wafer 160 according to the ninth embodiment.

In FIG. 65A, the SOI layer wafer 166 has a bevel contour on which the notch 169 is formed. In FIG. 65B, the SOI layer wafer 166 has the first principal plane 167 where the oxide film 172 is formed. The silicon wafer 170 contains the hydrogen ion implanted layer 168 separated from the oxide film 172. Between the oxide film 172 and the hydrogen ion implanted layer 168, an SOI layer (monocrystalline silicon layer) 171 is present.

In FIG. 66, the manufacturing method of FIG. 64 is partly employed to form wafers each provided with a notch on the periphery thereof. Namely, after the circumferential grinding process of stage S72 and before the slicing process of stage S75 (FIG. 64), X-rays are emitted to measure the crystal orientation of a monocrystalline ingot, and a notch is formed on the ingot. The notched ingot is sliced into silicon wafers each having a notch on the periphery thereof.

Stage S91 of FIG. 66 carries out a heat treatment on the first principal plane of each silicon wafer 170 to form a thermal oxide film 172 on the wafer 170. Instead, a silicon oxide film may be deposited on the first principal plane of the wafer 170. The thermal oxide film 172 or silicon oxide film is the buried oxide film 172 serving as a BOX layer in the SOI wafer 173 (FIG. 62B).

Stage S92 implants hydrogen ions into the first principal plane of the wafer 170 through the oxide film 172. The ion implantation is carried out under the conditions of, for example, about 50 keV in ion acceleration energy and $10^{17}/cm^2$ in implantation concentration. This forms a hydrogen ion implanted layer 168 in the silicon wafer 170. The hydrogen ion implanted layer 168 is spaced apart from the oxide film 172, thereby completing the SOI layer wafer 166.

Figure 67:
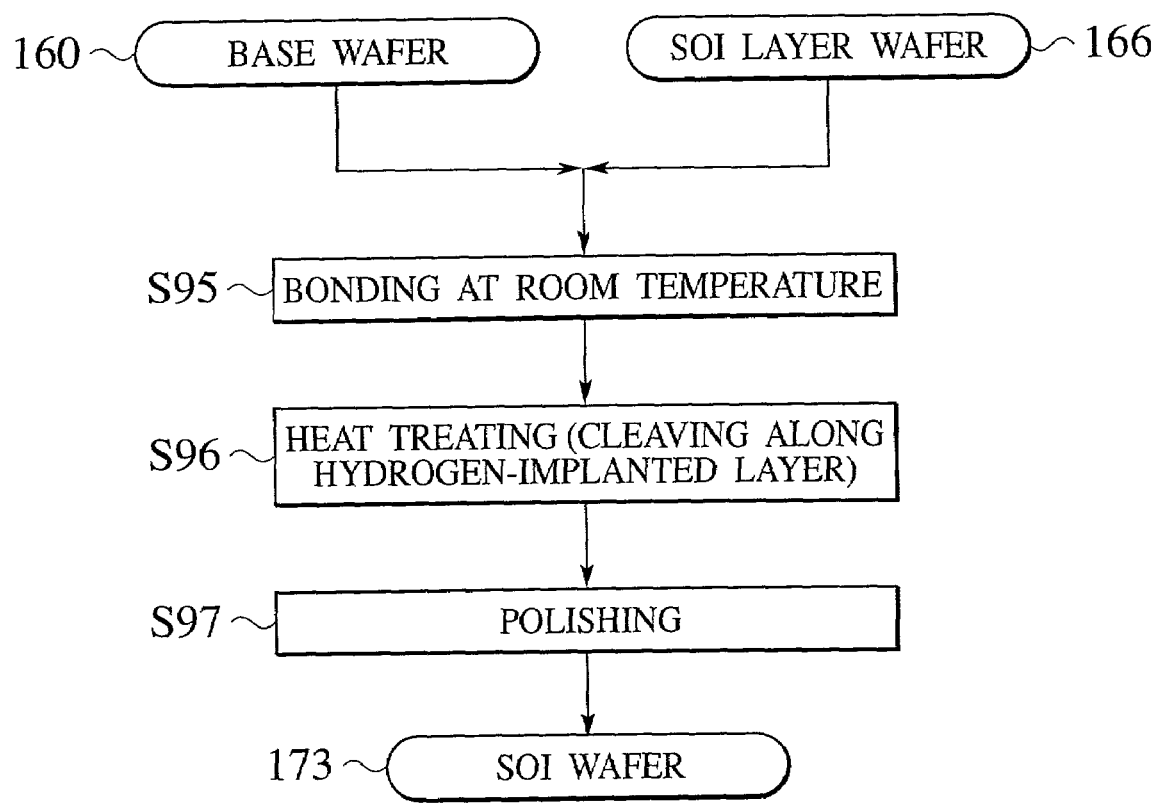
FIG. 67 is a flowchart showing a method of manufacturing the SOI wafer according to the ninth embodiment by bonding the base wafer of FIG. 63A to the SOI layer wafer of FIG. 65A.

As shown in FIG. 67, the SOI wafer 173 (FIG. 62A) is manufactured by bonding the base wafer 160 (FIG. 63A) and the SOI layer wafer 166 (FIG. 65A). Stage S95 bonds the principal plane 161 of the base wafer 160 to the principal plane 167 of the SOI layer wafer 166 at room temperature. At this time, the notch 169 on the periphery of the SOI layer wafer 166 is aligned with the triangle reference ID mark 165 on the bevel contour 163 of the base wafer 160, and the wafers 160 and 166 are bonded together. To align the notch 169 and reference ID mark 165 with each other, an optical reader having CCDs may be employed. The wafers 160 and 166 are properly oriented, according to the triangle mark 165.

Stage S96 carries out a heat treatment and cleaves the SOI layer wafer 166 along the hydrogen ion implanted layer 168. This forms a solid structure comprising the base wafer 160, oxide film (buried oxide film) 172, and SOI layer 171. The buried oxide film 172 and SOI layer 171 are on the principal plane 161 of the base wafer 160. Stage S97 polishes the cleaved face, to complete the SOI wafer 173 of FIG. 62A.

According to the ninth embodiment, the base wafer 160 and SOI layer wafer 166 are bonded together, and the SOI layer wafer 166 is cleaved along the hydrogen ion implanted layer 168. This method does not limit the present invention in the formation of an SOI wafer. The base wafer 160 may be bonded to the SOI layer wafer 166, without the hydrogen ion implanted layer 168. In this case, a second principal plane of the SOI layer wafer 166 opposite to the first principal plane 167 is thinned to a required thickness, to form the SOI layer 171. To thin the SOI layer wafer 166, a chemical mechanical polishing (CMP) technique, or a chemical or physical etching technique may be employed.

A notch or an orientation flat on the SOI wafer 173 is used to identify the crystal face orientation of the SOI layer 171 when forming semiconductor integrated circuits thereon. Therefore, there will be no problem if the crystal orientation of the SOI layer wafer 166 is unaligned with the crystal orientation of the base wafer 160. If the crystal orientation of the SOI layer 171 is identifiable, the base wafer 160 may be a simple disk having no notch or orientation flat.

Modification 1 of Ninth Embodiment

According to the ninth embodiment, the ID mark 162 on the bevel contour of the base wafer 160 consists of the alphanumeric code 164 and the triangle 165 as shown in FIG. 63B. Modification 1 of the ninth embodiment employs a bar-code ID mark.

Figure 68A:
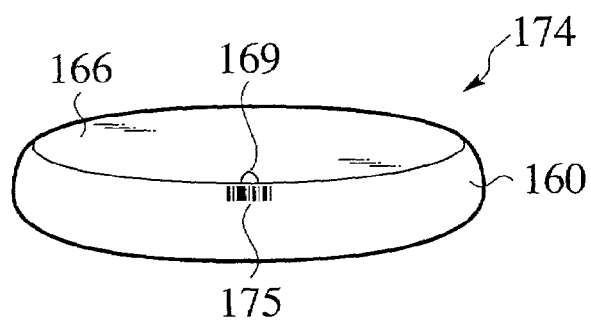
FIG. 68A is a perspective view showing an SOI wafer according to modification 1 of the ninth embodiment.
Figure 68B:
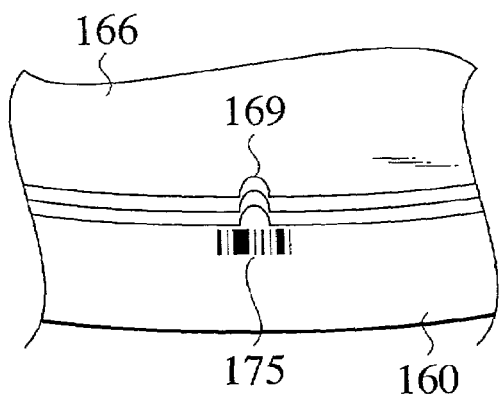
FIG. 68B is an enlarged view showing a notch and a linear bar code formed on the SOI wafer of FIG. 68A.

FIG. 68A shows an SOI layer wafer 166 bonded to a base wafer 160. The SOI layer wafer 166 has a notch 169. The bevel contour of the base wafer 160 has a bar code 175 aligned with the notch 169. In FIG. 68B, the bar code 175 is formed on the bevel contour so that it may come close to the notch 169 of the SOI layer wafer 166. The bar code 175 may be a linear bar code (FIG. 68B) or a two-dimensional bar code.

Modification 2 of Ninth Embodiment

Generally, a notch or an orientation flat formed on an SOI wafer serves to identify the crystal face orientation of an SOI layer when forming semiconductor integrated circuits thereon. Namely, the notch or orientation flat is irrelevant to the crystal orientation of a base wafer. For example, in FIG. 62B, the SOI layer wafer 166 has the notch 169 to indicate the crystal orientation of the SOI layer 171. If the notch 169 is useful in identifying the crystal orientation of the SOI layer 171, there is no need to prepare a reference ID mark such as a triangle 165 on the base wafer 160 to indicate the crystal orientation of the SOI layer 171.

Figure 69A:
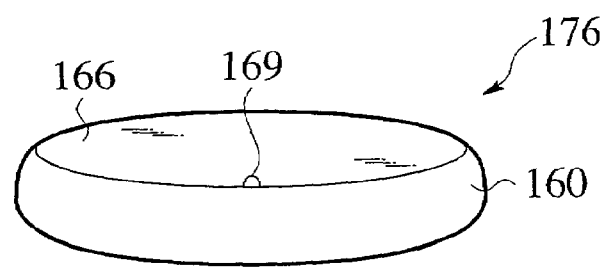
FIG. 69A is a perspective view showing an SOI wafer according to modification 2 of the ninth embodiment.
Figure 69B:
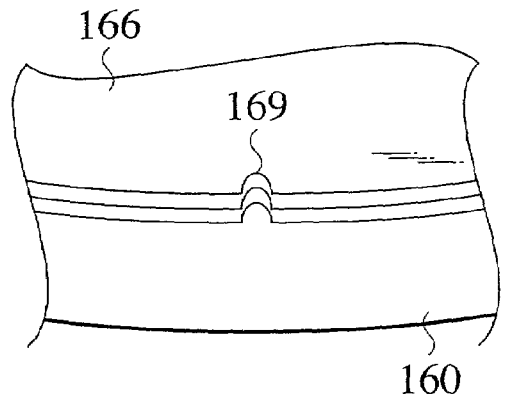
FIG. 69B is an enlarged view showing a notch and a bevel contour of a base wafer of the SOI wafer of FIG. 69A.

Accordingly, modification 2 of the ninth embodiment provides no reference ID mark on a base wafer indicating the crystal orientation of an SOI layer. In FIG. 69A, the SOI wafer 176 has an SOI layer wafer 166 having a notch 169 and a base wafer 160 having no reference ID mark. The wafers 166 and 160 are bonded together to form the SOI wafer 176. In FIG. 69B, the SOI layer wafer 166 has a buried oxide film and an SOI layer that have the notch 169. On the other hand, the bevel contour of the base wafer 160 has no reference ID mark indicating a crystal orientation nor an ID mark for quality management of the SOI wafer 176.

When carrying out a semiconductor integrated circuit forming process that needs to control wafer crystal orientation, an optical reader having a CCD camera is employed to detect notch 169 on the SOI layer, to control the crystal orientation.

In this way, the base wafer may be a disk having no notch or orientation flat on the bevel contour thereof. Even so, it is possible to detect the crystal face orientation of the SOI layer if the periphery of the SOI layer has a notch or an orientation flat. The bevel contour of the base wafer may have a reference ID mark to be aligned with the notch of the SOI layer wafer. In this case, the crystal orientation of the SOI layer can quickly be identified by reading the reference ID mark without directly detecting the notch of the SOI layer.

Forming no notch or orientation flat on base wafers realizes low-cost SOI wafers. The SOI wafers without notch or orientation flat are circular to provide uniform surfaces where semiconductor integrated circuits are formed. Without notches, no dust or film remnants are caught by wafers during manufacturing processes, avoiding the contamination of the wafers. This results in high-quality semiconductor wafers manufacture at low cost.

Comparison Example of Ninth Embodiment

A comparison example of the ninth embodiment manufactures an SOI wafer by bonding a base wafer having a notch to an SOI layer wafer having a notch. Namely, the base wafer has a notch instead of a reference ID mark.

Figure 70:
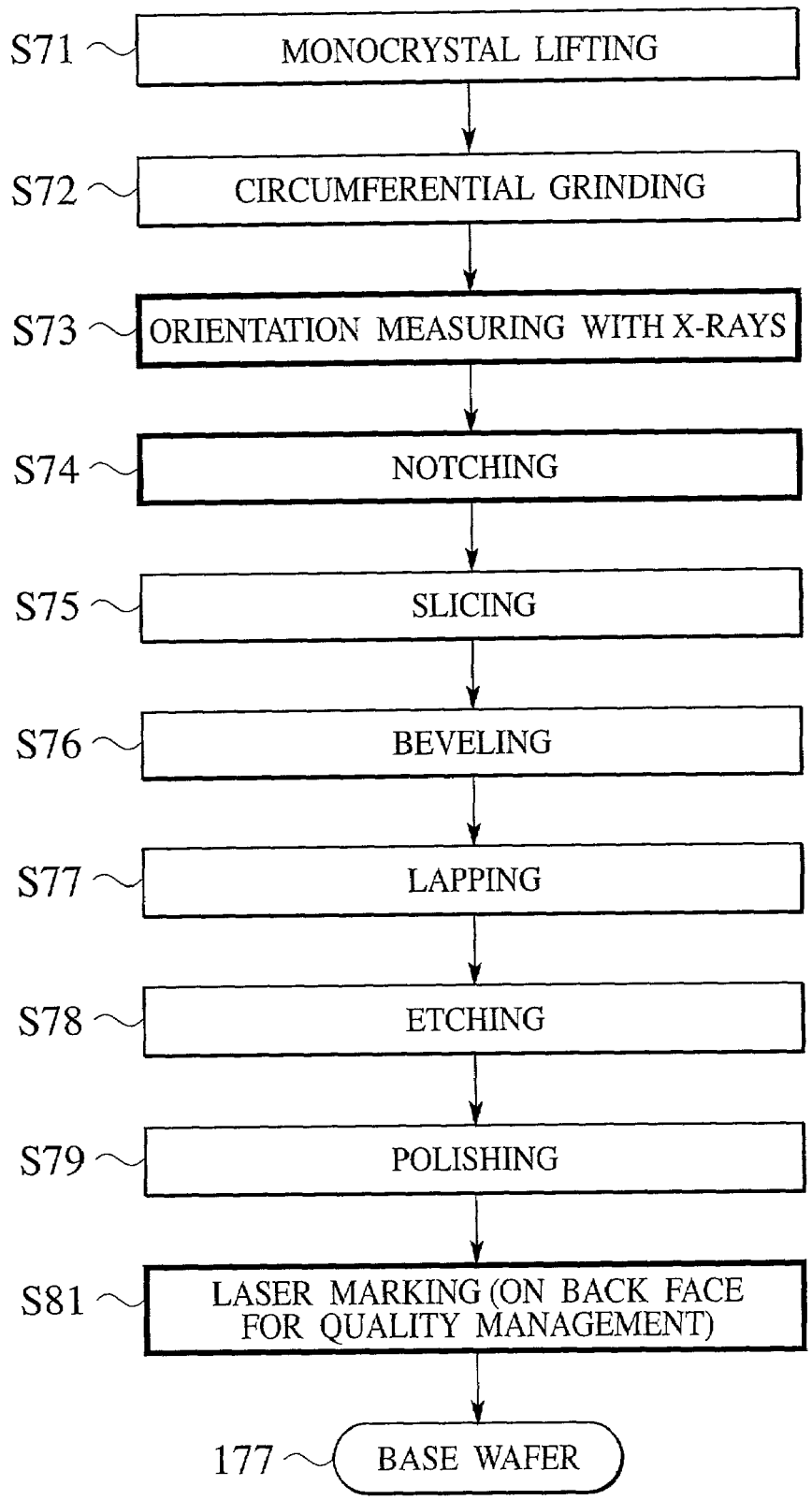
FIG. 70 is a flowchart showing a method of manufacturing a base wafer having a notch according to a comparison example of ninth embodiment.

As shown in FIG. 70, as in the method of FIG. 64, stage S71 lifts a monocrystalline ingot, and stage S72 grinds the periphery of the ingot. Stage S73 employs X-rays to measure the crystal orientation of the ingot. Stage S74 forms a notch or an orientation flat indicating the crystal face orientation (usually [110]) of the wafer. Stages S75 to S79 are carried out according to the method of FIG. 64. Stage S81 forms a mark for managing the quality of wafers on the back of each wafer, so that irregularities due to the mark do not interfere with the bonding of wafers.

Figure 71A:
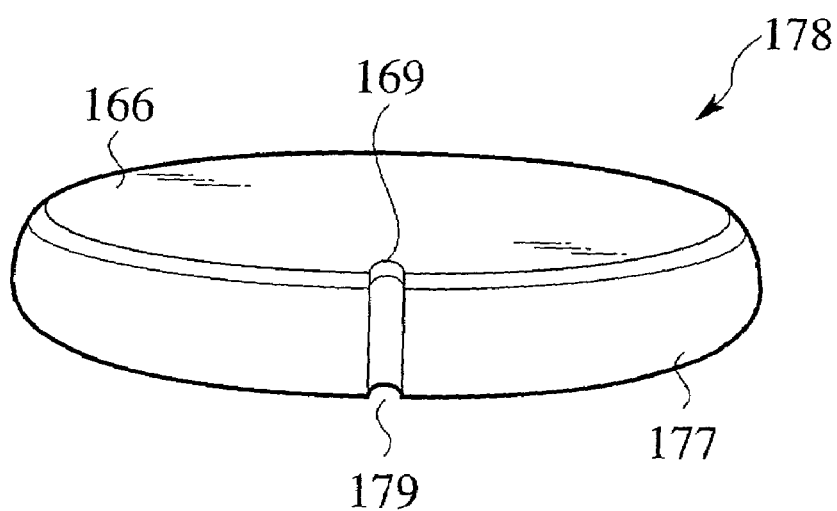
FIG. 71A is a perspective view showing an SOI wafer formed according to the method of FIG. 70.

In FIG. 71A, the SOI wafer 178 is composed of the base wafer 177 made by the flowchart of FIG. 70 and an SOI layer wafer 166 bonded to the base wafer 177. The SOI layer wafer 166 is made by the flowchart of FIG. 66 and has the structure of FIG. 65A. The bonding of the base wafer 177 and SOI layer wafer 166 is carried out according to the flowchart of FIG. 67. At this time, a notch 169 of the SOI layer wafer 166 is aligned with the notch 179 of the base wafer 177, and the wafers 166 and 177 are bonded together.

As shown in FIG. 71A, the notches 169 and 179 agree with each other. Compared with the SOI wafer 173 of FIG. 62A of the ninth embodiment, the SOI wafer 178 of the comparison example has the notch 179 on the base wafer 177, instead of the reference ID mark 165. Based on the notch 179, the bonding is carried out.

Figure 71B:
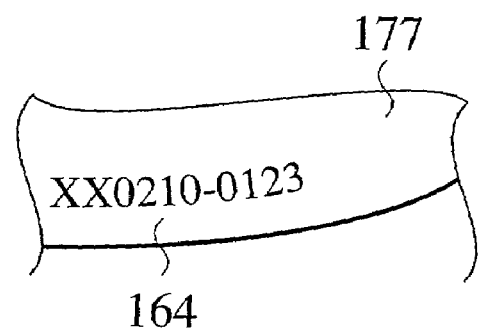
FIG. 71B is an enlarged view showing a mark formed on the periphery of the back of the SOI wafer of FIG. 71A.

In FIG. 71B, a mark 164 for managing the quality of the wafer is formed on the back of the wafer.

As mentioned above, the first to ninth embodiments of the present invention provide semiconductor wafers that involve minimum wafer-to-wafer variation and are manufacturable at high yield; methods of manufacturing such semiconductor wafers; methods of manufacturing semiconductor device on such wafers; and equipment for manufacturing semiconductor device on such wafers. Effects of the first to ninth embodiments are as follows:

(1) A wafer according to the first to ninth embodiments is provided with ID marks on the bevel contour thereof. The ID marks contain data related to products formed on the wafer. When new products are formed on the wafer in a manufacturing process, an ID mark related to the new products is formed on the wafer if necessary. Namely, an optional number of ID marks are formed on the wafer as and when needed. According to the ID marks, optimum processing conditions are speedily determined for individual manufacturing processes without accessing a host computer. This prevents wafer-to-wafer variation.

(2) A wafer according to the first to ninth embodiments is provided with an ID mark in a flattened part on the bevel contour of the wafer. Even if the wafer has no reference position, the ID mark can be read at high speed due to the flattened part.

(3) A wafer according to the first to ninth embodiments is provided with a plurality of ID marks on the bevel contour thereof. The ID marks contain the same data and are distanced from one another in horizontal and vertical directions. At least one of the ID marks can easily be read at high speed without precisely measuring the shape of the bevel contour.

(4) A wafer according to the first to ninth embodiments is provided with ID marks on each side of a reference position on the bevel contour of the wafer. The ID marks can speedily be read during semiconductor device manufacturing processes, thus improving productivity.

(5) An SOI wafer according to the fourth and ninth embodiments consists of a base wafer, an insulating film, and a monocrystalline silicon layer. The base wafer is provided with an ID mark. The SOI wafer avoids catching dust during semiconductor device manufacturing processes. The SOI wafer may have an ID mark functioning like a notch on a standard wafer. The SOI wafer is industrially manufacturable without additional processes and costs.

(6) The first to ninth embodiments emit a laser beam toward a part of the bevel contour of a wafer, to flatten the part and form a dot mark in the flattened part. The first to ninth embodiments irradiate the bevel contour of the wafer with light, monitor the intensity of reflected light from the bevel contour, detect a location on the bevel contour where the intensity of reflected light shows a maximal value, and determine the location as the dot mark formed part. In this way, the first to ninth embodiments of the present invention speedily detect a location on the bevel contour of a wafer where a small dot mark is formed. The first to ninth embodiments are capable of forming a dot mark that is easily recognizable even on the surface of a wafer that is roughened during semiconductor device manufacturing processes.

(7) Unlike the related art that employs a single ID mark to manage a large amount of data and takes a long time to read the necessary data from the ID mark during a manufacturing process, the first to ninth embodiments form ID marks on each wafer as mentioned above, so that necessary data for managing semiconductor device manufacturing processes is speedily read from the ID marks.

According to the first to ninth embodiments, each semiconductor device manufacturing equipment can speedily read the ID marks to grasp the processing conditions of the preceding process and flexibly determine the processing conditions of its own. This results in manufacturing semiconductor device of uniform characteristics. In particular, the ID marks of the first to ninth embodiments are useful in setting the proper conditions for experimental processes that are in a development stage, so that these processes may quickly be applied to an actual manufacturing line.

Additional advantages and modifications of the present invention will readily occur to those skilled in the art. Therefore, the present invention in its broader aspects is not limited to the specific details and representative first to ninth embodiments shown and described herein. Accordingly, various modifications may be made without departing from the spirit or scope of the general inventive concept as defined by the appended claims and their equivalents.

What is claimed is:

1. A semiconductor wafer comprising:
a bevel contour formed along the periphery of said wafer;
first and second products provided on said wafer; and
an ID mark formed on said bevel contour and containing data including properties, manufacturing conditions, and test results of said first products, wherein said second products are formed in accordance with the data in said ID mark.

2. The wafer of claim 1, wherein:
said bevel contour has a surface whose roughness is greater than that of a surface of said wafer where said products are formed.

3. The wafer of claim 1, wherein:
said ID mark is repeatedly formed on said bevel contour at different positions in a wafer thickness direction.

4. The wafer of claim 3, wherein:
said bevel contour has a first bevel contour on a first principal plane side of said wafer and a second bevel contour on a second principal plane side of said wafer; and
said ID mark is formed on each of said first and second bevel contours.

5. The wafer of claim 3, wherein:
said ID mark is formed on each side of a reference position defined on said bevel contour.

6. The wafer of claim 5, wherein:
said reference position is an object or a mark indicating a crystal orientation of said wafer.

7. The wafer of claim 6, wherein:
said object or mark is one of an orientation flat, a notch, and an inscription formed on said wafer.

8. The wafer of claim 5, wherein:
said ID mark includes a wafer ID mark formed on one side of said reference position, to indicate a manufacturing history of said wafer and a product ID mark formed on the other side of said reference position, to indicate the manufacturing history of said first and second products.

9. The wafer of claim 1, wherein:
said bevel contour has a first bevel contour on a first principal plane side of said wafer and a second bevel contour on a second principal plane side of said wafer opposite to said first principal plane; and
said first bevel contour receives an ID mark made by a device maker and said second bevel contour receives an ID mark containing a manufacture number made by a wafer maker.

10. The wafer of claim 9, wherein:
said first and second products are formed on the first principal plane of said wafer.

11. The wafer of claim 1, wherein said products are formed on the wafer through a series of semiconductor device manufacturing processes.

12. The wafer of claim 1, wherein the ID mark is formed along the periphery of the wafer except for an inside of a notch indicating crystal orientation of the wafer.

13. A semiconductor wafer comprising:
a base wafer;
an insulating layer arranged on said base wafer;
a monocrystalline silicon layer arranged on said insulating layer;
first and second products provided on said monocrystalline silicon layer; and
an ID mark formed on said base wafer and containing data including properties, manufacturing conditions, and test results of said first products, wherein said second products are formed in accordance with the data in said ID mark.

14. The wafer of claim 13, wherein:
said ID mark is made of dots formed with laser beams.

15. The wafer of claim 13, wherein:
said ID mark is formed on the periphery of said base wafer.

16. The wafer of claim 14, wherein:
said ID mark is formed on a bevel contour formed along the periphery of said base wafer.

17. The wafer of claim 13, wherein said products are formed on the wafer through a series of semiconductor device manufacturing processes.

18. The wafer of claim 13, wherein the ID mark is formed along the periphery of the base wafer except for an inside of a notch indicating crystal orientation of the monocrystalline silicon layer.

19. A semiconductor wafer comprising:
a circular first principal plane on which semiconductor device is formed;
a bevel contour formed along the periphery of said wafer;
first and second products provided on said wafer;
a reference ID mark formed on said bevel contour and indicating a crystal orientation of said wafer; and
an ID mark formed on said bevel contour and containing data including properties, manufacturing conditions, and test results of said first products formed on said circular first principal plane, wherein said second products are formed in accordance with the data in said ID mark.

20. The wafer of claim 19, wherein:
said reference ID mark is a two-dimensional matrix code including an L-shaped guide cell; and
a position of said L-shaped guide cell is used as a reference to identify a crystal orientation of said wafer.

21. The wafer of claim 20, wherein:
said L-shaped guide cell is arranged on a crystal orientation line on said first principal plane.

22. The wafer of claim 19, wherein:
the bevel contour includes a first bevel contour on a first principal plane side of said wafer and a second bevel contour on a second principal plane side of said wafer opposite to said first principal plane; and
said reference ID mark is formed on each of said first and second bevel contours.

23. The wafer of claim 19, wherein the products are formed on the wafer through a series of semiconductor device manufacturing processes.

24. The wafer of claim 19, wherein the ID mark is formed along the periphery of the wafer except for an inside of a notch indicating crystal orientation of the wafer.

25. A semiconductor wafer comprising:
a circular first principal plane on which semiconductor device is formed;
a reference ID mark formed on said wafer and indicating a crystal orientation of said wafer;
a recess formed on the periphery of said wafer and having a bottom inclined with respect to said first principal plane; and
an etch pit formed on said bottom and remaining after a polishing process carried out on said wafer, said etch pit being defined by second-orientation crystal faces that are different from first-orientation crystal faces exposed at said first principal plane.

26. A semiconductor wafer comprising:
a circular base wafer;
a bevel contour formed along the periphery of said base wafer;
an insulating layer arranged on said base wafer;
a monocrystalline silicon layer arranged on said insulating layer;
first and second products provided on said monocrystalline silicon layer;

a reference position defined on the periphery of said monocrystalline silicon layer, to indicate a crystal orientation of said monocrystalline silicon layer;

a reference ID mark formed on said bevel contour according to said reference position, to indicate the crystal orientation of said monocrystalline silicon layer; and an ID mark formed on said bevel contour and containing data including properties, manufacturing conditions, and test results of said first products formed on said monocrystalline silicon layer, wherein said second products are formed in accordance with the data in said ID mark.

27. The wafer of claim 26, wherein the products are formed on the wafer through a series of semiconductor device manufacturing processes.

28. The wafer of claim 26, wherein the ID mark is formed along the periphery of the circular base wafer except for an inside of a notch indicating crystal orientation of the monocrystalline silicon layer.

29. A method of manufacturing semiconductor device, comprising:

forming a bevel contour along the periphery of a semiconductor wafer;

forming products on said wafer;

forming a first ID mark on said bevel contour, said first ID mark containing data including properties, manufacturing conditions, and test results of said products;

reading said first ID mark; and forming other products on said wafer according to a data read from said first ID mark.

30. The method of claim 29, comprising:

forming a second ID mark on said bevel contour in the vicinity of said first ID mark, said second ID mark containing data including a properties, manufacturing conditions, and test results of products formed on said wafer after the formation of said first ID mark.

31. The method of claim 29, wherein forming a first ID mark on said bevel contour includes:

emitting a laser beam toward a part of said bevel contour to flatten said part, a roughness of said bevel contour being greater than a roughness of an area of said wafer where said products are formed; and forming dots that constitute said first ID mark in the flattened part of said bevel contour.

32. The method of claim 31, wherein reading said first ID mark includes:

emitting light onto said bevel contour and monitoring the intensity of reflected light from said bevel contour; and detecting a location where the intensity of reflected light shows a maximal value and determining said location as the part where said dots are formed.

33. The method of claim 29, wherein:

forming a bevel contour along the periphery of a semiconductor wafer includes forming a first bevel contour on a first principal plane side of said wafer on which said products are formed and a second bevel contour on a second principal plane side of said wafer opposite to said first principal plane;

forming a first ID mark on said bevel contour includes forming an ID mark on said first bevel contour by a device maker and an ID mark on said second bevel contour by a wafer maker; and said ID mark by the device maker is stored in a host computer of said device maker in advance.

34. A method of manufacturing semiconductor device, comprising:

forming a recess on the periphery of a semiconductor wafer with a bottom of said recess being inclined with respect to a first principal plane of said wafer on which the semiconductor device is formed;

forming an etch pit on said bottom by carrying out an etching process whose etching speed differs depending on crystal orientations of said wafer, said etch pit being defined with second-orientation crystal faces that are different from first-orientation crystal faces exposed at said first principal plane;

determining a crystal orientation of said recess according to a shape of said etch pit; and forming a reference ID mark on said wafer, to indicate a crystal orientation of said wafer.

35. The method of claim 34, wherein determining a crystal orientation of said recess includes:

emitting light onto said etch pit;

evaluating a rotation angle dependence of an intensity of reflected light from said second-orientation crystal faces; and determining a crystal orientation of said recess according to said rotation angle dependence.

36. The method of claim 35, wherein determining a crystal orientation of said recess according to said rotation angle dependence includes:

storing, in a database, a rotation angle dependence data for etch pits formed on an entire circumferential area of said wafer;

comparing the evaluated rotation angle dependence with the data stored in said database; and determining a crystal orientation of said recess according to results of the comparison.

37. A method of manufacturing a semiconductor wafer, comprising:

forming a bevel contour along the periphery of a circular base wafer;

forming a reference ID mark on said bevel contour, to indicate a crystal orientation of an SOI layer wafer;

forming the SOI layer wafer having a reference position indicating the crystal orientation of said SOI layer wafer;

forming an insulating layer on a first principal plane of said SOI layer wafer; and bonding said base wafer to a insulating layer side of said SOI layer wafer with said reference ID mark being aligned with said reference position.

38. The method of claim 37, comprising:

implanting hydrogen ions into the first principal plane before bonding said base wafer to said SOI layer wafer, to form a hydrogen-ion-implanted layer in said SOI layer wafer away from said insulating layer; and cleaving said SOI layer wafer along said hydrogen-ion-implanted layer after bonding said base wafer to said insulating layer side.

* * * * *

UNITED STATES PATENT AND TRADEMARK OFFICE
CERTIFICATE OF CORRECTION

PATENT NO. : 7,057,259 B2 Page 1 of 1
APPLICATION NO. : 10/101337
DATED : June 6, 2006
INVENTOR(S) : Arikado et al.

It is certified that error appears in the above-identified patent and that said Letters Patent is hereby corrected as shown below:

* Claim 16, column 40, line 1, change "claim 14," to --claim 15,--.

Claim 30, column 41, line 38, change "including a" to --including--

Claim 37, column 42, line 54, change "a insulating" to --an insulating--.

Signed and Sealed this

Twenty-first Day of November, 2006

JON W. DUDAS
*Director of the United States Patent and Trademark Office*